US012757752B2

(12) United States Patent
Niwa et al.

(10) Patent No.: US 12,757,752 B2
(45) Date of Patent: Oct. 6, 2026

(54) SEMICONDUCTOR DEVICE WITH REVERSE AND OBSERVE SURFACES

(71) Applicant: ROHM CO., LTD., Kyoto (JP)

(72) Inventors: Daichi Niwa, Kyoto (JP); Yuki Seta, Kyoto (JP); Koshun Saito, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 358 days.

(21) Appl. No.: 18/528,149

(22) Filed: Dec. 4, 2023

(65) Prior Publication Data

US 2024/0120261 A1 Apr. 11, 2024

Related U.S. Application Data

(63) Continuation of application No. PCT/JP2022/027186, filed on Jul. 11, 2022.

(30) Foreign Application Priority Data

Jul. 13, 2021 (JP) ................................ 2021-115672
Jul. 20, 2021 (JP) ................................ 2021-119864

(51) Int. Cl.
*H10W 70/40* (2026.01)
*H10W 74/10* (2026.01)

(52) U.S. Cl.
CPC ........ *H10W 70/421* (2026.01); *H10W 74/111* (2026.01)

(58) Field of Classification Search
CPC ............. H10W 70/481; H10W 90/736; H10W 90/756; H10W 70/465; H10W 72/884; H10W 74/111; H10W 72/352; H10W 74/114; H10W 72/50; H10W 72/0198; H10W 74/129; H10W 74/00; H10W 70/417; H10W 70/424; H10W 72/926;
(Continued)

(56) References Cited

U.S. PATENT DOCUMENTS

2013/0127034 A1* 5/2013 Hasegawa ........... H01L 23/3142
257/676

FOREIGN PATENT DOCUMENTS

JP 2004-247613 9/2004
JP 2008-034601 2/2008
(Continued)

OTHER PUBLICATIONS

English translation of JP2016201447A (Year: 2016).*
(Continued)

*Primary Examiner* — William B Partridge
*Assistant Examiner* — David Paul Sedorook
(74) *Attorney, Agent, or Firm* — HSML P.C.

(57) ABSTRACT

A semiconductor device capable of suppressing separation of a sealing resin at an internal reverse surface is provided. The semiconductor device includes a semiconductor element, a first lead on which the semiconductor element is mounted, and a sealing resin covering the semiconductor element and a part of the lead. The lead includes an obverse surface to which the semiconductor element is bonded, a reverse surface facing away from the obverse surface in a thickness direction of the first lead and exposed from the sealing resin, and an internal reverse surface facing the same side as a side that the reverse surface faces in the thickness direction and covered with the sealing resin. The internal reverse surface includes an irregular portion.

20 Claims, 56 Drawing Sheets

(58) Field of Classification Search

CPC ........... H10W 70/041; H10W 72/5363; H10W 72/5473; H10W 72/932; H10W 72/536; H10W 72/5524; H10W 70/411; H10W 70/457; H10W 70/461; H10W 72/886; H10W 74/016; H10W 90/811; H10W 42/121; H10W 72/59; H10W 20/055; H10W 72/07554; H10W 72/355; H10W 72/547; H10W 72/5475; H10W 70/048; H10W 72/07336; H10W 72/652; H10W 90/00; H10W 70/466; H10W 90/766; H10W 70/415; H10W 70/658; H10W 74/01; H10W 44/501; H10W 72/073; H10W 72/076; H10W 72/07636; H10W 72/5445; H10W 72/944; H10W 74/014; H10W 74/124; H10W 70/421; H10W 72/5449; H10W 90/734; H10W 70/429; H10W 70/464; H10W 70/479; H10W 70/681; H10W 70/682; H10W 72/01304; H10W 72/072; H10W 72/07331; H10W 72/07352; H10W 72/07355; H10W 72/07653; H10W 72/252; H10W 72/29; H10W 72/321; H10W 72/357; H10W 72/655; H10W 72/877; H10W 72/957; H10W 74/019; H10W 74/142; H10W 74/40; H10W 80/754; H10W 90/701; H10W 90/726; H10W 90/767; H10W 99/00; H10W 72/5522; H10W 72/871; H10W 72/646; H10W 72/936; H10W 72/952; H10W 70/442; H10W 70/456; H10W 70/65; H10W 72/01361; H10W 72/016; H10W 72/075; H10W 72/07552; H10W 72/07553; H10W 72/07652; H10W 72/527; H10W 72/534; H10W 72/537; H10W 72/627; H10W 72/643; H10W 72/868; H10W 74/10; H10W 74/121; H02M 3/155; H10D 62/8503; H10D 30/475; H10D 30/4755; H10D 62/343; H10D 64/111; H10D 64/254; H10D 64/257; H10D 62/8325; C23C 18/32; C23C 18/42; C23F 17/00; C25D 7/12; C25D 7/123; H10P 72/7402; H10P 72/7418; H10P 95/00; F16C 17/026; F16C 17/045; F16C 17/107; F16C 2370/12; F16C 33/08; F16C 33/74; F16C 43/02; H02K 5/16; H02K 7/08

See application file for complete search history.

(56) References Cited

FOREIGN PATENT DOCUMENTS

| | | | | | | |
|---|---|---|---|---|---|---|
| JP | 2012-028822 | | | 2/2012 | | |
| JP | 2012028822 | A | * | 2/2012 | | |
| JP | 2016-201447 | | | 12/2016 | | |
| JP | 2016201447 | A | * | 12/2016 | ............ | H01L 23/50 |
| JP | 2017-092153 | | | 5/2017 | | |
| JP | 2021-027116 | | | 2/2021 | | |
| WO | 2012/014382 | | | 2/2012 | | |

OTHER PUBLICATIONS

English translation of JP2012028822 (Year: 2012).*

International Search Report issued in International Application No. PCT/JP2022/027186, Sep. 27, 2022, 2 pages.

Written Opinion issued in International Application No. PCT/JP2022/027186, Sep. 27, 2022, 2 pages.

Office Action issued in corresponding Japanese Patent Application No. 2023-534783, Aug. 4, 2026, 8 pages w/translation.

* cited by examiner

SEMICONDUCTOR DEVICE WITH REVERSE AND OBSERVE SURFACES

TECHNICAL FIELD

The present disclosure relates to a semiconductor device.

BACKGROUND ART

Various configurations have been proposed for semiconductor devices with semiconductor elements. As an example of such a semiconductor device, there exists a semiconductor device in which a semiconductor element mounted on a die pad is connected to a lead with a wire and these are covered with a sealing resin. In such a semiconductor device, the reverse surface of the die pad may be exposed from the sealing resin to serve as a reverse surface terminal. In such a case, to prevent the die pad from falling off through the reverse surface of the sealing resin, the die pad is formed with an internal reverse surface facing the same side as the reverse surface and covered with the sealing resin. JP-A-2021-27116 discloses a semiconductor device in which a semiconductor element is mounted on the obverse surface of a mount portion of a first lead and the reverse surface of the mount portion is exposed from the sealing resin to serve as a reverse terminal. In the semiconductor device, the first lead includes a mount-portion reverse-side recess that is recessed from the reverse surface of the mount portion in the z direction.

In such a semiconductor device, the sealing resin may separate from the die pad due to the thermal stress caused by the difference in coefficient of linear expansion between the die pad and the sealing resin. When the separation progresses, stress may concentrate on an end of the die pad, causing a crack in the sealing resin. In particular, the internal reverse surface is connected to an end of the die pad and has a small area, and therefore, can easily crack when separation of the sealing resin occurs at the internal reverse surface.

DETAILED DESCRIPTION OF EMBODIMENTS

Figure 1:
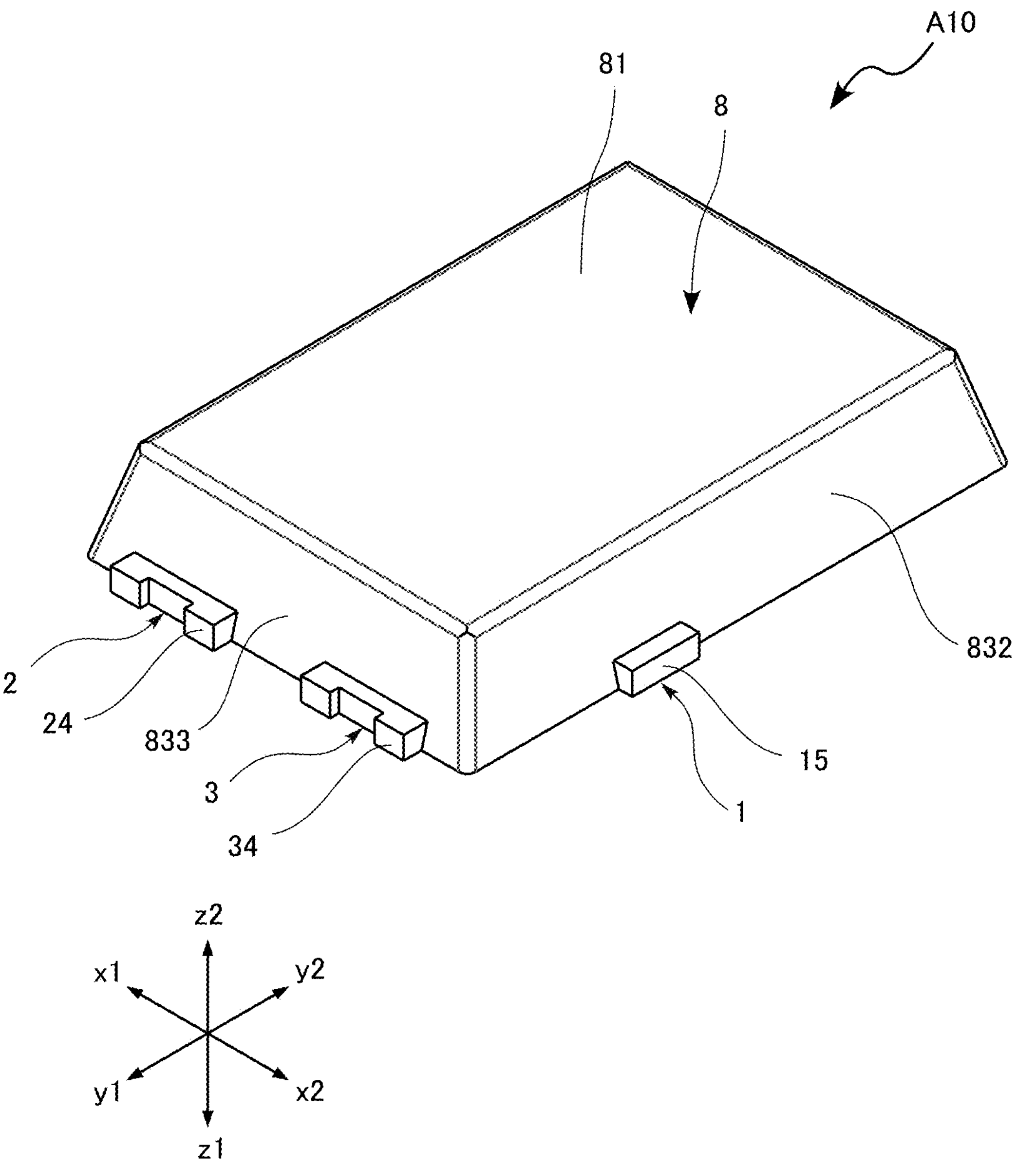
FIG. 1 is a perspective view of a semiconductor device according to a first embodiment of the present disclosure.

The following describes preferred embodiments of the present disclosure with reference to the drawings.

First Embodiment

A semiconductor device A10 according to a first embodiment of the present disclosure is described below based on FIGS. 1 to 9. The semiconductor device A10 includes a lead 1, a lead 2, a lead 3, a semiconductor element 6, a connection lead 7, and a sealing resin 8.

Figure 2:
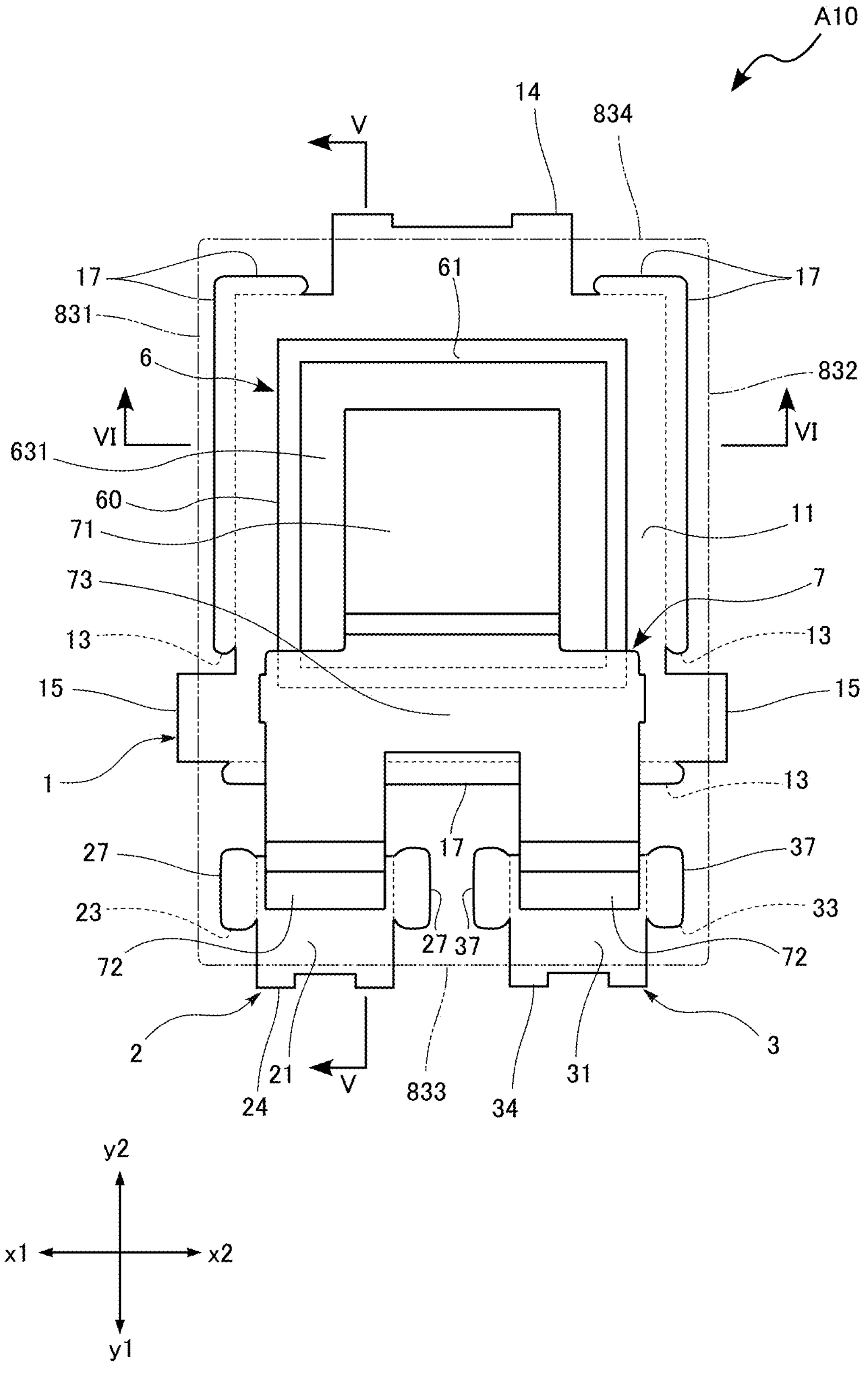
FIG. 2 is a plan view of the semiconductor device shown in FIG. 1, as seen through a sealing resin.
Figure 3:
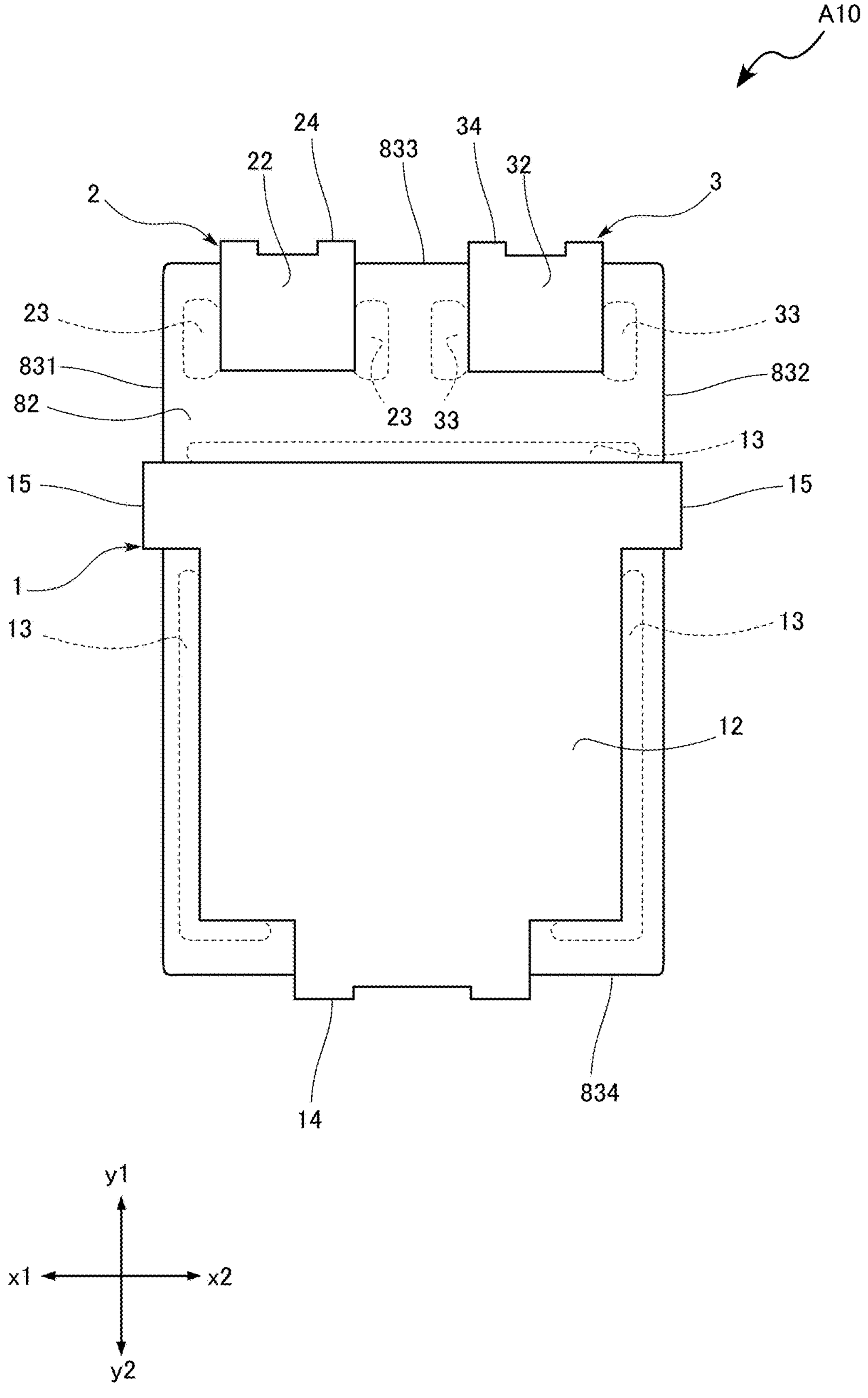
FIG. 3 is a bottom view of the semiconductor device shown in FIG. 1.
Figure 4:
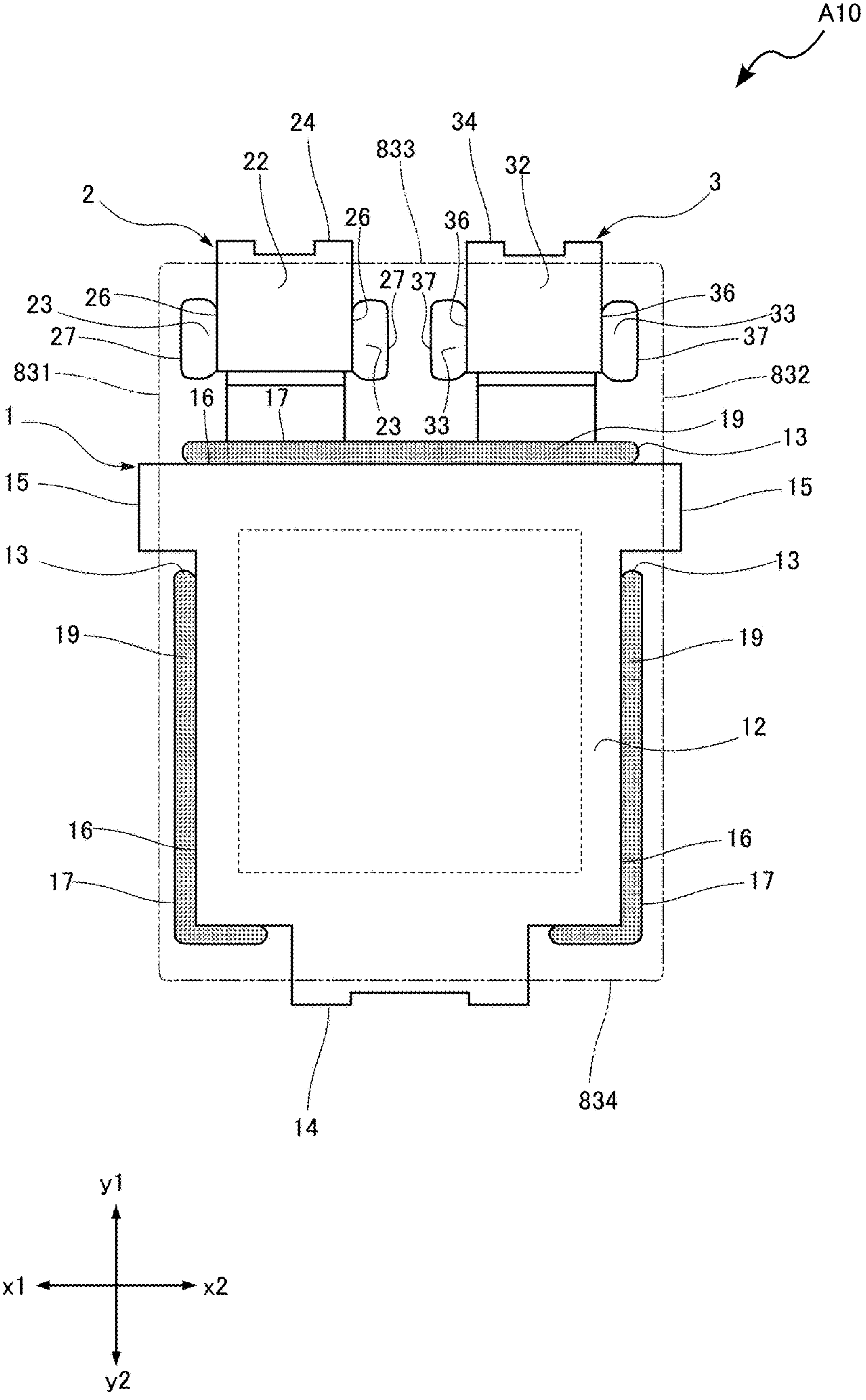
FIG. 4 is a bottom view of the semiconductor device shown in FIG. 1, as seen through the sealing resin.
Figure 5:
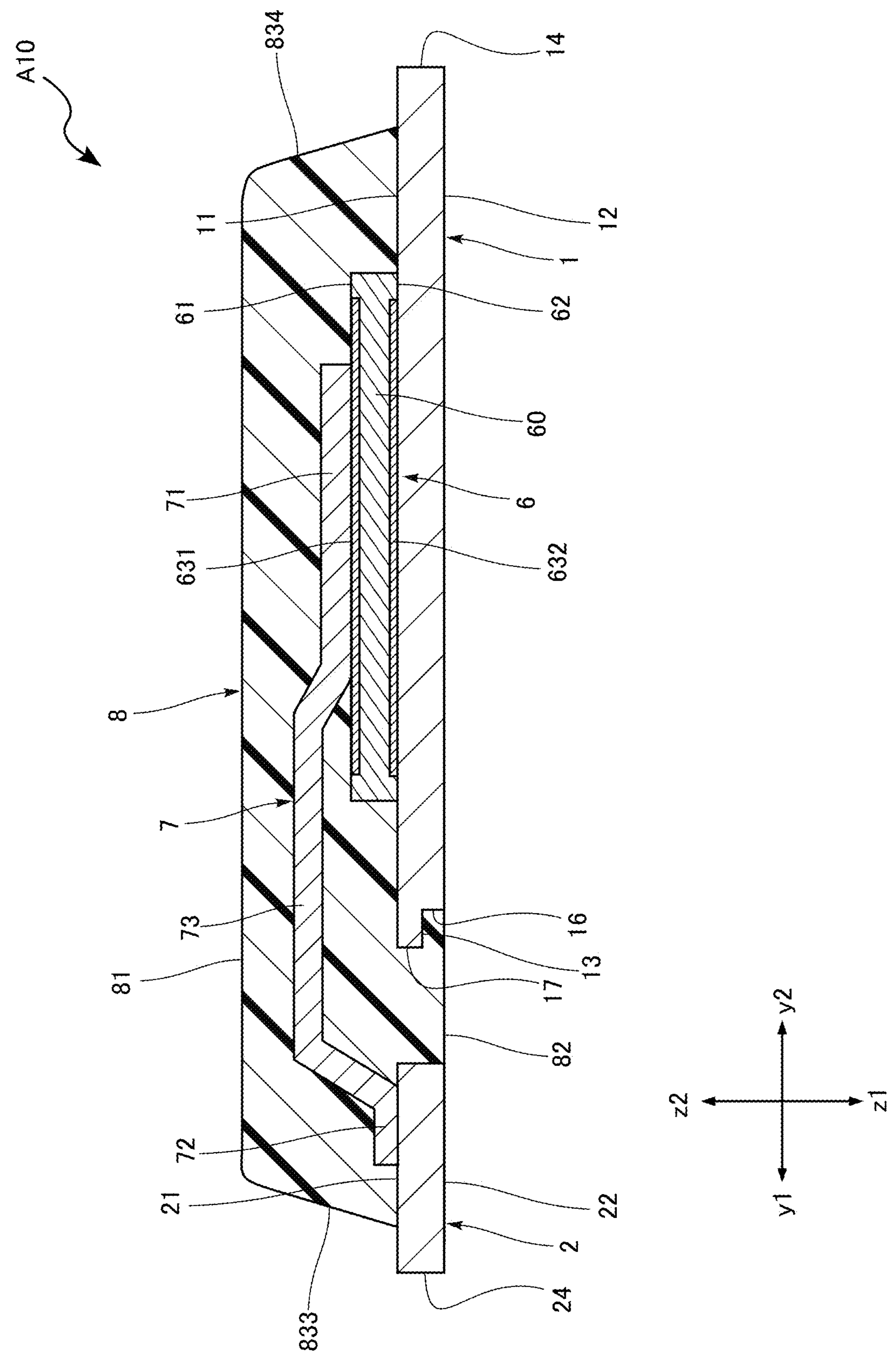
FIG. 5 is a sectional view taken along line V-V in FIG. 2.
Figure 6:
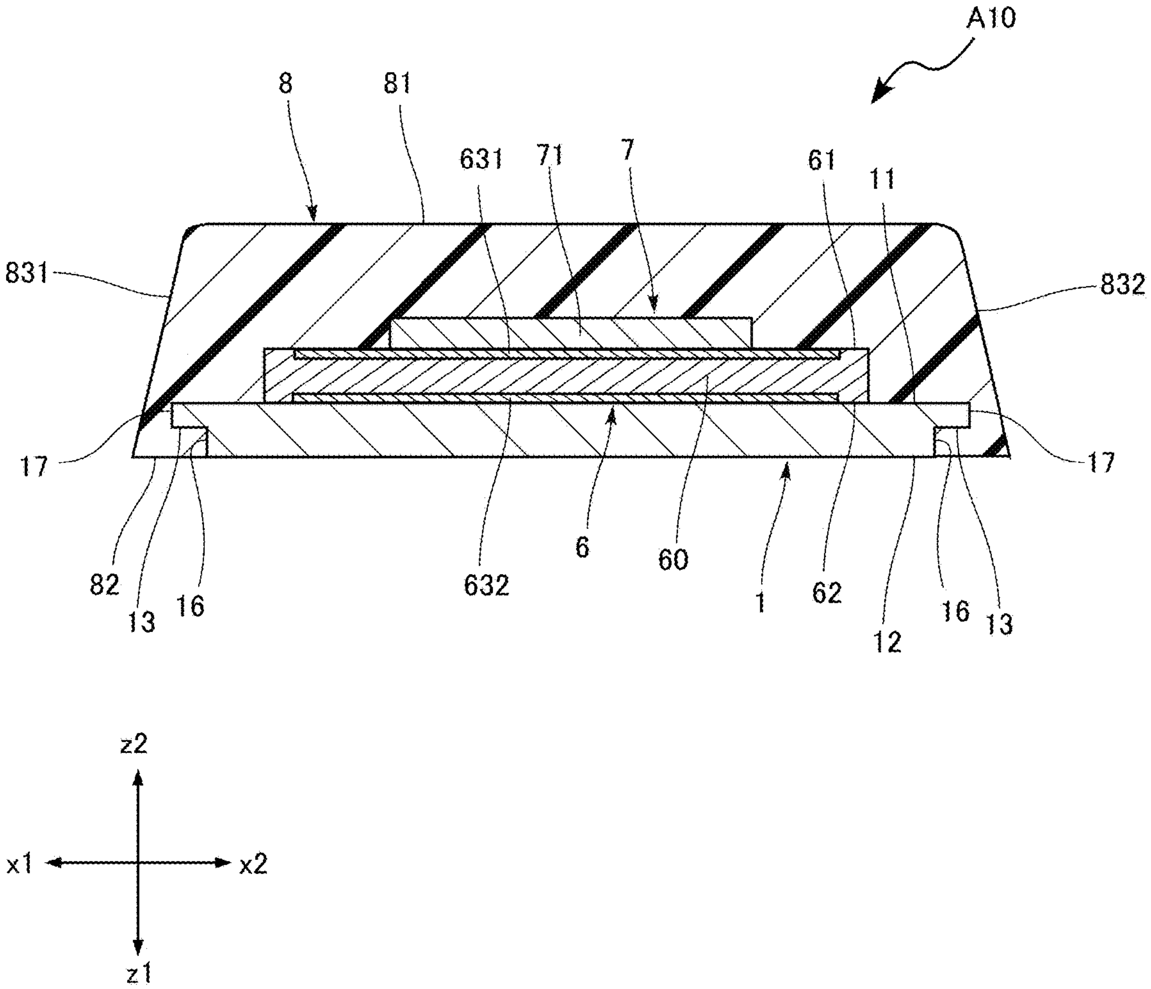
FIG. 6 is a sectional view taken along line VI-VI in FIG. 2.
Figure 7:
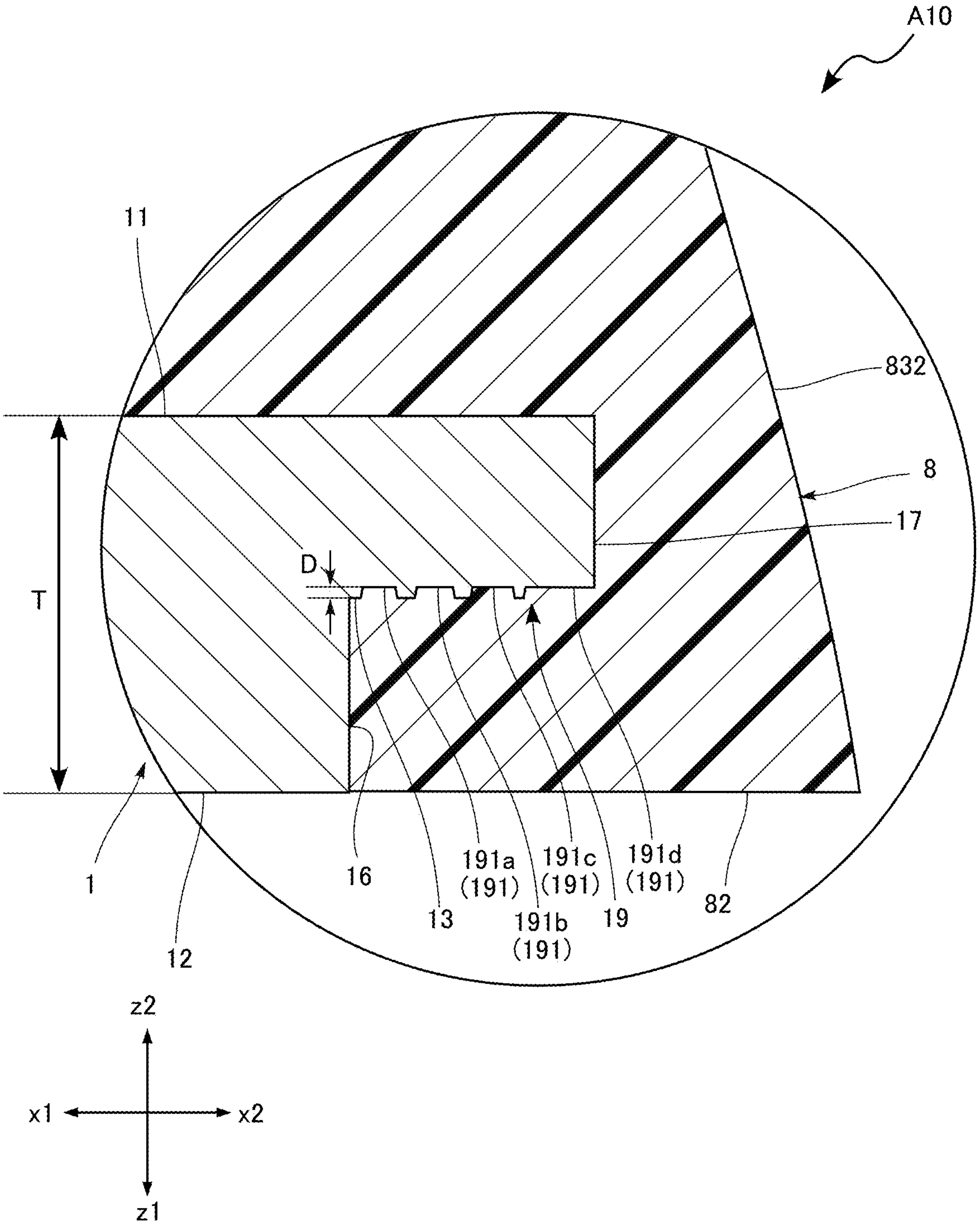
FIG. 7 is an enlarged view of a part of FIG. 6.
Figure 8:
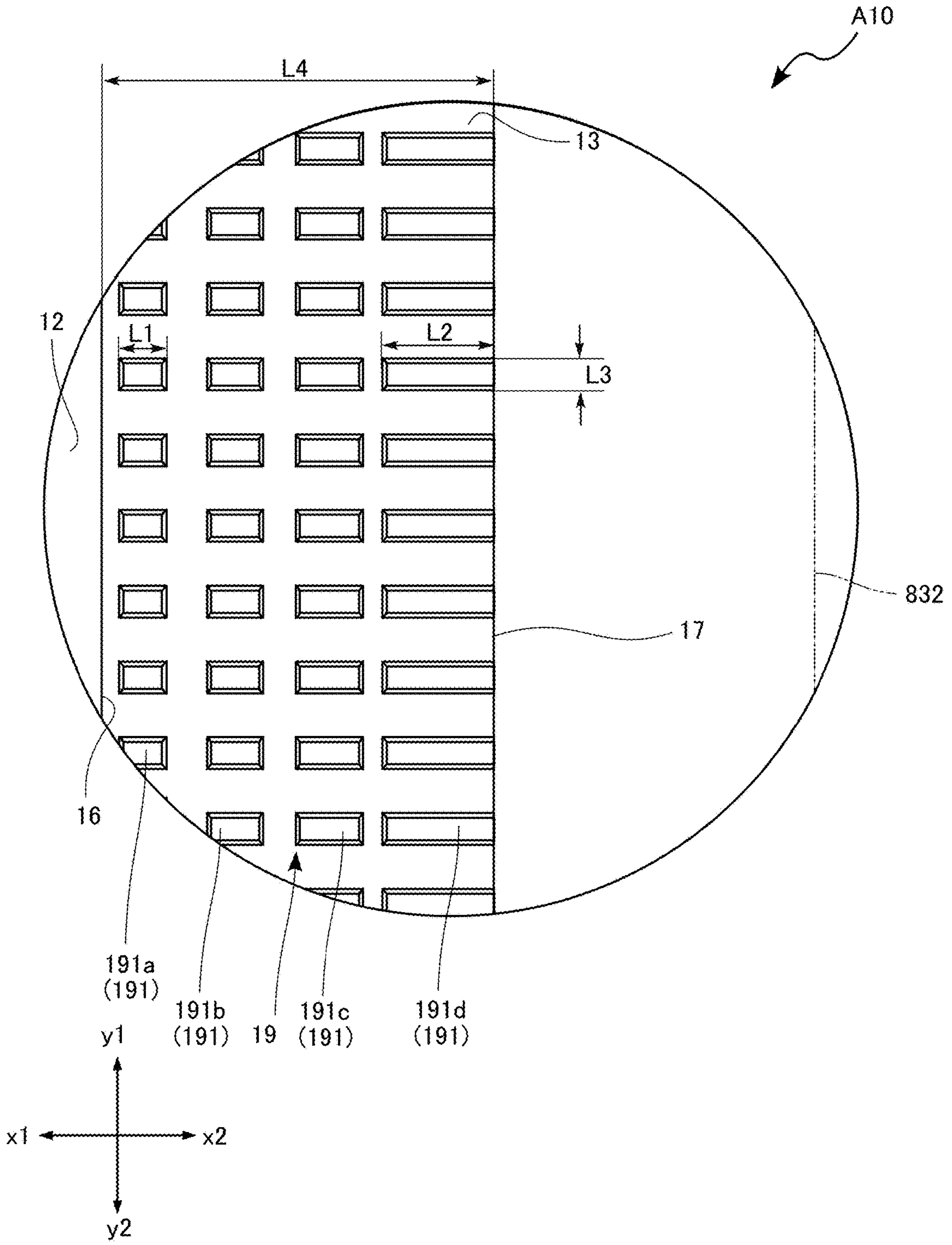
FIG. 8 is an enlarged view of a part of FIG. 4.
Figure 9:
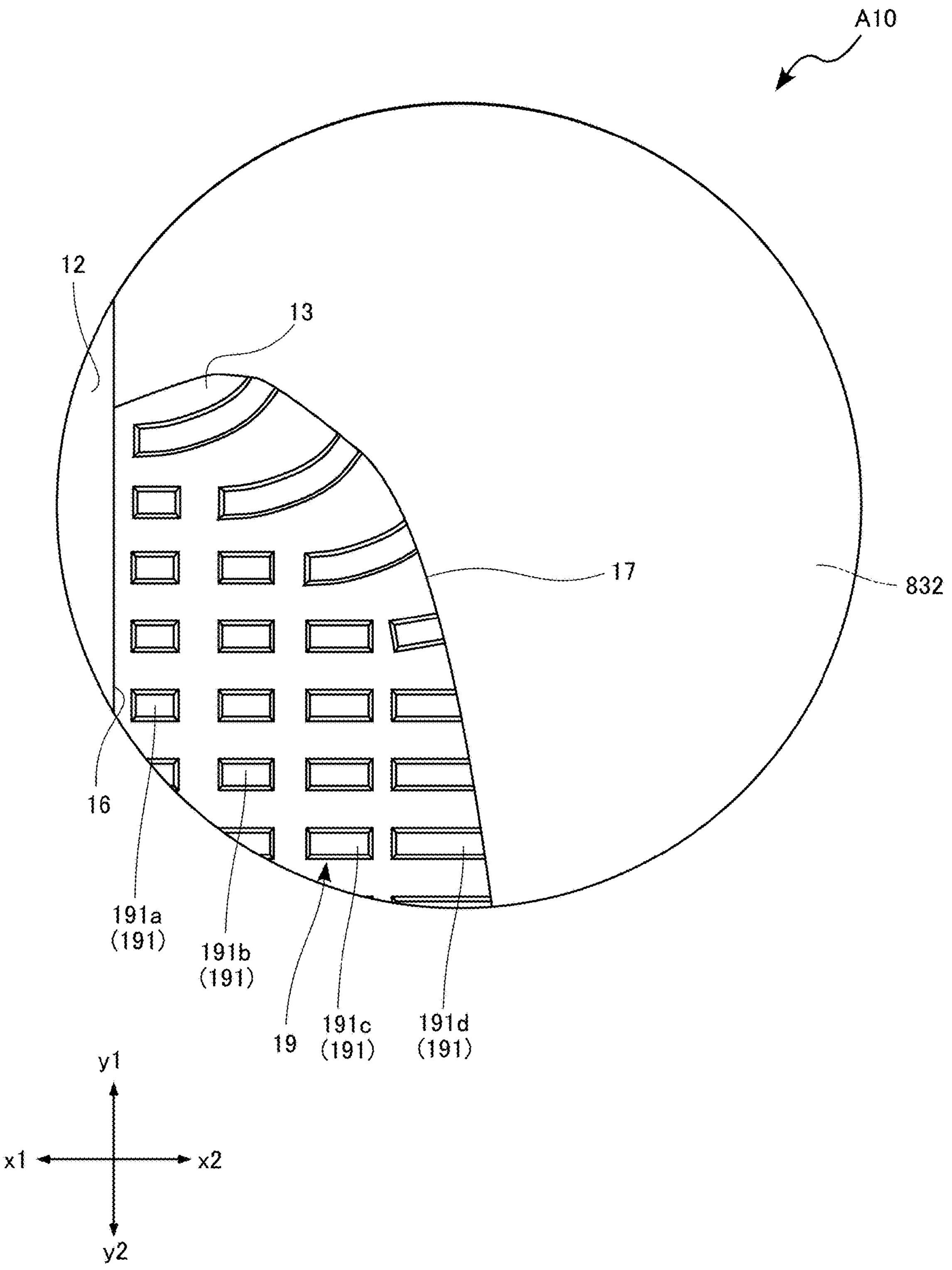
FIG. 9 is an enlarged view of a part of FIG. 4.

FIG. 1 is a perspective view of the semiconductor device A10. FIG. 2 is a plan view of the semiconductor device A10. For the convenience of understanding, FIG. 2 shows the sealing resin 8 as transparent and indicates the outlines of the sealing resin 8 by imaginary lines (double dashed lines). FIG. 3 is a bottom view of the semiconductor device A10. FIG. 4 is a bottom view of the semiconductor device A10. For the convenience of understanding, FIG. 4 shows the sealing resin 8 as transparent and indicates the outlines of the sealing resin 8 by imaginary lines (double dashed lines). FIG. 5 is a sectional view taken along line V-V in FIG. 2. FIG. 6 is a sectional view taken along line VI-VI in FIG. 2. FIG. 7 is an enlarged view of a part of FIG. 6. FIG. 8 is an enlarged view of a part of FIG. 4. FIG. 9 is an enlarged view of a part of FIG. 4.

The semiconductor device A10 shown in these figures is a device to be surface-mounted on a circuit board of various equipment. The use and function of the semiconductor device A10 are not limited. The package type of the semiconductor device A10 is DFN (Dual Flatpack No-leaded). Note that the package type of the semiconductor device A10 is not limited to DFN. The semiconductor device A10 is generally rectangular as viewed in the thickness direction. For the convenience of description, the thickness direction (plan-view direction) of the semiconductor device A10 is defined as a z direction, the direction (the horizontal direction in FIGS. 2 to 4) along one side of the semiconductor device A10 that is orthogonal to the z direction is defined as an x direction, and the direction (the vertical direction in FIGS. 2 to 4) orthogonal to the z direction and the x direction is defined as a y direction. One side in the z direction (the lower side in FIGS. 5 and 6) is defined as a z1 side, and the other side (the upper side in FIGS. 5 and 6) is defined as a z2 side. One side in the x direction (the left side in FIG. 2) is defined as an x1 side, and the other side (the right side in FIG. 2) is defined as an x2 side. One side in the y direction (the lower side in FIG. 2) is defined as a y1 side, and the other side (the upper side in FIG. 2) is defined as a y2 side. The z direction corresponds to the "thickness direction" in the present disclosure. The dimensions of the semiconductor device A10 are not particularly limited. In the present embodiment, the dimension in the x direction may be about 4 mm, the dimension in the y direction may be about 6 mm, and the dimension in the z direction may be about 1 mm.

The leads 1 to 3 are electrically connected to the semiconductor element 6. The leads 1 to 3 are made of a metal, and preferably made of Cu or Ni, an alloy of these, or a 42 alloy, for example. The material of the leads 1 to 3 is not limited. The leads 1 to 3 are made from a lead frame formed by subjecting a metal plate to a stamping process, for example. The thickness of the leads 1 to 3 is not particularly limited and may be about 0.05 to 0.3 mm, for example. In the present embodiment, the thickness is about 0.25 mm.

As shown in FIG. 2, the lead 1 is disposed at the end of the semiconductor device A10 on the y2 side in the y direction and extends over the entirety in the x direction. The lead 2 is disposed at the corner on the y1 side in the y direction and on the x1 side in the x direction of the semiconductor device A10. The lead 3 is disposed at the corner on the y1 side in the y direction and on the x2 side in the x direction of the semiconductor device A10. The lead 2 and the lead 3 are spaced apart from the lead 1 in the y direction and spaced apart from each other in the x direction.

The lead 1 supports the semiconductor element 6 and includes an obverse surface 11, a reverse surface 12, an internal reverse surface 13, an internal connection surface 16, an internal end surface 17, and connection end surfaces 14 and 15.

The obverse surface 11 and the reverse surface 12 face away from each other in the z direction. The obverse surface 11 faces the z2 side in the z direction. The obverse surface 11 is the surface on which the semiconductor element 6 is mounted. In the present embodiment, the obverse surface 11 is generally rectangular and includes a portion protruding toward the y2 side in the y direction and portions protruding toward opposite sides in the x direction. Each of these protruding portions partially protrudes from the sealing resin 8 to be exposed. The number of such protruding portions is not limited. The reverse surface 12 is exposed from the sealing resin 8 to serve as a reverse terminal. In the present embodiment, the reverse surface 12 is generally rectangular and includes a portion protruding toward the y2 side in the y direction and portions protruding toward opposite sides in the x direction. Each of these protruding portions partially protrudes from the sealing resin 8 to be exposed. The number of such protruding portions is not limited.

The internal reverse surface 13 faces the same side as the reverse surface 12 in the z direction (the z1 side in the z direction) and is covered with the sealing resin 8. The internal reverse surface 13 is connected to the internal connection surface 16 and the internal end surface 17. In the present embodiment, as shown in FIGS. 3 and 4, the internal reverse surface 13 is formed on each of the y1 side in the y direction, the y2 side in the y direction, the x1 side in the x direction and the x2 side in the x direction of the reverse surface 12. The shape and arrangement position of the internal reverse surface 13 are not limited. Of the lead 1, the portion at which the internal reverse surface 13 is located has a thickness (the dimension in the z direction) that is smaller than and may be about a half of the thickness of the portion at which the reverse surface 12 is located, as shown in FIGS. 5 to 7. As described later, the internal reverse surface 13 is formed by compressing a part of the lead frame so that its size is about halved in the z direction. The compressed portion of the lead frame spreads radially outward. Thus, the internal reverse surface 13 has a rounded outer corner. As shown in FIGS. 3, 5 and 6, the internal reverse surface 13 is not exposed from the sealing resin 8 and is covered with the sealing resin 8. This prevents the lead 1 from falling off from the sealing resin 8 toward the z1 side in the z direction.

As shown in FIG. 4, the internal reverse surface 13 is formed with an irregular portion 19. In the present embodiment, the irregular portion 19 is disposed over almost the entire area of the internal reverse surface 13. The area in which the irregular portion 19 is disposed is not limited. It is preferable that the irregular portion 19 is disposed in a wide area and at least on the outer edge of the internal reverse surface 13.

The irregular portion 19 includes a plurality of recesses 191. As shown in FIG. 7, each of the recesses 191 is recessed from the internal reverse surface 13 toward the side that the obverse surface 11 faces (the z2 side in the z direction). Each recess 191 is tapered such that its sectional area in x-y plane becomes smaller toward the obverse surface 11 (toward the z2 side in the z direction). As viewed in the z direction, each recess 191 has a rectangular shape elongated in an extension direction (the x direction in FIGS. 7 to 9) orthogonal to the z direction and going from the reverse surface 12 toward the outer edge of the internal reverse surface 13. As shown in FIGS. 8 and 9, the recesses 191 are arranged in a matrix. In the present embodiment, four rows of recesses 191 are arranged side to side in the extension direction, with each row including a plurality of recesses 191 arranged at equal intervals along an orthogonal direction (the y direction in FIGS. 7 to 9) that is orthogonal to the z direction and the extension direction. The number of such rows is not limited.

The plurality of recesses 191 include recesses 191*a*, recesses 191*b*, recesses 191*c*, and recesses 191*d*. The recesses 191*a* are arranged at equal intervals along the y direction at a location closest to the reverse surface 12 (the x1 side in the x direction in FIGS. 7 to 9). The recesses 191*b* are arranged at equal intervals along the y direction on the side of the recesses 191*a* closer to the outer edge (the x2 side in the x direction in FIGS. 7 to 9). The recesses 191*c* are arranged at equal intervals along the y direction on the side of the recesses 191*b* closer to the outer edge. The recesses 191*d* are arranged at equal intervals along the y direction on the side of the recesses 191*c* closer to the outer edge. In the present embodiment, the recesses 191*d* extend to the outer edge of the internal reverse surface 13. The dimensions in the extension direction of the recesses 191 are larger at a location closer to the outer edge. The dimension L2 (See FIG. 8) of the recesses 191*d* in the extension direction is larger than the dimension L1 (See FIG. 8) of the recesses 191*a* in the extension direction. As described later, the recesses 191 are formed when the internal reverse surface 13 is formed by compression. The internal reverse surface 13 is formed when the compressed portion of the lead frame extends in the extension direction. The recesses 191 located closer to the outer edge of the internal reverse surface 13 are extended more in the extension direction and hence have a larger dimension in the extension direction. The end of the internal reverse surface 13 is formed as a result of the compressed portion of the lead frame spreading radially outward, so that the recesses 191 are curved as shown in FIG. 9.

The recesses 191 are approximately the same in dimension L3 (see FIG. 8) in the orthogonal direction. The dimension L3 is not limited but is approximately equal to or greater than 10% and equal to or less than 30% of the dimension L4 (see FIG. 8) in the extension direction of the internal reverse surface 13. Also, the recesses 191 are approximately the same in depth D (the dimension in the z direction) (see FIG. 7). The dimension D is not limited but is approximately equal to or greater than 1% and equal to or less than 5% of the thickness T (the dimension from the obverse surface 11 to the reverse surface 12 in the z direction) (see FIG. 7) of the lead 1. In the present embodiment, the dimension D is about to 10 μm. The recesses 191 have an arrangement, shapes, and dimensions corresponding to the configuration of an irregularity-forming part (described later) provided in a die. By using a die, it is possible to form the recesses 191 in a more precise arrangement, shapes, and dimensions than when forming the recesses 191 by a laser or half etching, for example. Note that the arrangement position, shape, and dimensions of each recess 191 are not limited.

The internal connection surface 16 is generally perpendicular to the reverse surface 12 and the internal reverse surface 13 and connected to the reverse surface 12 and the internal reverse surface 13. The internal connection surface 16 is flat and covered with the sealing resin 8. The internal end surface 17 is generally perpendicular to the obverse surface 11 and the internal reverse surface 13 and connected to the obverse surface 11 and the internal reverse surface 13. The internal end surface 17 is covered with the sealing resin 8.

The connection end surfaces 14 and 15 are perpendicular to the obverse surface 11 and the reverse surface 12 and connected to the obverse surface 11 and the reverse surface 12. The connection end surfaces 14 and 15 are exposed from the sealing resin 8. There exists one connection end surface 14, and it faces the y2 side in the y direction. The connection end surface 14 is connected to the portion of the obverse surface 11 that protrudes toward the y2 side in the y direction and the portion of the reverse surface 12 that protrudes toward the y2 side in the y direction. In the present embodiment, the connection end surface 14 is formed with a recess recessed toward the y1 side in the y direction and extending in the z direction. There exist two connection end surfaces 15, with one of the connection end surfaces 15 facing the x1 side in the x direction while the other facing the x2 side in the x direction. The connection end surface facing the x1 side in the x direction is connected to the portion of the obverse surface 11 that protrudes toward the x1 side in the x direction and the portion of the reverse surface 12 that protrudes toward the x1 side in the x direction. The connection end surface 15 facing the x2 side in the x direction is connected to the portion of the obverse surface 11 that protrudes toward the x2 side in the x direction and the portion of the reverse surface 12 that protrudes toward the x2 side in the x direction. Each of the connection end surfaces 14 and 15 is a cut surface formed by cutting a tie bar connected to a frame part of a lead frame during the cutting step of the manufacturing process.

The configuration of the lead 1 is not limited to that described above. For example, the obverse surface 11 may be formed with a groove surrounding the semiconductor element 6 for preventing the outflow of a bonding material. The connection end surface 14 may not include the recess. The connection end surfaces 14 and 15 may not protrude from the sealing resin 8 and may be flush with the relevant surfaces of the sealing resin 8. The configuration of the lead 1 is designed as appropriate depending on the use and specifications.

The lead 2 is electrically connected to the semiconductor element 6 and includes an obverse surface 21, a reverse surface 22, an internal reverse surface 23, an internal connection surface 26, an internal end surface 27, and a connection end surfaces 24.

The obverse surface 21 and the reverse surface 22 face away from each other in the z direction. The obverse surface 21 faces the same side as the obverse surface 11 of the lead 1 (the z2 side in the z direction). The obverse surface 21 is the surface to which the connection lead 7 is bonded. The obverse surface 21 is generally rectangular in the present embodiment. A portion of the obverse surface 21 on the y1 side in the y direction protrudes from the sealing resin 8 to be exposed. The reverse surface 22 faces the same side as the reverse surface 12 of the lead 1 (the z1 side in the z direction). The reverse surface 22 is exposed from the sealing resin 8 to serve as a reverse terminal. The reverse surface 22 is generally rectangular in the present embodiment.

The internal reverse surface 23 faces the same side as the reverse surface 22 in the z direction (the z1 side in the z direction) and is covered with the sealing resin 8. The internal reverse surface 23 is connected to the internal connection surface 26 and the internal end surface 27. In the present embodiment, as shown in FIGS. 3 and 4, the internal reverse surface 23 is formed on each of the x1 side in the x direction and the x2 side in the x direction of the reverse surface 22. The shape and arrangement position of the internal reverse surface 23 are not limited. Of the lead 2, the portion at which the internal reverse surface 23 is located has a thickness (the dimension in the z direction) that is smaller than and may be about a half of the thickness of the portion at which the reverse surface 22 is located. The internal reverse surface 23 is formed in the same manner as the internal reverse surface 13 and hence has a rounded outer corner. As shown in FIG. 3, the internal reverse surface 23 is not exposed from the sealing resin 8 and is covered with the sealing resin 8. This prevents the lead 2 from falling off from the sealing resin 8 toward the z1 side in the z direction.

The internal connection surface 26 is generally perpendicular to the reverse surface 22 and the internal reverse surface 23 and connected to the reverse surface 22 and the internal reverse surface 23. The internal connection surface 26 is flat and covered with the sealing resin 8. The internal end surface 27 is generally perpendicular to the obverse surface 21 and the internal reverse surface 23 and connected to the obverse surface 21 and the internal reverse surface 23. The internal end surface 27 is covered with the sealing resin 8.

The connection end surface 24 is perpendicular to the obverse surface 21 and the reverse surface 22 and connected to the obverse surface 21 and the reverse surface 22. The connection end surface 24 is exposed from the sealing resin 8. There exits one connection end surface 24, and it faces the y1 side in the y direction. In the present embodiment, the connection end surface 24 is formed with a recess recessed toward the y2 side in the y direction and extending in the z direction. The connection end surface 24 is a cut surface formed by cutting a tie bar connected to a frame part of a lead frame during the cutting step of the manufacturing process.

The configuration of the lead 2 is not limited to that described above. For example, the connection end surface 24 may not include the recess. The connection end surface 24 may not protrude from the sealing resin 8 and may be flush with a resin side surface 833, described later, of the sealing resin 8. The configuration of the lead 2 is designed as appropriate depending on the use and specifications.

The lead 3 is electrically connected to the semiconductor element 6 and includes an obverse surface 31, a reverse surface 32, an internal reverse surface 33, an internal connection surface 36, an internal end surface 37, and a connection end surfaces 34.

The obverse surface 31 and the reverse surface 32 face away from each other in the z direction. The obverse surface 31 faces the same side as the obverse surface 11 of the lead 1 (the z2 side in the z direction). The obverse surface 31 is the surface to which the connection lead 7 is bonded. The obverse surface 31 is generally rectangular in the present embodiment. A portion of the obverse surface 31 on the y1 side in the y direction protrudes from the sealing resin 8 to be exposed. The reverse surface 32 faces the same side as the reverse surface 12 of the lead 1 (the z1 side in the z direction). The reverse surface 32 is exposed from the sealing resin 8 to serve as a reverse terminal. The reverse surface 32 is generally rectangular in the present embodiment.

The internal reverse surface 33 faces the same side as the reverse surface 32 in the z direction (the z1 side in the z direction) and is covered with the sealing resin 8. The internal reverse surface 33 is connected to the internal connection surface 36 and the internal end surface 37. In the present embodiment, as shown in FIGS. 3 and 4, the internal reverse surface 33 is formed on each of the x1 side in the x direction and the x2 side in the x direction of the reverse surface 32. The shape and arrangement position of the internal reverse surface 33 are not limited. Of the lead 3, the portion at which the internal reverse surface 33 is located has a thickness (the dimension in the z direction) that is smaller than and may be about a half of the thickness of the portion at which the reverse surface 32 is located. The internal reverse surface 33 is formed in the same manner as the internal reverse surface 13 and hence has a rounded outer corner. As shown in FIG. 3, the internal reverse surface 33 is not exposed from the sealing resin 8 and is covered with the sealing resin 8. This prevents the lead 3 from falling off from the sealing resin 8 toward the z1 side in the z direction.

The internal connection surface 36 is generally perpendicular to the reverse surface 32 and the internal reverse surface 33 and connected to the reverse surface 32 and the internal reverse surface 33. The internal connection surface 36 is flat and covered with the sealing resin 8. The internal end surface 37 is generally perpendicular to the obverse surface 31 and the internal reverse surface 33 and connected to the obverse surface 31 and the internal reverse surface 33. The internal end surface 37 is covered with the sealing resin 8.

The connection end surface 34 is perpendicular to the obverse surface 31 and the reverse surface 32 and connected to the obverse surface 31 and the reverse surface 32. The connection end surface 34 is exposed from the sealing resin 8. There exits one connection end surface 34, and it faces the y1 side in the y direction. In the present embodiment, the connection end surface 34 is formed with a recess recessed toward the y2 side in the y direction and extending in the z direction. The connection end surface 34 is a cut surface formed by cutting a tie bar connected to a frame part of a lead frame during the cutting step of the manufacturing process.

The configuration of the lead 3 is not limited to that described above. For example, the connection end surface 34 may not include the recess. The connection end surface 34 may not protrude from the sealing resin 8 and may be flush with a resin side surface 833, described later, of the sealing resin 8. The configuration of the lead 3 is designed as appropriate depending on the use and specifications.

The semiconductor element 6 is an element that performs the electrical function of the semiconductor device A10. The type of the semiconductor element 6 is not particularly limited. In the present embodiment, the semiconductor element 6 is a diode. The semiconductor element 6 includes an element body 60, a first electrode 631, and a second electrode 632.

The element body 60 has the shape of a rectangular plate as viewed in the z direction. The element body 60 is made of a semiconductor material and is made of Si (silicon) in the present embodiment. The material of the element body 60 is not limited and may be other materials such as SiC (silicon carbide) or GaN (gallium nitride). The element body 60 has an element obverse surface 61 and an element reverse surface 62. The element obverse surface 61 and the element reverse surface 62 face away from each other in the z direction. The element obverse surface 61 faces the z2 side in the z direction. The element reverse surface 62 faces the z1 side in the z direction. The first electrode 631 is disposed on the element obverse surface 61. The second electrode 632 is disposed on the element reverse surface 62. In the present embodiment, the first electrode 631 is an anode electrode, and the second electrode 632 is a cathode electrode.

As shown in FIGS. 2, 5 and 6, the semiconductor element 6 is bonded substantially at the center of the obverse surface 11 of the lead 1 via a bonding material, not shown. In the present embodiment, the bonding material is a conductive bonding material and is solder, for example. The bonding material may be other conductive bonding materials such as silver paste or sintered silver. In the semiconductor element 6, the element reverse surface 62 is bonded to the obverse surface 11 of the lead 1 with a bonding material. The second electrode 632 of the semiconductor element 6 is electrically connected to the lead 1 via the bonding material. Thus, the lead 1 is electrically connected to the second electrode 632 (the anode electrode) of the semiconductor element 6 to function as an anode terminal. As shown in FIGS. 2 and 5, the first electrode 631 of the semiconductor element 6 is electrically connected to the lead 2 and the lead 3 via the connection lead 7. Thus, the lead 2 and the lead 3 are electrically connected to the first electrode 631 (the cathode electrode) of the semiconductor element 6 to function as a cathode terminal.

In the present embodiment, the dimensions in the x direction and the y direction of the semiconductor element 6 are about 3 mm and relatively large for the lead 1. The area Si of the semiconductor element 6 as viewed in the z direction is about 60% of the area S2 of the lead 1 (the area of the obverse surface 11 of the lead 1) as viewed in the z direction. When the area Si is equal to or greater than 50% of the area S2, the area of the lead 1 that is in contact with the sealing resin 8 is small. In such a case, the separation of the sealing resin 8 progresses to the end of the lead 1 in a relatively short period of time, and a crack can easily occur in the sealing resin 8. Moreover, the temperature of the lead 1 tends to rise due to the heat generated by the semiconductor element 6, so that separation due to thermal stress can easily occur. In the present embodiment, however, the internal reverse surface 13 includes the irregular portion 19, so that the semiconductor device A10 suppresses the separation of the sealing resin 8 at the internal reverse surface 13.

The connection lead 7 is a plate-like conductor that connects the semiconductor element 6 and the leads 2 and 3 to each other for electrical conduction. The connection lead 7 is formed by subjecting a metal plate to a stamping process or an etching process, for example. The connection lead 7 is made of a metal, and preferably made of Cu or Al, or an alloy of these, for example. The material of the connection lead 7 is not limited. The thickness of the connection lead 7 is not particularly limited and may be about 0.08 to 0.3 mm, for example. In the present embodiment, the thickness is about 0.15 mm. The connection lead 7 is formed by bending a metal plate and includes an element connection portion 71, two lead connection portions 72, and a connecting portion 73.

The element connection portion 71, which is a portion connected to the semiconductor element 6, is generally parallel to the x-y plane and generally rectangular as viewed in the z direction. The element connection portion 71 is bonded, via a bonding material not shown, to the first electrode 631 disposed on the element obverse surface 61 of the semiconductor element 6. In the present embodiment, the bonding material is a conductive bonding material and is solder, for example. The bonding material is not limited.

The two lead connection portions 72, which are the portions connected to the lead 2 and the lead 3, are generally parallel to the x-y plane and have a rectangular shape elongated in the x direction as viewed in the z direction. Each of the lead connection portion 72 is bonded to the obverse surface 21 of the lead 2 or the obverse surface 31 of the lead 3 via a bonding material, not shown. In the present embodiment, the bonding material is a conductive bonding material and is solder, for example. The bonding material is not limited.

The connecting portion 73 connects the element connection portion 71 and the two lead connection portions 72 to each other. The connecting portion 73 is connected to the element connection portion 71 at its end on the y2 side in the y direction. The end on the y1 side in the y direction of the connecting portion 73 is separated into two sections, which are connected to different lead connection portions 72. The configuration of the connection lead 7 is not limited. Instead of the connection lead 7, other connecting members, such as bonding wires, may be used to connect the first electrode 631 of the semiconductor element 6 and the leads 2 and 3.

The sealing resin 8 covers a part of each of the leads 1, 2 and 3 and the entirety of the semiconductor element 6 and the connection lead 7. The sealing resin 8 is made of black epoxy resin, for example. The material of the sealing resin 8 is not limited. The sealing resin 8 is formed by transfer molding using a mold, for example. The method for forming the sealing resin 8 is not limited.

The sealing resin 8 includes a resin obverse surface 81, a resin reverse surface 82, and four resin side surfaces 83. The resin obverse surface 81 and the resin reverse surface 82 face away from each other in the z direction. The resin obverse surface 81 faces the z2 side in the z direction, and the resin reverse surface 82 faces the z1 side in the z direction.

Each of the four resin side surfaces 83 is connected to the resin obverse surface 81 and the resin reverse surface 82. Each resin side surface 83 faces outward in the x direction or the y direction. The four resin side surfaces 83 include a resin side surface 831, a resin side surface 832, a resin side surface 833, and a resin side surface 834. The resin side surface 831 and the resin side surface 832 face away from each other in the x direction. The resin side surface 831 is located on the x1 side in the x direction and faces the x1 side in the x direction. The resin side surface 832 is located on the x2 side in the x direction and faces the x2 side in the x direction. The resin side surface 833 and the resin side surface 834 face away from each other in the y direction. The resin side surface 833 is located on the y1 side in the y direction and faces the y1 side in the y direction. The resin side surface 834 is located on the y2 side in the y direction and faces the y2 side in the y direction. The four resin side surfaces 83 are inclined such that they come closer to each other as proceeding toward the resin obverse surface 81. That is, the sealing resin 8 is tapered such that its cross sectional area in the x-y plane decreases toward the resin obverse surface 81. Note that the shape of the sealing resin 8 shown in FIGS. 1 to 6 is an example. The shape of the sealing resin is not limited to the illustrated one.

As shown in FIGS. 3, 5 and 6, the reverse surface 12 of the lead 1, the reverse surface 22 of the lead 2, and the reverse surface 32 of the lead 3 are exposed from the resin reverse surface 82 of the sealing resin 8 and flush with the resin reverse surface 82. The connection end surface 15 of the lead 1 that faces the x1 side in the x direction is exposed from the resin side surface 831. The connection end surface of the lead 2 that faces the x2 side in the x direction is exposed from the resin side surface 832. The connection end surface 14 of the lead 1 is exposed from the resin side surface 834. The connection end surface 24 of the lead 2 and the connection end surface 34 of the lead 3 are exposed from the resin side surface 833.

An example of a method for manufacturing the semiconductor device A10 is described below with reference to FIGS. 10 to 19.

Figure 10:
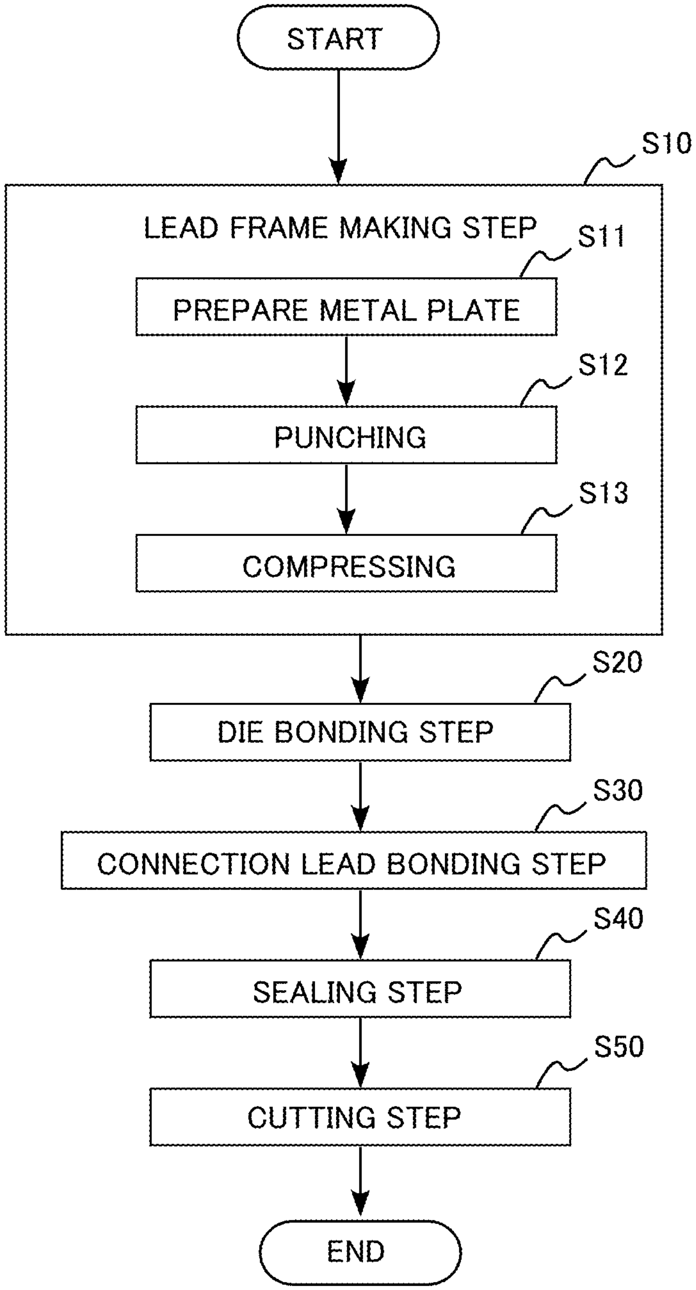
FIG. 10 is a flow chart of an example of a method for manufacturing the semiconductor device shown in FIG. 1.
Figure 11:
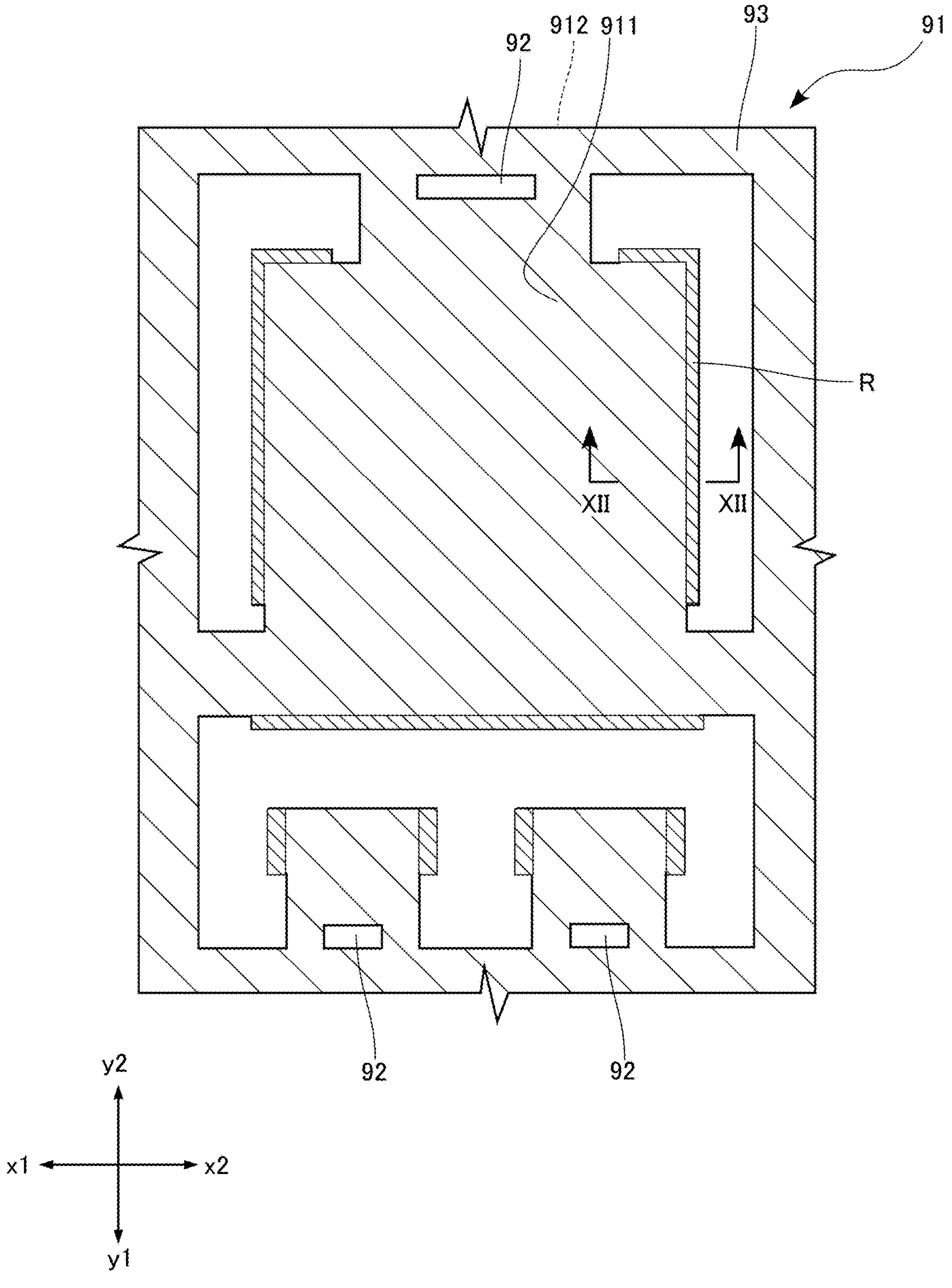
FIG. 11 is a plan view showing a step of an example of a method for manufacturing the semiconductor device shown in FIG. 1.
Figure 12:
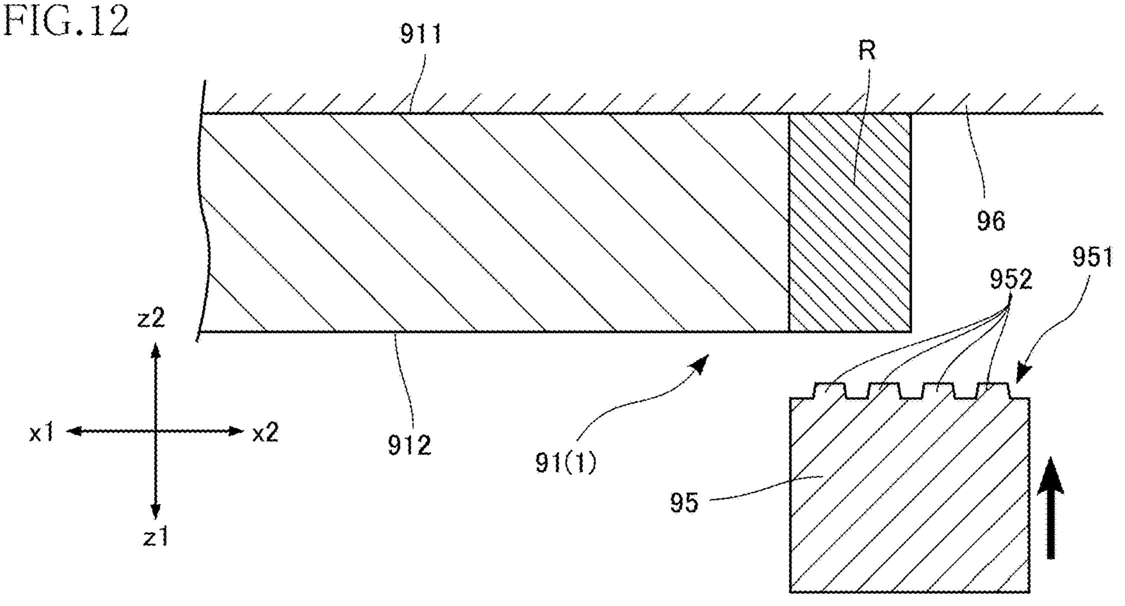
FIG. 12 is a sectional view showing a step of an example of a method for manufacturing the semiconductor device shown in FIG. 1.
Figure 13:
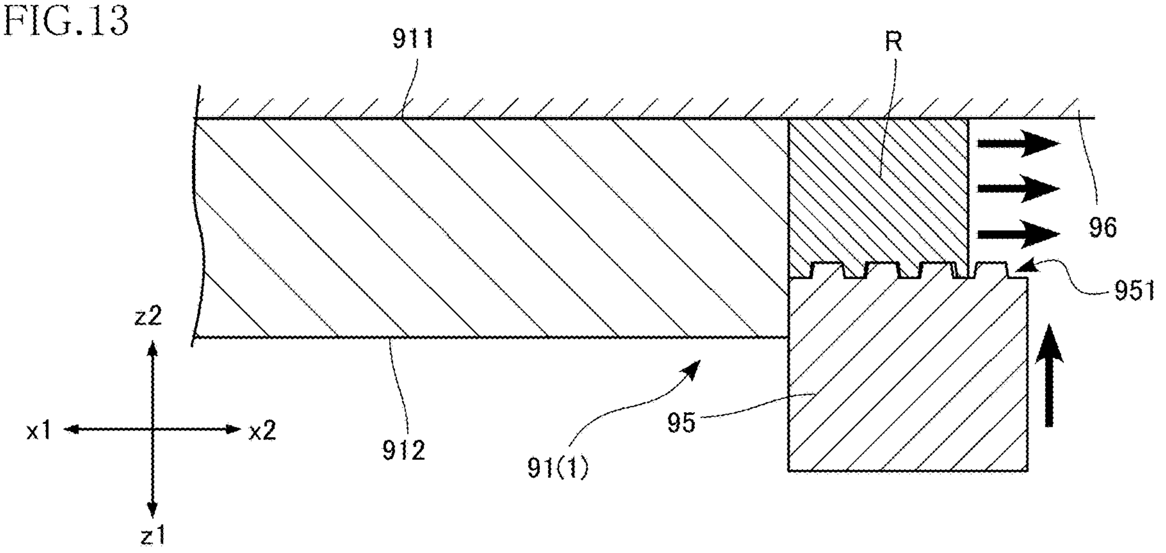
FIG. 13 is a sectional view showing a step of an example of a method for manufacturing the semiconductor device shown in FIG. 1.
Figure 14:
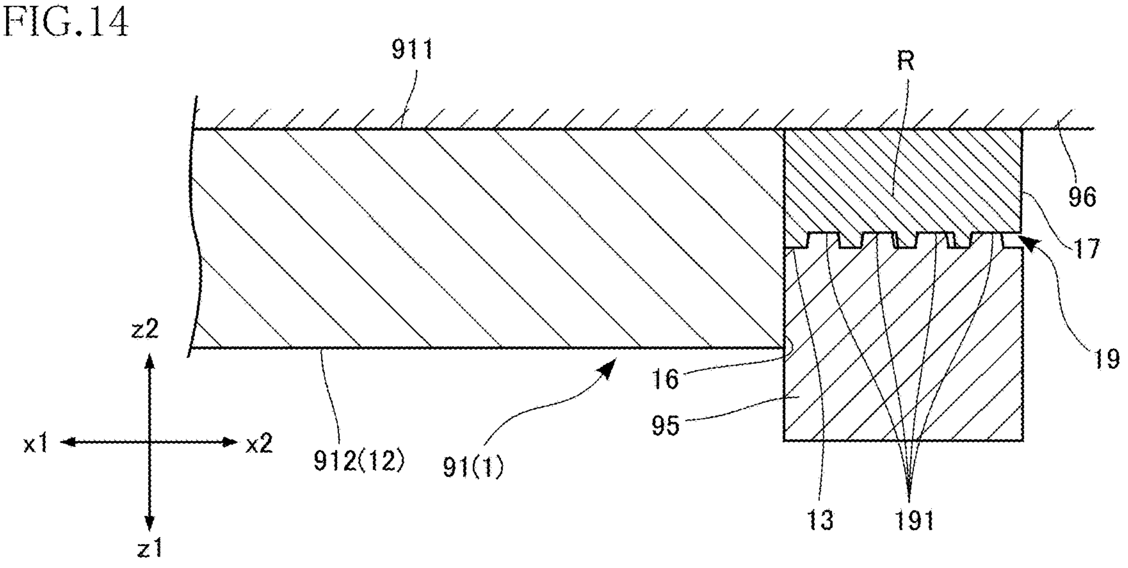
FIG. 14 is a sectional view showing a step of an example of a method for manufacturing the semiconductor device shown in FIG. 1.
Figure 15:
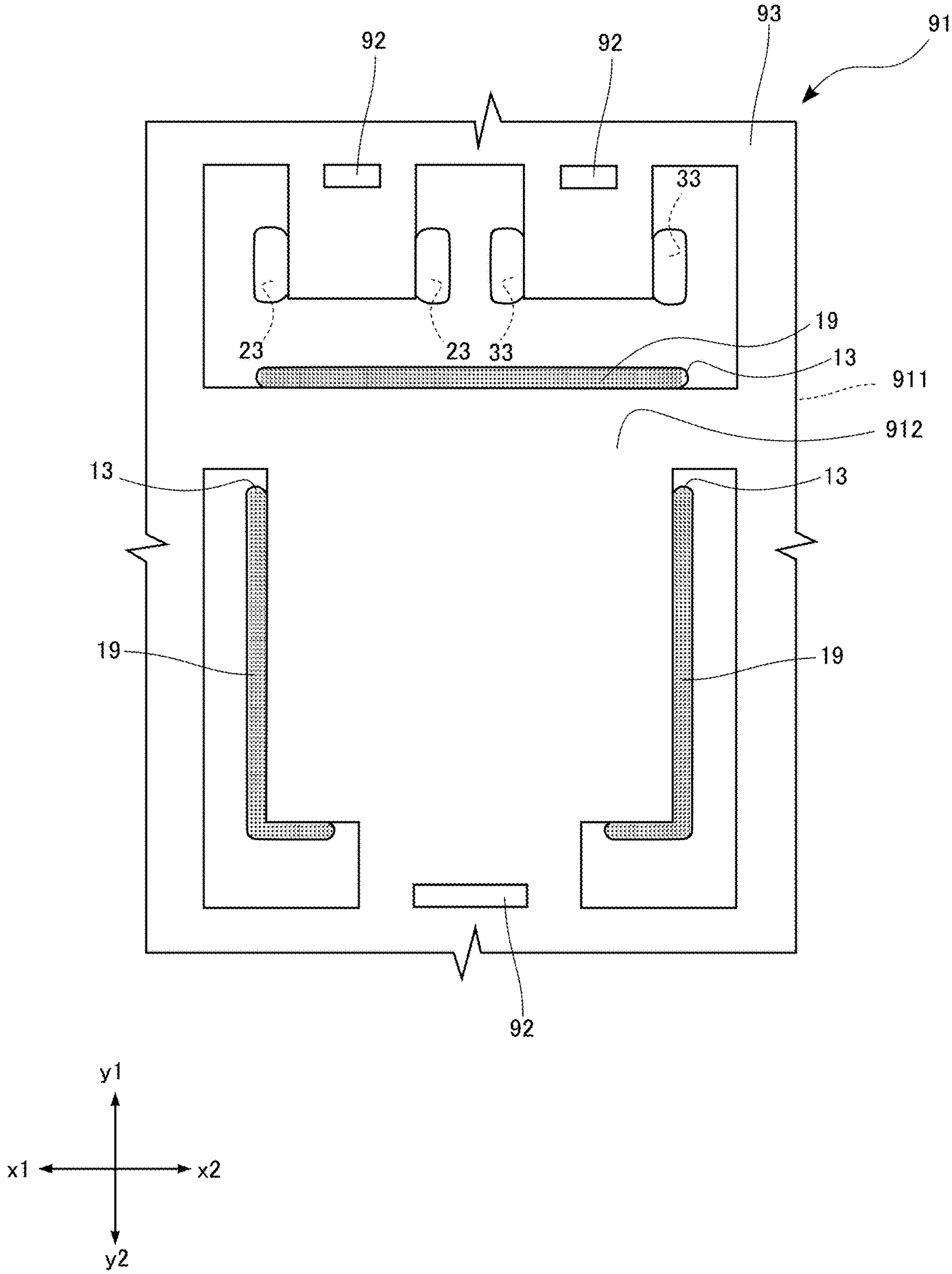
FIG. 15 is a bottom view showing a step of an example of a method for manufacturing the semiconductor device shown in FIG. 1.

FIG. 10 is a flow chart of an example of a method for manufacturing the semiconductor device A10. FIGS. 11 to 19 show steps of an example of a method for manufacturing the semiconductor device A10. FIGS. 11 and 16 to 18 are plan views corresponding to FIG. 2. FIGS. 12 and 14 are simplified sectional views corresponding to sectional views taken along line XII-XII in FIG. 11. FIG. 15 is a bottom view corresponding to FIG. 4. Note that the x direction, the y direction, and the z direction in FIGS. 11 to 18 are the same directions as those in FIGS. 1 to 9.

As shown in FIG. 10, the method for manufacturing the semiconductor device A10 includes a lead frame making step S10, a die bonding step S20, a connection lead bonding step S30, a sealing step S40, and a cutting step S50.

The lead frame making step S10 is a step for making a lead frame from a metal plate. In this step, a metal plate, which is a material of the lead frame, is first prepared (S11). The metal plate has an obverse surface and a reverse surface that face away from each other in the z direction.

Next, the metal plate is subjected to a stamping process to form the lead frame 91. First, the metal plate is subjected to punching, whereby the lead frame 91 is formed as shown in FIG. 11 (S12). Note that the lead frame 91 is hatched in FIG. 11. The lead frame 91 has an obverse surface 911 and a reverse surface 912 that face away from each other in the z direction. The obverse surface 911 of the lead frame 91 will become the obverse surface 11 of the lead 1, the obverse surface 21 of the lead 2, and the obverse surface 31 of the lead 3. The reverse surface 912 of the lead frame 91 will become the reverse surface 12 of the lead 1, the reverse surface 22 of the lead 2, and the reverse surface 32 of the lead 3. Through-holes 92 are formed at the locations at which the connection end surface 14 of the lead 1, the connection end surface 24 of the lead 2, and the connection end surface 34 of the lead 3 will be formed. In the lead frame 91, a plurality of sections each of which will become a semiconductor device A10 are connected to a frame part 93. Only one of such sections that will become a single semiconductor device A10 is shown in FIG. 11 (and in FIGS. 15 and 18 as well).

Next, a compressing process is performed on predetermined regions R of the lead frame 91 (S13). The regions R, to which relatively dense hatching is applied in FIG. 11, are the outer edges of the portions of the lead frame 91 that will become the leads 1 to 3. FIGS. 12 to 14 are the views to explain the compressing process performed on the region R of the portion that will become the lead 1. FIGS. 12 and 14 are simplified sectional views taken along line XII-XII in FIG. 11. As shown in FIGS. 12 to 14, the lead frame 91 is disposed with the obverse surface 911 in contact with a die 96. In FIGS. 12 to 14 as well, the relatively dense hatching as shown in FIG. 11 is applied to the region R.

During the compressing process, a die 95 is pressed against the region R of the lead frame 91 from the reverse surface 912 side, as shown in FIGS. 12 to 14. The die 95 is formed with an irregularity-forming part 951 on the surface facing the reverse surface 912. The irregularity-forming part 951 includes a plurality of protrusions 952 protruding toward the z2 side in the z direction. All protrusions 952 have the same shape and the same dimensions. Each protrusion 952 is rectangular as viewed in the z direction and tapered such that its cross sectional area in the x-y plane becomes smaller toward the z2 side in the z direction. The protrusions 952 are arranged in a matrix with equal intervals in the x direction and the y direction. In the present embodiment, the protrusions 952 are arranged in four rows in the x direction. The number of rows is not limited. Also, the arrangement position, shape and dimensions of each protrusion 952 are not limited.

FIG. 12 shows the state in which the die 95 is being raised from the reverse surface 912 side toward the region R of the lead frame 91. After this state, the irregularity-forming part 951 of the die 95 comes into contact with the reverse surface 912, and the die 95 is further raised as shown in FIG. 13. Thus, the irregularity-forming part 951 of the die 95 is pressed against the region R of the lead frame 91. As shown in FIG. 13, the region R of the lead frame 91 is compressed by the die 95 and spreads outward in the extension direction (toward the x2 side in the x direction in FIG. 13). FIG. 14 shows the state when the die 95 has raised to a predetermined position.

As shown in FIG. 14, when the region R is compressed and spread by the die 95, the internal reverse surface 13 is formed. The internal reverse surface 13 faces the same side as the reverse surface 912 (the z1 side in the z direction) and is located closer to the obverse surface 911 than is the reverse surface 912 in the z direction. The internal reverse surface 13 is formed with an irregular portion 19 including recesses 191 at positions corresponding to the protrusions 952 of the irregularity-forming part 951. Because the region R of the lead frame 91 has been compressed and spread outward in the extension direction, recesses 191 located at more outward positions have a larger dimension in the extension direction (x direction). The surface of the compressed and spread region R that faces outward in the extension direction (the x2 side in the x direction in FIG. 14) becomes the internal end surface 17. The portion that is in contact with a side surface of the die 95 becomes the internal connection surface 16.

The regions R of the portions of the lead frame 91 that will become the leads 2 and 3 are also compressed and spread by the die 95 to form the internal reverse surfaces 23 and 33. However, the die 95 is not formed with an irregularity-forming part 951 at locations facing the regions R of the portions of the lead frame 91 that will become the leads 2 and 3. Therefore, no irregular portion is formed on the internal reverse surfaces 23 and 33. Note that the irregularity-forming part 951 may be pressed against the lead frame 91 from the reverse surface 912 side by lowering the die 95, with the obverse surface 911 and the reverse surface 912 of the lead frame 91 vertically inverted. The regions R are compressed by the compressing process, and the internal reverse surfaces 13, 23, and 33 are formed on the reverse surface 912 side of the lead frame 91, as shown in FIG. 15. Also, the irregular portion 19 is formed on the internal reverse surface 13. Note that the punching process and the compressing process may be performed at the same time in the same step.

Figure 16:
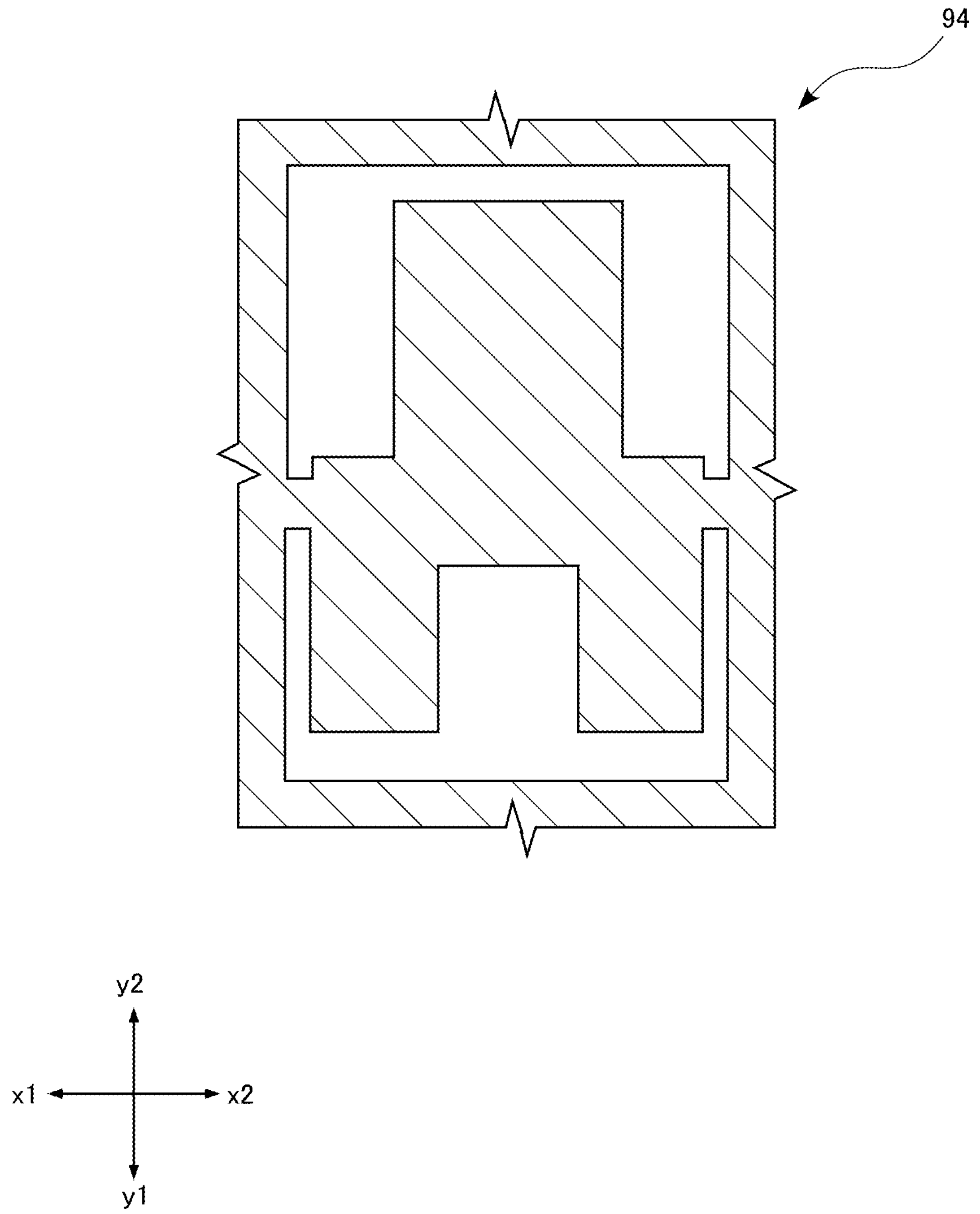
FIG. 16 is a plan view showing a step of an example of a method for manufacturing the semiconductor device shown in FIG. 1.
Figure 17:
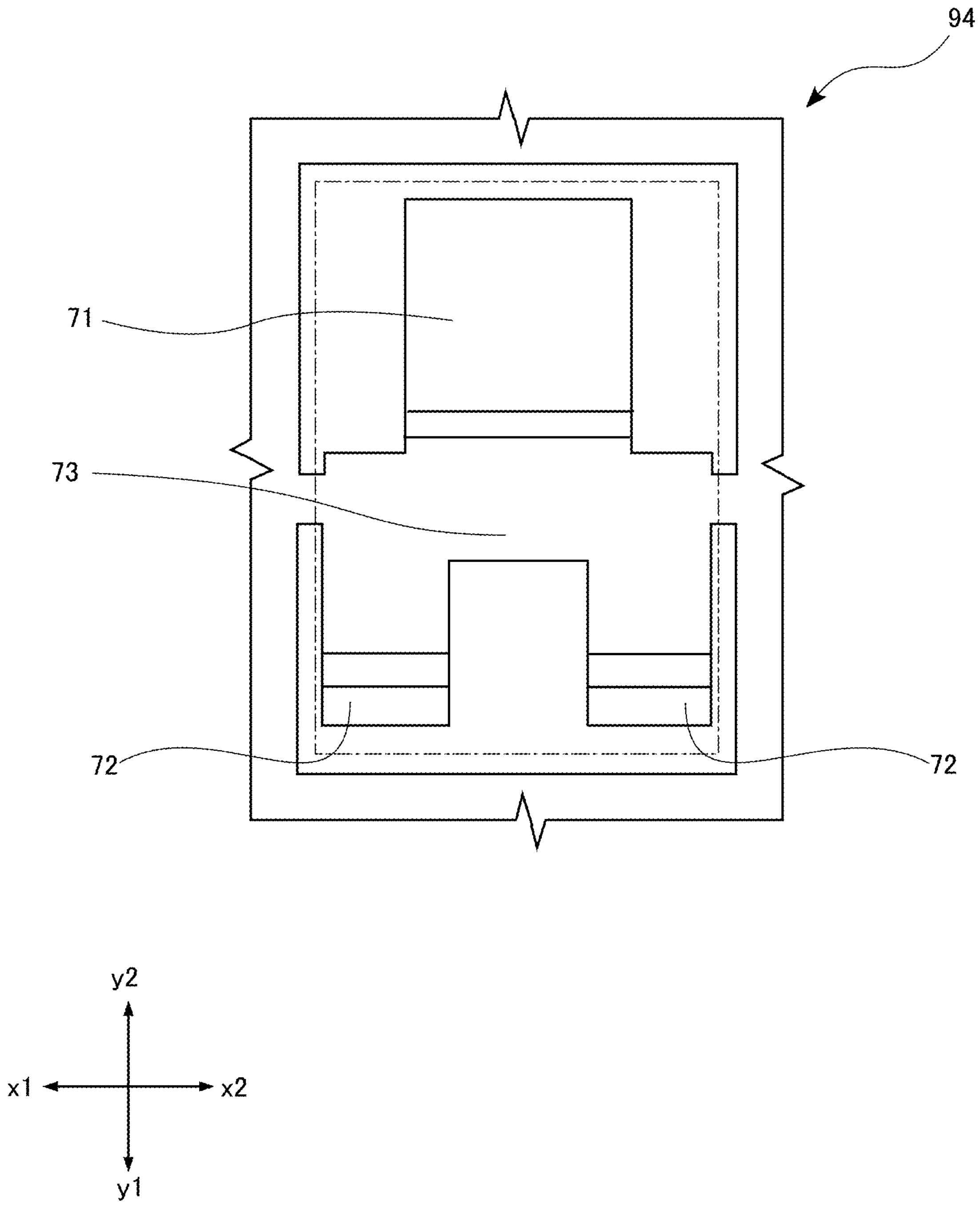
FIG. 17 is a plan view showing a step of an example of a method for manufacturing the semiconductor device shown in FIG. 1.

Meanwhile, another lead frame 94 is prepared separately from the lead frame 91, as shown in FIG. 16. The lead frame 94 is hatched in FIG. 16. The lead frame 94 is a plate-like material that will become the connection lead 7. Only a section that will become a single connection lead 7 is shown in FIG. 16 (and in FIG. 17 as well). The lead frame 94 is formed by subjecting a metal plate to a stamping process or an etching process, for example. Next, as shown in FIG. 17, the lead frame 94 is subjected to a bending process, whereby the element connection portion 71, two lead connection portions 72 and the connecting portion 73 are formed. The lead frame 94 is then cut along cutting lines (indicated by single dashed lines in FIG. 17), whereby the connection lead 7 is provided.

The die bonding step S20 is a step for bonding the semiconductor element 6 to the lead frame 91. In this step, solder paste is applied to the center of a region of the obverse surface 911 of the lead frame 91 that will become the obverse surface 11 of the lead 1. Next, the semiconductor element 6 is placed on the solder paste applied. Next, reflowing is performed to melt and then solidify the solder paste. Through the above process, the semiconductor element 6 is bonded to the lead frame 91. The method for bonding the semiconductor elements 6 in the die bonding step S20 is not limited.

Figure 18:
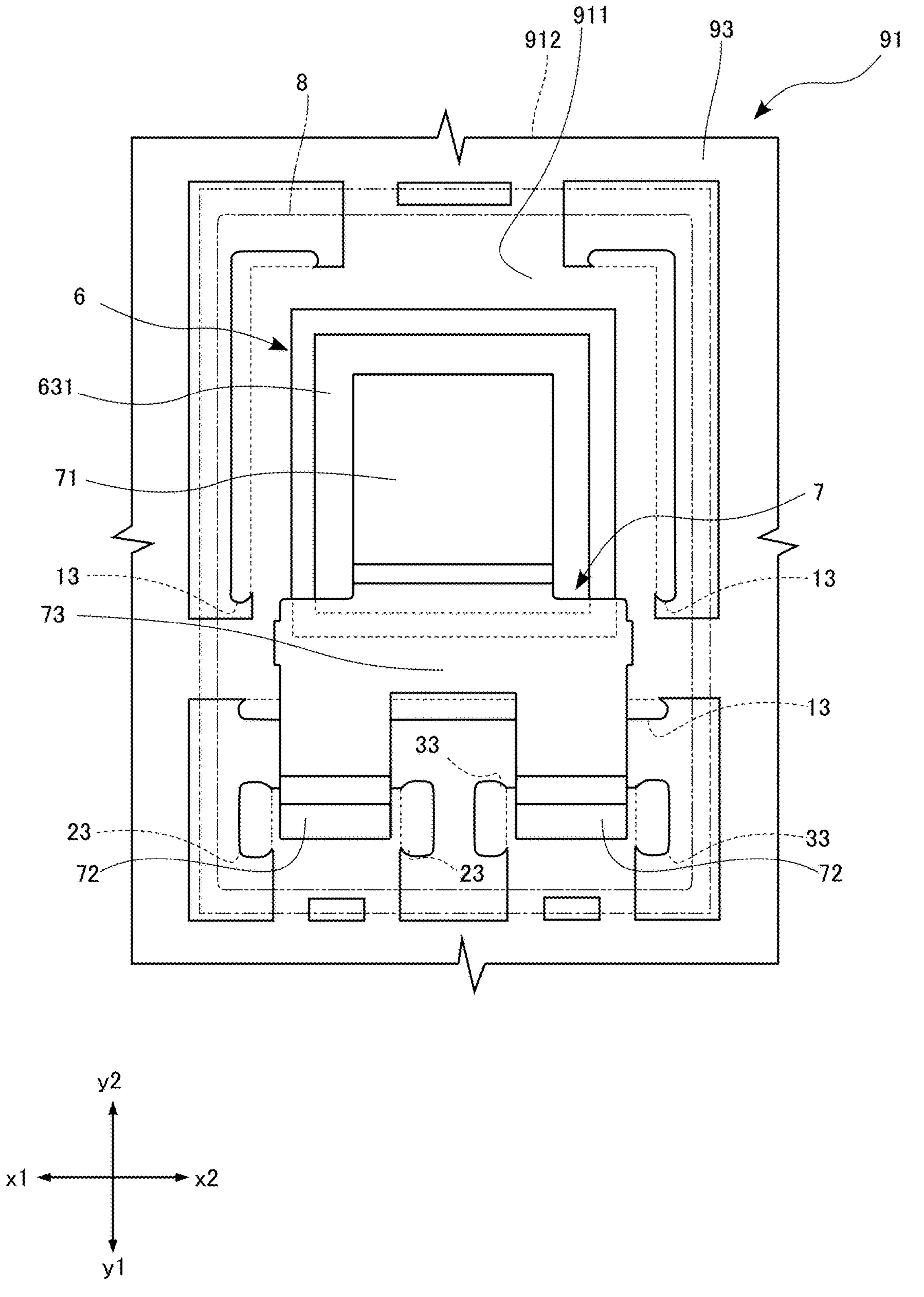
FIG. 18 is a plan view showing a step of an example of a method for manufacturing the semiconductor device shown in FIG. 1.

The connection lead bonding step S30 is a step for bonding the connection lead 7 as shown in FIG. 18. In this step, solder paste is applied to the first electrode 631 of the element obverse surface 61 of the semiconductor element 6. Solder paste is also applied to the obverse surface 911 of the lead frame 91 at a region that will become the obverse surface 21 of the lead 2 and a region that will become the obverse surface 31 of the lead 3. Next, the connection lead 7 is placed on the semiconductor element 6 and the lead frame 91. The element connection portion 71 of the connection lead 7 is placed on the solder paste applied to the first electrode 631 of the semiconductor element 6. One of the lead connection portions 72 of the connection lead 7 is placed on the solder paste applied to the region that will become the obverse surface 21 of the lead 2, and the other lead connection portion 72 is placed on the solder paste applied to the region that will become the obverse surface 31 of the lead 3. Next, reflowing is performed to melt and then solidify the solder paste. In this way, with solder, the element connection portion 71 and the first electrode 631 are bonded together, one of the lead connection portions 72 and the region that will become the obverse surface 21 of the lead 2 are bonded together, and the other lead connection portion 72 and the region that will become the obverse surface 31 of the lead 3 are bonded together. The method for bonding the connection lead 7 in the connection lead bonding step S30 is not limited.

The sealing step S40 is a step for forming the sealing resin 8. In this step, a resin material is hardened to form the sealing resin 8 (indicated by double dashed lines in FIG. 18) that covers the semiconductor element 6, the connection lead 7 and a portion of the lead frame 91. This step is performed by a known transfer molding technique using a mold, for example. Specifically, the lead frame 91, to which the semiconductor element 6 and the connection lead 7 are bonded, are set in a molding machine. Next, a fluidized resin material is loaded into a cavity in the mold and is then molded. Next, the resin material is hardened. Through the above process, the sealing resin 8 is provided. By setting the lead frame 91 with the reverse surface 912 in contact with the mold, the reverse surface 912 of the lead frame 91 is exposed from the sealing resin 8. Also, such setting makes the reverse surface 912 of the lead frame 91 and the resin reverse surface 82 of the sealing resin 8 be flush with each other. Since the resin material flows into the space between the mold and the internal reverse surfaces 13, 23 and 33, the internal reverse surfaces 13, 23 and 33 are covered with the sealing resin 8. The method for forming the sealing resin 8 in the sealing step S40 is not limited.

The cutting step S50 is a step for cutting the lead frame 91. In this step, the lead frame 91 is cut along cutting lines (indicated by single dashed lines in FIG. 18) into individual pieces. Thus, an individual piece corresponding to the semiconductor device A10 is obtained. When cut, the lead frame 91 becomes the lead 1, the lead 2 and the lead 3. The cut surfaces formed in this process are the connection end surfaces 14 and 15 of the lead 1, the connection end surface 24 of the lead 2, and the connection end surface 34 of the lead 3. The through-holes 92 become the recesses of the connection end surface 14, the connection end surface 24 and the connection end surface 34. The cutting method in the cutting step S50 is not limited. Through the above process, the semiconductor device A10 described above is obtained.

The effects of the semiconductor device A10 are described below.

According to the present embodiment, the internal reverse surface 13 of the lead 1 is formed with the irregular portion 19. The irregular portion 19 includes a plurality of recesses 191. The contact area between the internal reverse surface 13 and the sealing resin 8 is increased as compared with the case where the irregular portion 19 is not formed, whereby adhesion of the sealing resin 8 to the internal reverse surface 13 is enhanced. Thus, the semiconductor device A10 is capable of suppressing the separation of the sealing resin 8 at the internal reverse surface 13.

According to the present embodiment, the recesses 191 are arranged in a matrix. Because irregularities arranged along the y direction and irregularities arranged along the x direction are both formed, separation of the sealing resin 8 at the internal reverse surface 13 is suppressed for both the thermal stress generated in the x direction and the thermal stress generated in the y direction.

According to the present embodiment, the recesses 191 are formed by a stamping process. Therefore, the recesses 191 can be formed with more accurate arrangement, shape, and dimensions than when they are formed by a laser and when they are formed by half etching, for example. Moreover, as compared with the case where the recesses 191 are formed by other methods, the manufacturing process of the semiconductor device A10 can be simplified, so that the manufacturing time can be shortened and the manufacturing cost can be reduced.

Figure 19:
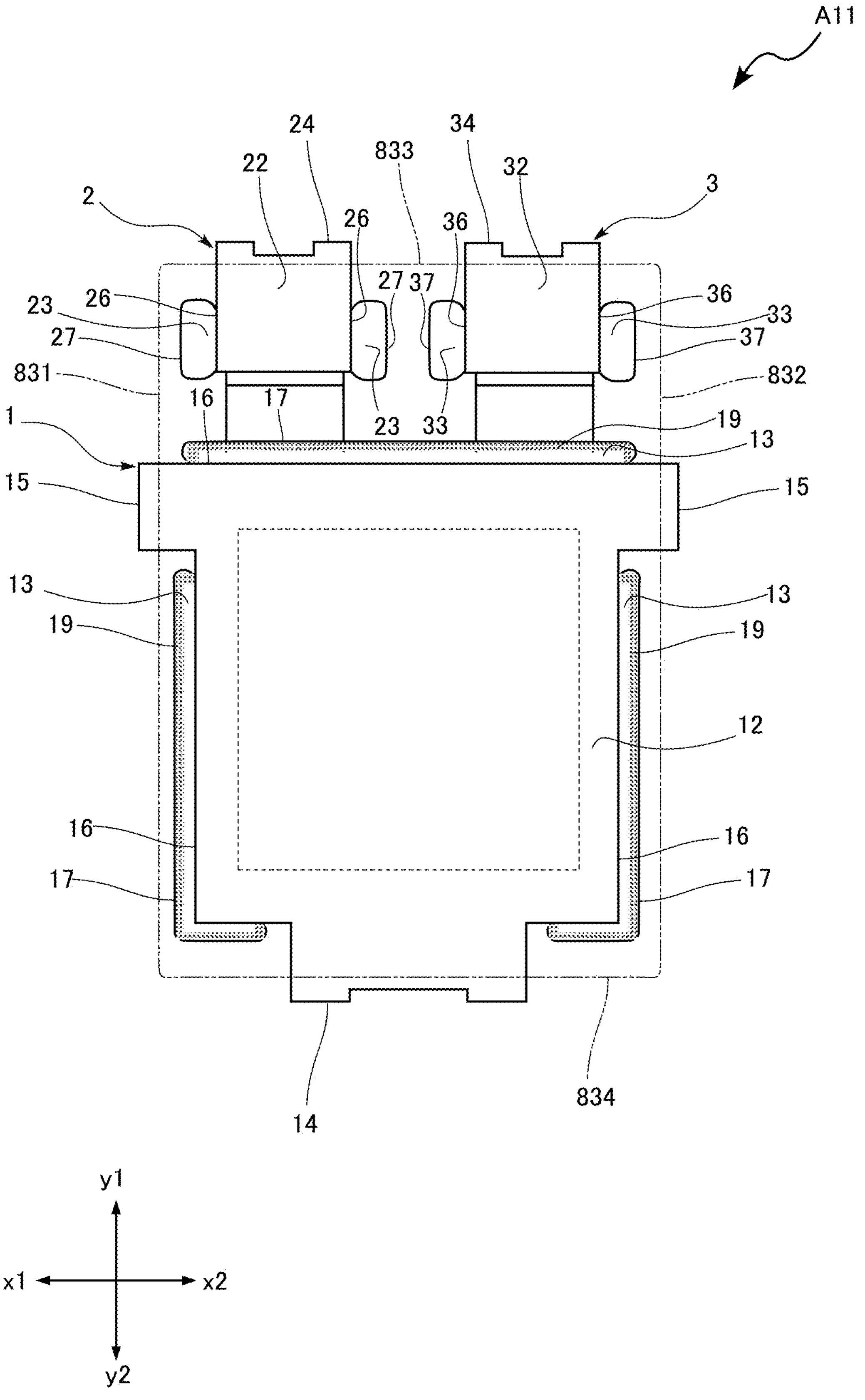
FIG. 19 is a bottom view of a semiconductor device according to a first variation of the first embodiment.
Figure 20:
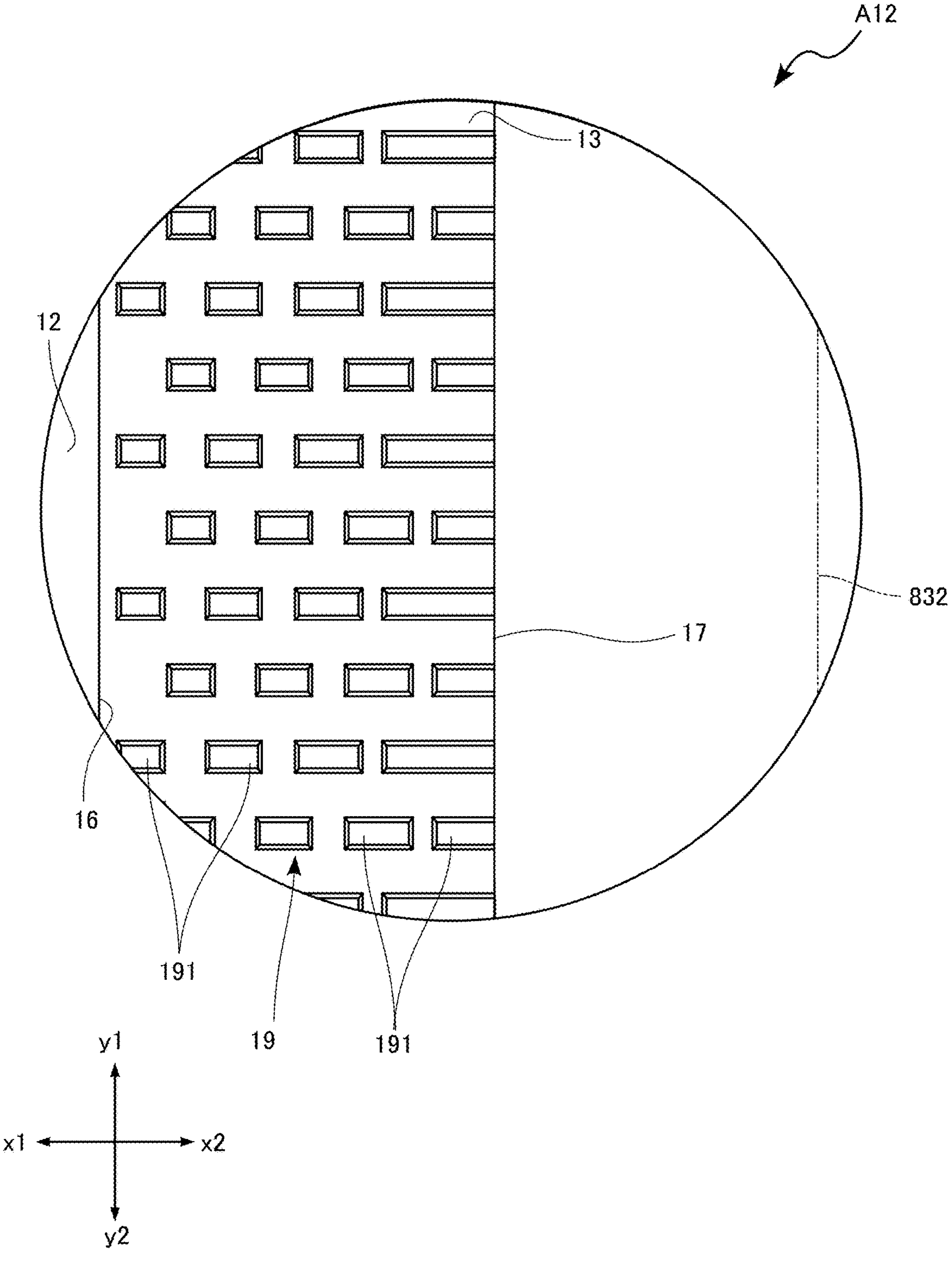
FIG. 20 is a partial enlarged bottom view of a semiconductor device according to a second variation of the first embodiment.
Figure 21:
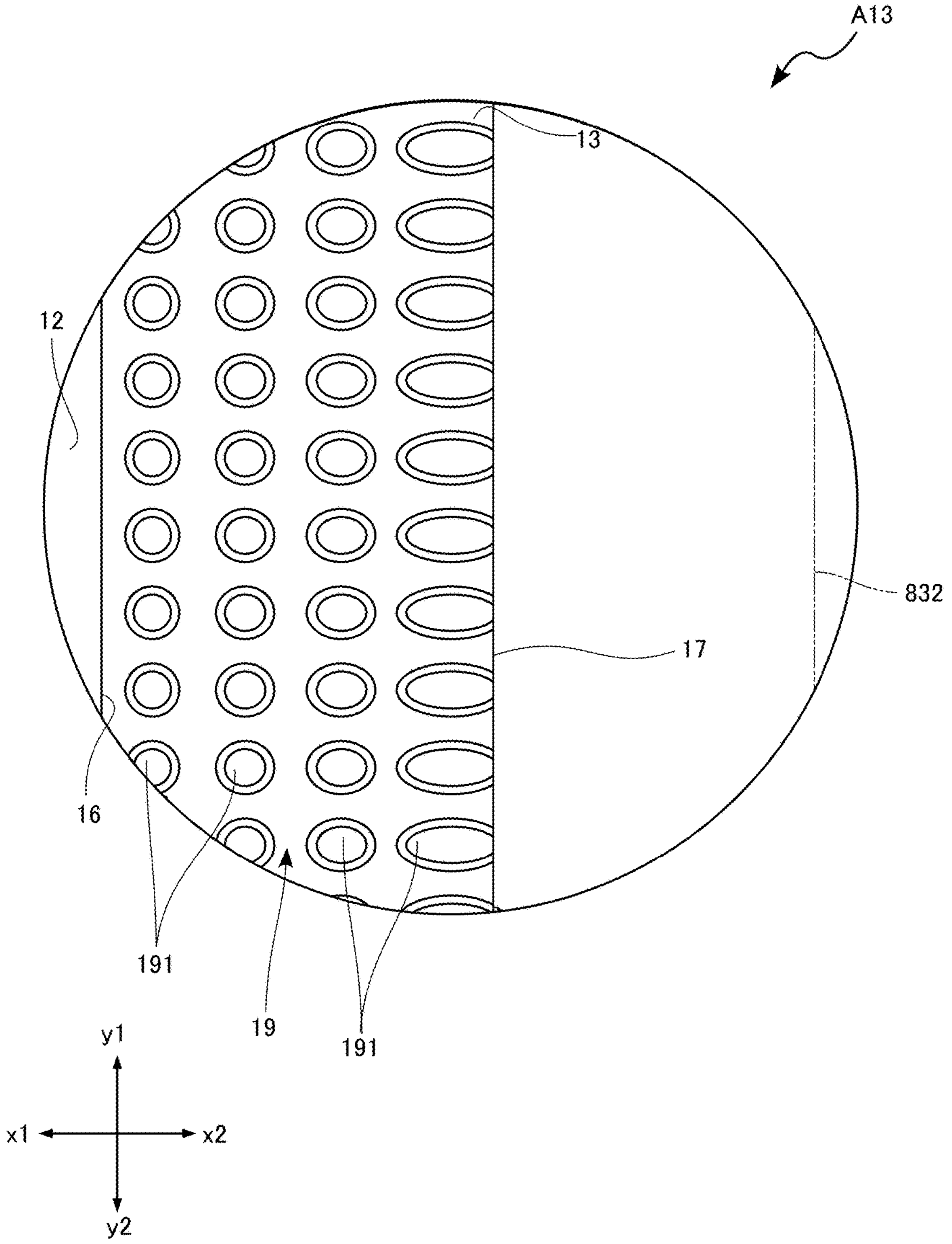
FIG. 21 is a partial enlarged bottom view of a semiconductor device according to a third variation of the first embodiment.

FIGS. 19 to 21 show variations of the irregular portion 19 of the first embodiment. In these figures, the elements that are identical or similar to those of the above-described embodiment are denoted by the same reference signs as those used for the above-described embodiment, and the description thereof is omitted.

[First Variation]

FIG. 19 is a bottom view of a semiconductor device A11 according to a first variation of the first embodiment and corresponds to FIG. 4. For the convenience of understanding, FIG. 19 shows the sealing resin 8 as transparent and indicates the outlines of the sealing resin 8 by imaginary lines (double dashed lines). In the semiconductor device A11, the area in which the irregular portion 19 is formed on the internal reverse surface 13 is narrower as compared with that in the semiconductor device A10. In the present variation, the irregular portion 19 is formed only at the outer edge of the internal reverse surface 13. As illustrated in this variation, the area of the internal reverse surface 13 at which the irregular portion 19 is formed is not limited. However, it is preferable that the irregular portion 19 is formed at least on the outer edge of the internal reverse surface 13, and it is more preferable that the irregular portion 19 is formed over the entire area of the internal reverse surface 13.

[Second Variation]

FIG. 20 is a view for describing a semiconductor device A12 according to a second variation of the first embodiment. FIG. 20 is a partial enlarged bottom view of the semiconductor device A12 and corresponds to FIG. 8. The semiconductor device A12 differs from the semiconductor device A10 in arrangement or configuration of the recesses 191 of the irregular portion 19. In the present variation, the recesses 191 are disposed in a staggered arrangement. The arrangement of the recesses 191 in the irregular portion 19 is not limited. For example, the recesses 191 may be disposed at random. The recesses 191 of the irregular portion 19 can be formed at desired positions by appropriately setting the arrangement of the protrusions 952 of the irregularity-forming part 951 of the die 95.

[Third Variation]

FIG. 21 is a view for describing a semiconductor device A13 according to a third variation of the first embodiment. FIG. 21 is a partial enlarged bottom view of the semiconductor device A13 and corresponds to FIG. 8. The semiconductor device A13 differs from the semiconductor device A10 in shape of each recess 191 of the irregular portion 19 as viewed in the z direction. In the present variation, the shape of each recess 191 as viewed in the z direction is circular or elliptical. Recesses 191 located closer to the outer edge have a larger dimension in the extension direction (the x direction in FIG. 21). The shape of each recess 191 of the irregular portion 19 as viewed in the z direction is not limited and may be any other shape. The recesses 191 may have different shapes from each other. Each recess 191 of the irregular portion 19 can be formed into a desired shape by appropriately setting the shape of each protrusion 952 of the irregularity-forming part 951 of the die 95.

In the present embodiment, the irregular portion 19 is formed at all of the portions of the internal reverse surface 13 that are located on opposite sides in the x direction of the reverse surface 12 and the portions of the internal reverse surface 13 that are located on opposite sides in the y direction of the reverse surface 12. However, the present disclosure is not limited to this. The internal reverse surface 13 may include a portion at which the irregular portion 19 is not formed. For example, the portion of the internal reverse surface 13 that is sufficiently far from the semiconductor element 6 may not be formed with the irregular portion 19. However, it is preferable that the irregular portion 19 is formed over the entirety of the internal reverse surface 13.

FIGS. 22 to 26 show other embodiments of the present disclosure. In these figures, the elements that are identical or similar to those of the above-described embodiment are denoted by the same reference signs as those used for the above-described embodiment, and the description thereof is omitted.

Second Embodiment

Figure 22:
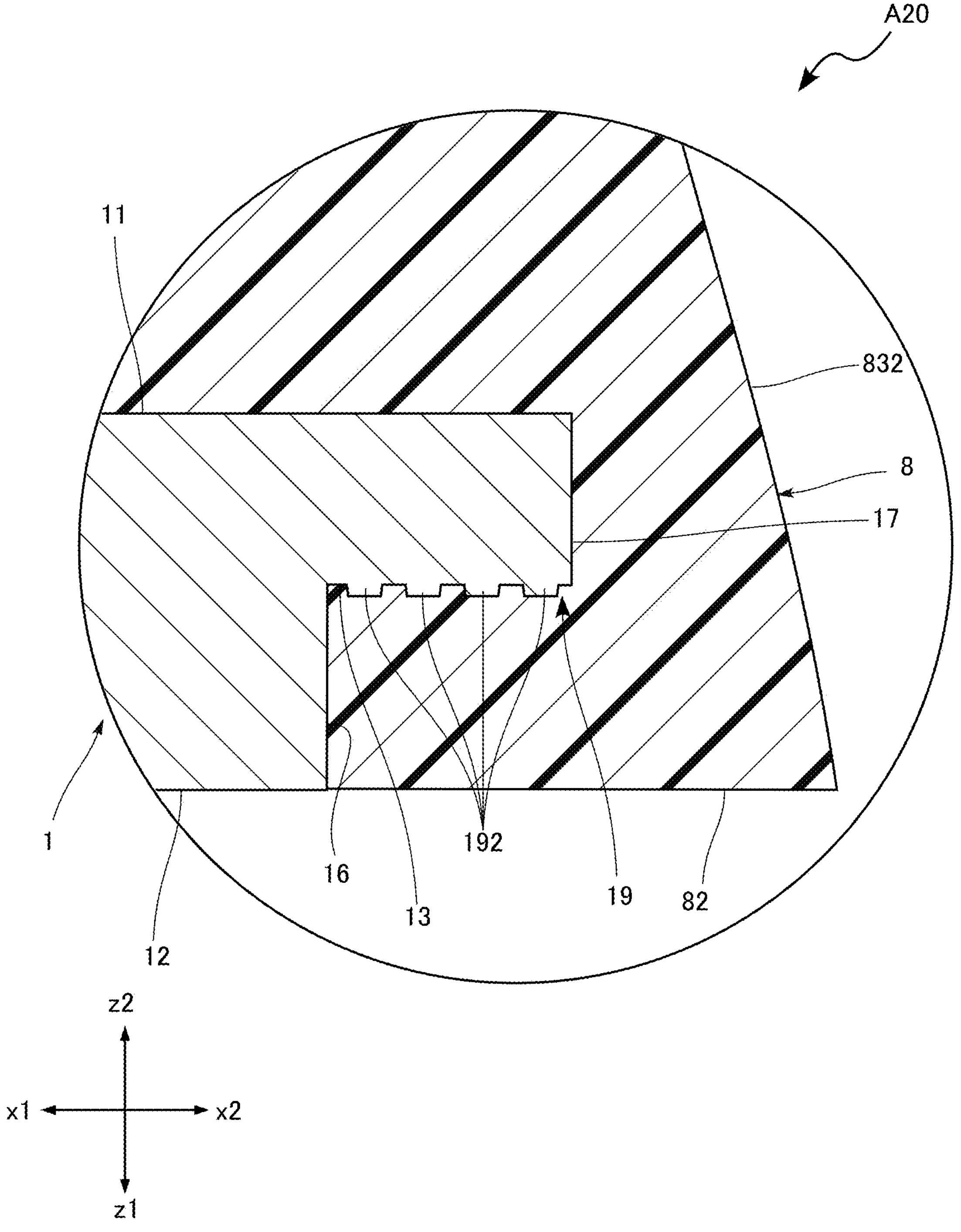
FIG. 22 is a partial enlarged sectional view of a semiconductor device according to a second embodiment of the present disclosure.
Figure 23:
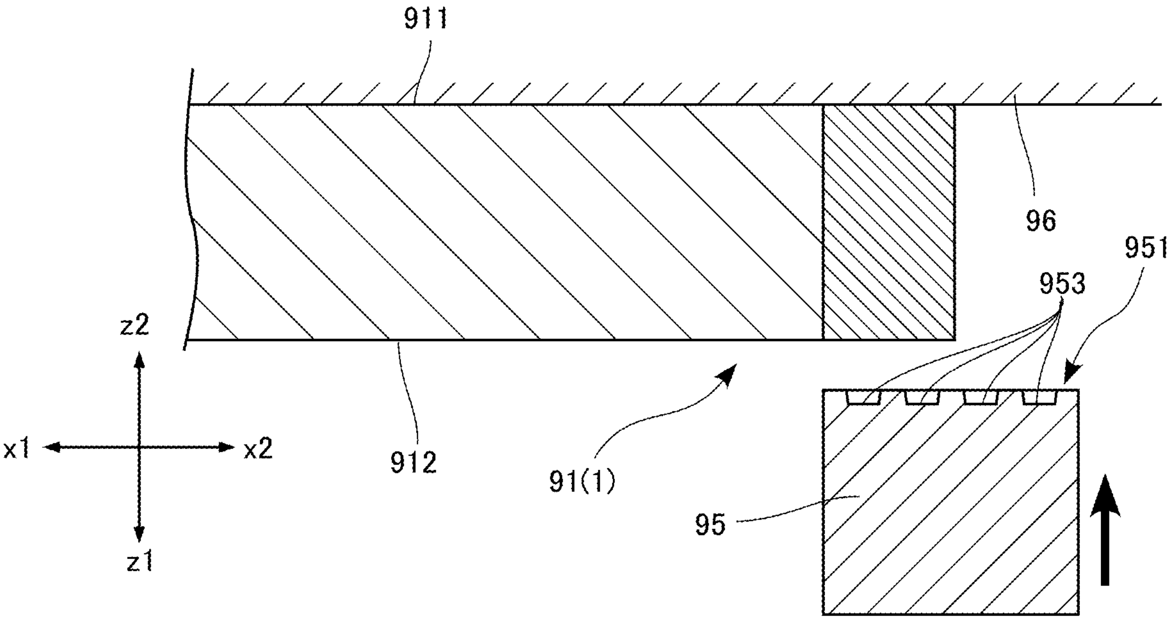
FIG. 23 is a sectional view showing a step of an example of a method for manufacturing the semiconductor device shown in FIG. 22.

FIGS. 22 and 23 are views for describing a semiconductor device A20 according to a second embodiment of the present disclosure. FIG. 22 is a partial enlarged sectional view of the semiconductor device A20 and corresponds to FIG. 7. FIG. 23 is a sectional view showing a step of an example of a method for manufacturing the semiconductor device A20 and corresponds to FIG. 12. The semiconductor device A20 according to the present embodiment differs from the semiconductor device A10 according to the first embodiment in that the irregular portion 19 includes a plurality of protrusions 192. The configuration and operation of other parts of the present embodiment are the same as those of the first embodiment. Note that various parts of the first embodiment and the variations may be selectively used in an any appropriate combination.

The irregular portion 19 formed on the internal reverse surface 13 of the lead 1 of the present embodiment includes a plurality of protrusions 192 instead of a plurality of recesses 191. As shown in FIG. 22, each protrusion 192 protrudes from the internal reverse surface 13 toward the side that the reverse surface 12 faces (the z1 side in the z direction). Each protrusion 192 is tapered such that its cross sectional area in the x-y plane becomes larger toward the obverse surface 11 (the z2 side in the z direction). As with the recesses 191 of the first embodiment, each protrusion 192 has a rectangular shape elongated in the extension direction (the x direction in FIG. 22), as viewed in the z direction. The protrusions 192 are arranged in a matrix.

As shown in FIG. 23, the protrusions 192 are formed when the internal reverse surface 13 is formed by a compressing process using a die 95 that is formed with a irregularity-forming part 951 including a plurality of recesses 953 recessed toward the z1 side in the z direction.

In the present embodiment again, the internal reverse surface 13 of the lead 1 is formed with the irregular portion 19. The irregular portion 19 includes a plurality of protrusions 192. Thus, adhesion of the sealing resin 8 to the internal reverse surface 13 is enhanced. Thus, the semiconductor device A20 is capable of suppressing the separation of the sealing resin 8 at the internal reverse surface 13. The semiconductor device A20 has a configuration in common with the semiconductor device A10, thereby achieving the same effect as the semiconductor device A10.

Third Embodiment

Figure 24:
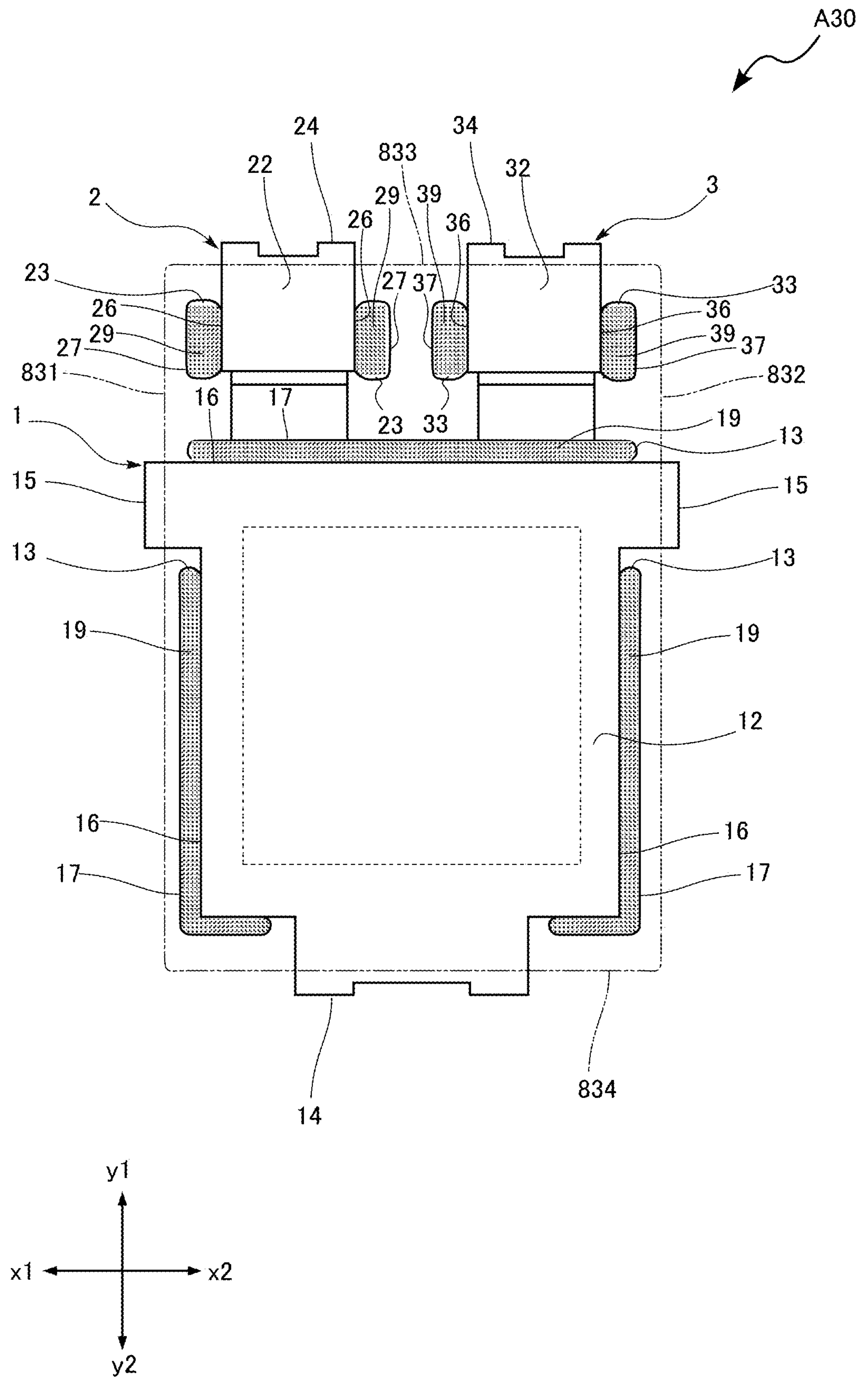
FIG. 24 is a bottom view of a semiconductor device according to a third embodiment of the present disclosure.

FIG. 24 is a view for describing a semiconductor device A30 according to a third embodiment of the present disclosure. FIG. 24 is a bottom view of the semiconductor device A30 and corresponds to FIG. 4. For the convenience of understanding, FIG. 24 shows the sealing resin 8 as transparent and indicates the outlines of the sealing resin 8 by imaginary lines (double dashed lines). The semiconductor device A30 of the present embodiment differs from the semiconductor device A10 of the first embodiment in that the internal reverse surface 23 of the lead 2 is formed with an irregular portion 29 and the internal reverse surface 33 of the lead 3 is formed with an irregular portion 39. The configuration and operation of other parts of the present embodiment are the same as those of the first embodiment. Note that various parts of the first and the second embodiments and the variations may be selectively used in an any appropriate combination.

The internal reverse surface 23 of the lead 2 of the present embodiment is formed with the irregular portion 29. The internal reverse surface 33 of the lead 3 of the present embodiment is formed with the irregular portion 39. The configurations of the irregular portion 29 and the irregular portion 39 of the present embodiment are the same as that of the irregular portion 19 of the semiconductor device A10 according to the first embodiment. Note that the configurations of the irregular portion 29 and the irregular portion 39 are not limited and may be the same as those of the variations of the irregular portion 19 according to the first embodiment. The irregular portion 29 and the irregular portion 39 are formed by forming irregularity-forming parts 951 also at locations of the die 95 that face the region R of the portions of the lead frame 91 that will become the leads 2 and 3.

In the present embodiment again, the internal reverse surface 13 of the lead 1 is formed with the irregular portion 19. The irregular portion 19 includes a plurality of recesses 191. Thus, adhesion of the sealing resin 8 to the internal reverse surface 13 is enhanced. Thus, the semiconductor device A30 is capable of suppressing the separation of the sealing resin 8 at the internal reverse surface 13. The semiconductor device A30 has a configuration in common with the semiconductor device A10, thereby achieving the same effect as the semiconductor device A10. Moreover, according to the present embodiment, the internal reverse surface 23 is formed with the irregular portion 29, and the internal reverse surface 33 is formed with the irregular portion 39. Thus, the semiconductor device A30 is also capable of suppressing the separation of the sealing resin 8 at the internal reverse surface 23 and the internal reverse surface 33.

Fourth Embodiment

Figure 25:
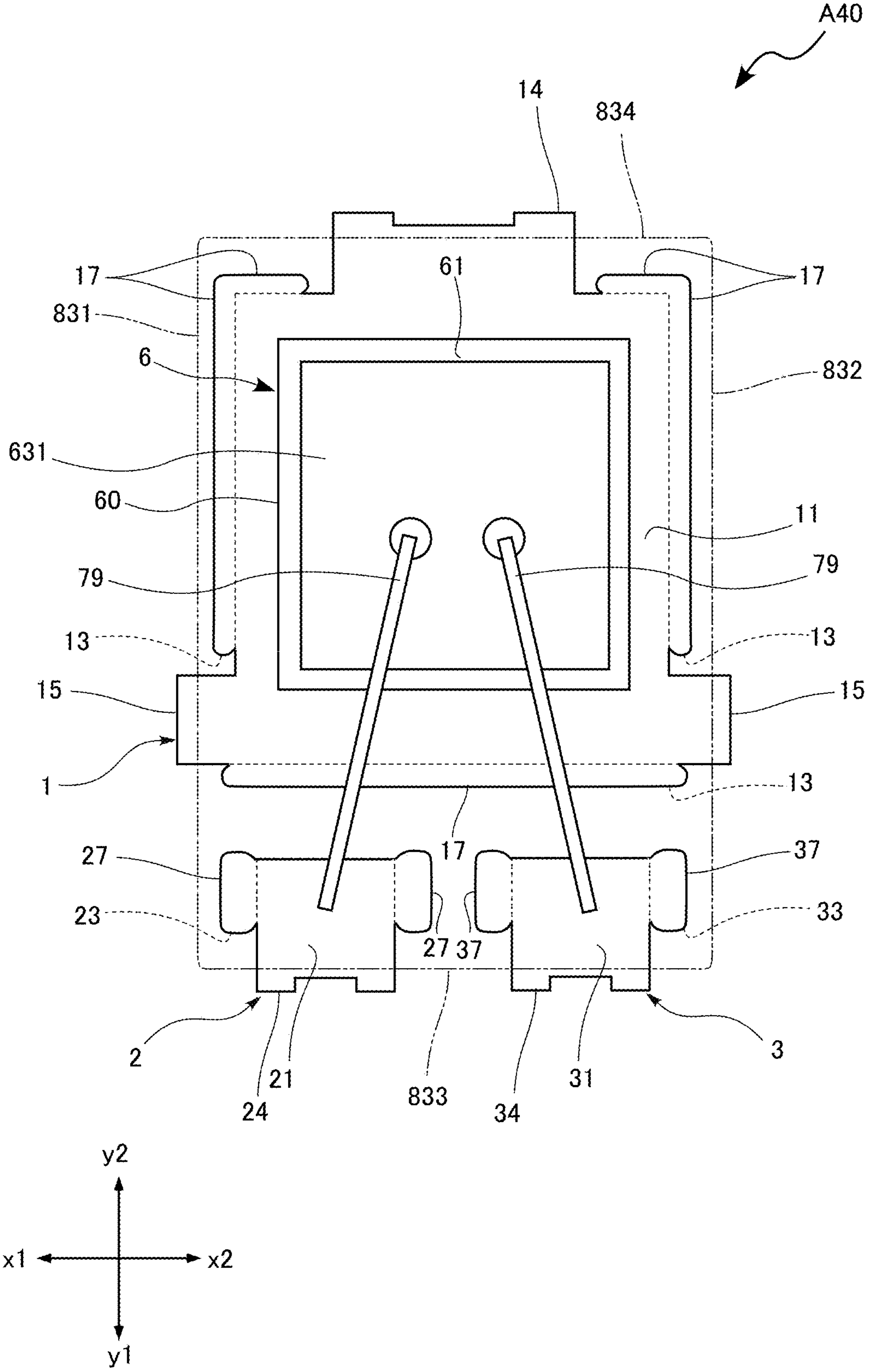
FIG. 25 is a plan view of a semiconductor device according to a fourth embodiment of the present disclosure.

FIG. 25 is a view for describing a semiconductor device A40 according to a fourth embodiment of the present disclosure. FIG. 25 is a plan view of the semiconductor device A40 and corresponds to FIG. 2. The semiconductor device A40 according to the present embodiment differs from the semiconductor device A10 according to the first embodiment in that it includes wires 79 instead of the connection lead 7. The configuration and operation of other parts of the present embodiment are the same as those of the first embodiment. Note that various parts of the first through the third embodiments and the variations may be selectively used in an any appropriate combination.

The semiconductor device A40 according to the present embodiment does not include the connection lead 7 and includes two wires 79 instead. One of the wires 79 is bonded to the first electrode 631 of the semiconductor element 6 and the obverse surface 21 of the lead 2. The other wire 79 is bonded to the first electrode 631 of the semiconductor element 6 and the obverse surface 31 of the lead 3. The number of wires 79 that connect the first electrode 631 and the obverse surface 21 and the number of wires 79 that connect the first electrode 631 and the obverse surface 31 are not limited to one. Each of these connections may use a plurality of wires 79. Also, the material, diameter, etc. of each wire 79 are not limited.

In the present embodiment again, the internal reverse surface 13 of the lead 1 is formed with the irregular portion 19. The irregular portion 19 includes a plurality of recesses 191. Thus, adhesion of the sealing resin 8 to the internal reverse surface 13 is enhanced. Thus, the semiconductor device A40 is capable of suppressing the separation of the sealing resin 8 at the internal reverse surface 13. The semiconductor device A40 has a configuration in common with the semiconductor device A10, thereby achieving the same effect as the semiconductor device A10. Moreover, according to the present embodiment, preparation of the connection lead 7 is not necessary. Thus, the semiconductor device A40 is capable of simplifying the manufacturing process and reducing the manufacturing cost.

Fifth Embodiment

Figure 26:
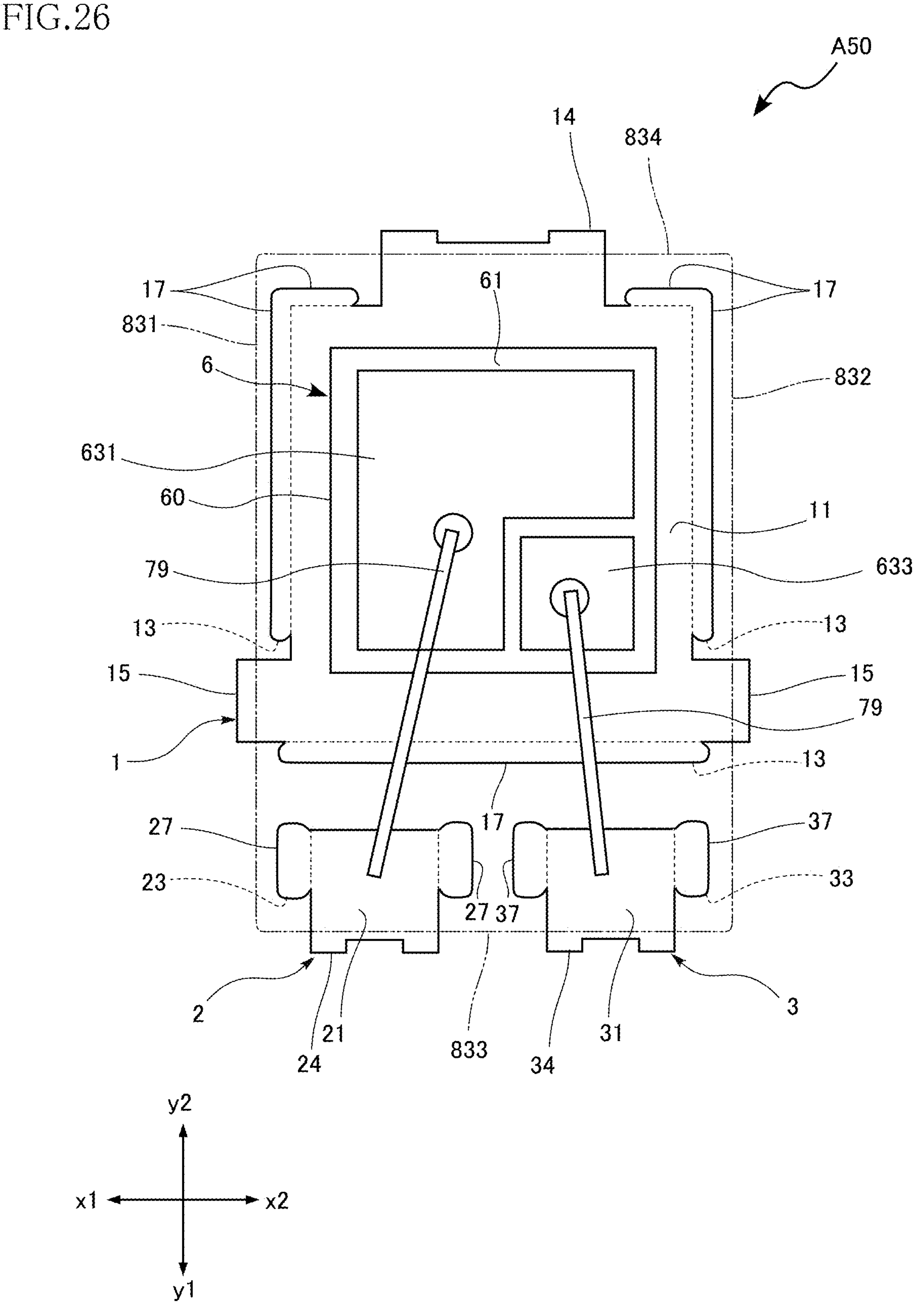
FIG. 26 is a plan view of a semiconductor device according to a fifth embodiment of the present disclosure.

FIG. 26 is a view for describing a semiconductor device A50 according to a fifth embodiment of the present disclosure. FIG. 26 is a plan view of the semiconductor device A50 and corresponds to FIG. 2. The semiconductor device A50 according to the present embodiment differs from the semiconductor device A10 according to the first embodiment in the type of the semiconductor element 6 and in that it includes wires 79 instead of the connection lead 7. The configuration and operation of other parts of the present embodiment are the same as those of the first embodiment. Note that various parts of the first through the fourth embodiments and the variations may be selectively used in an any appropriate combination.

In the present embodiment, the semiconductor element 6 is a MOSFET (metal-oxide-semiconductor field-effect transistor), for example. The semiconductor element 6 may be other transistors such as an IGBT (Insulated Gate Bipolar Transistor). The semiconductor element 6 further includes a third electrode 633 disposed on the element obverse surface 61. In the present embodiment, the first electrode 631 is a source electrode, the second electrode 632 is a drain electrode, and the third electrode 633 is a gate electrode. The second electrode 632 of the semiconductor element 6 is electrically connected to the lead 1 via a bonding material. Thus, the lead 1 is electrically connected to the second electrode 632 (the drain electrode) of the semiconductor element 6 to function as a drain terminal. The first electrode 631 of the semiconductor element 6 is electrically connected to the lead 2 via a wire 79. Thus, the lead 2 is electrically connected to the first electrode 631 (the source electrode) of the semiconductor element 6 to function as a source terminal. The third electrode 633 of the semiconductor element 6 is electrically connected to the lead 3 via a wire 79. Thus, the lead 3 is electrically connected to the third electrode 633 (the gate electrode) of the semiconductor element 6 to function as a gate terminal.

In the present embodiment again, the internal reverse surface 13 of the lead 1 is formed with the irregular portion 19. The irregular portion 19 includes a plurality of recesses 191. Thus, adhesion of the sealing resin 8 to the internal reverse surface 13 is enhanced. Thus, the semiconductor device A50 is capable of suppressing the separation of the sealing resin 8 at the internal reverse surface 13. The semiconductor device A50 has a configuration in common with the semiconductor device A10, thereby achieving the same effect as the semiconductor device A10.

In the present embodiment, the first electrode 631 and the lead 2 are electrically connected to each other via a wire 79, and the third electrode 633 and the lead 3 are electrically connected to each other via a wire 79, but the present disclosure is not limited to this. The first electrode 631 and the lead 2, as well as the third electrode 633 and the lead 3 may be electrically connected to each other via other connection members such as a connection lead.

The semiconductor element 6 is a diode in the first through the fourth embodiments, and the semiconductor element 6 is a transistor in the fifth embodiment. However, the present disclosure is not limited to these. The type of the semiconductor element 6 is not limited and may be other semiconductor elements such as an integrated circuit. Also, three leads are disposed in the first through the fifth embodiments, but the present disclosure is not limited to this. The number and arrangement position of leads are not limited and may be set as appropriate depending on the number and arrangement position of electrodes disposed on the element obverse surface 61 of the semiconductor element 6.

Fifth Embodiment

A semiconductor device A60 according to a sixth embodiment of the present disclosure will be described based on FIGS. 27 to 38. The semiconductor device A60 includes a lead 1, a lead 2, a lead 3, a semiconductor element 6, a connection lead 7, and a sealing resin 8.

Figure 27:
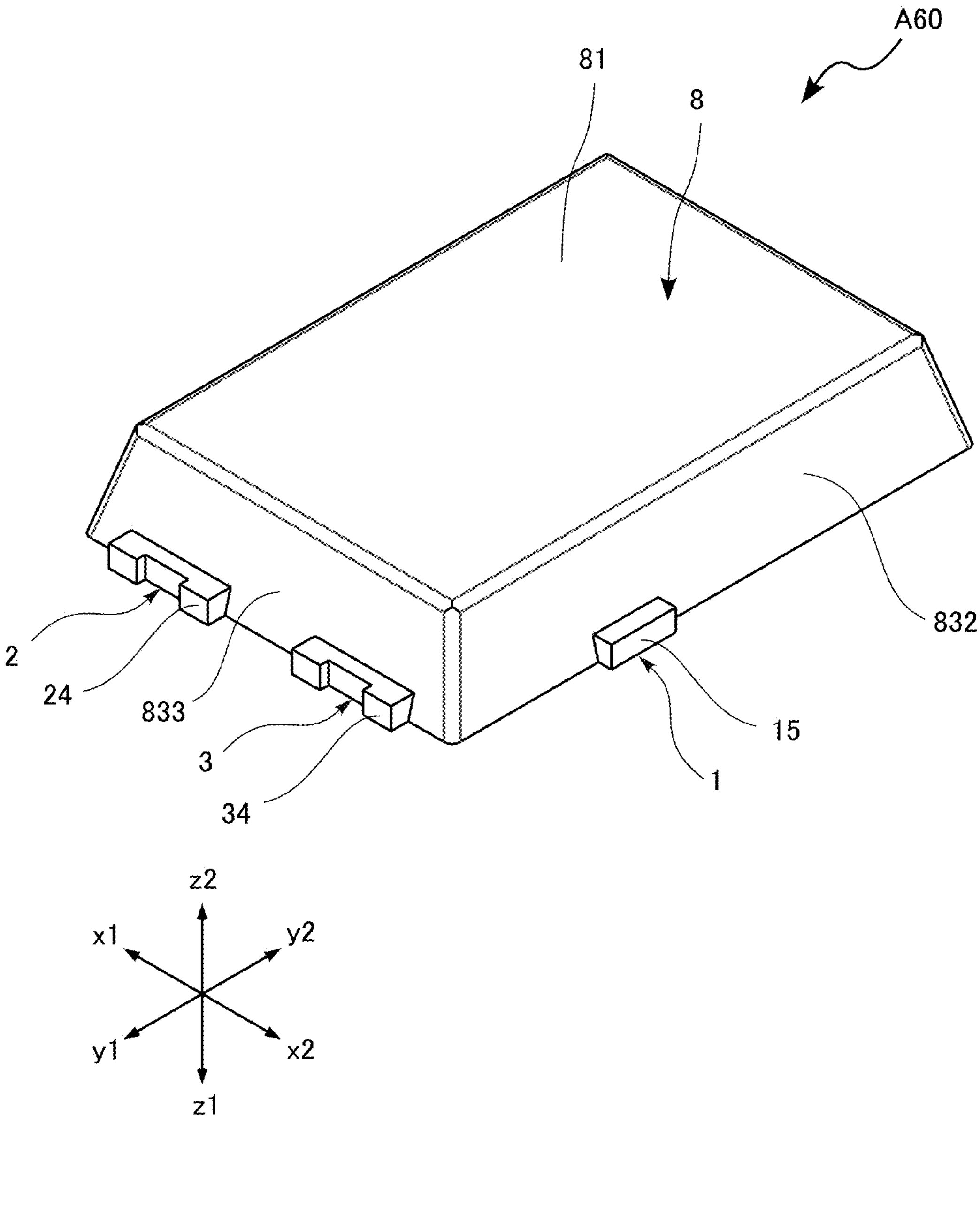
FIG. 27 is a perspective view of a semiconductor device according to a sixth embodiment of the present disclosure.
Figure 28:
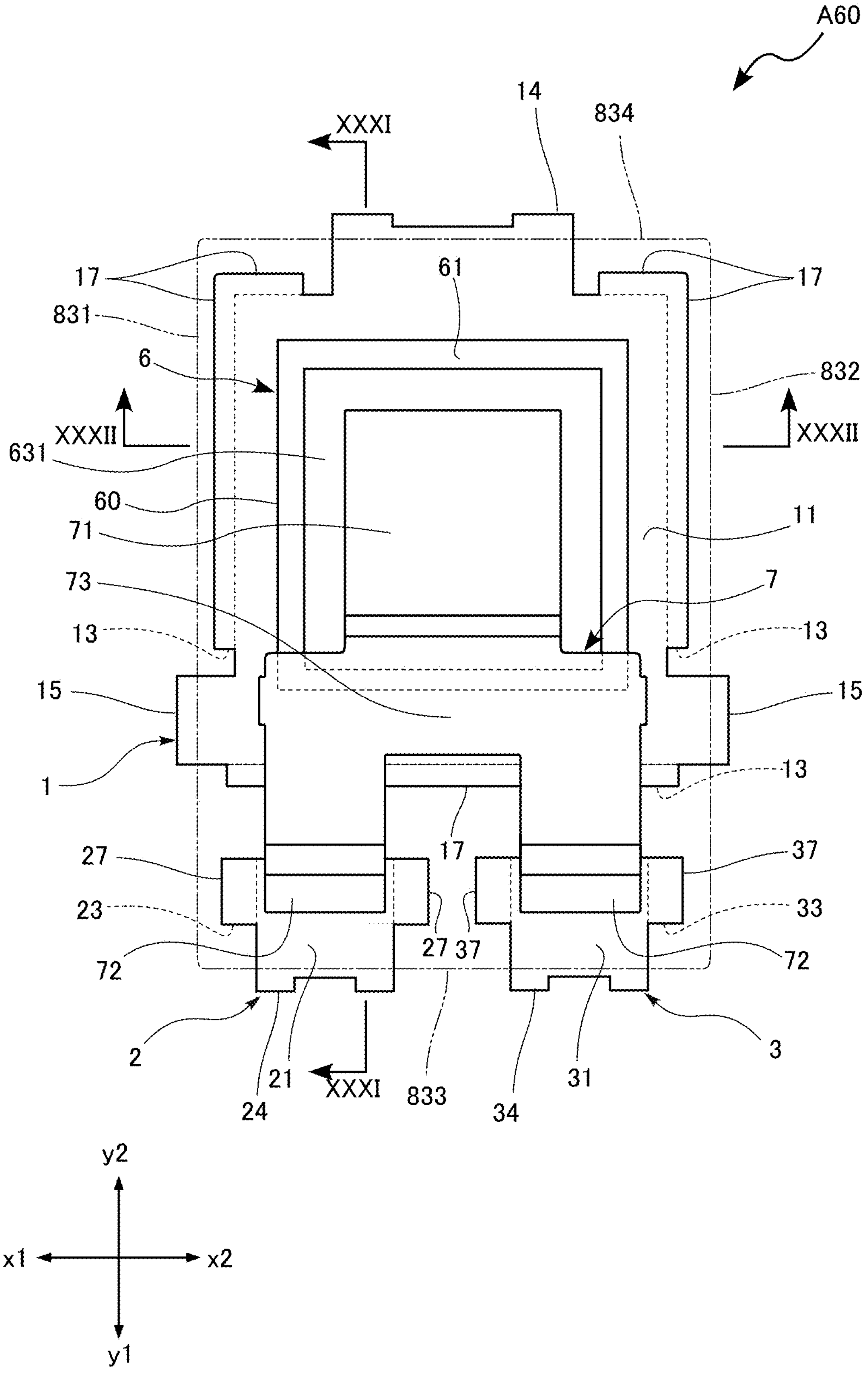
FIG. 28 is a plan view of the semiconductor device shown in FIG. 27, as seen through a sealing resin.

FIG. 27 is a perspective view of the semiconductor device A60. FIG. 28 is a plan view of the semiconductor device A60. For the convenience of understanding, FIG. 28 shows the sealing resin 8 as transparent and indicates the outlines of the sealing resin 8 by imaginary lines (double dashed lines).

Figure 29:
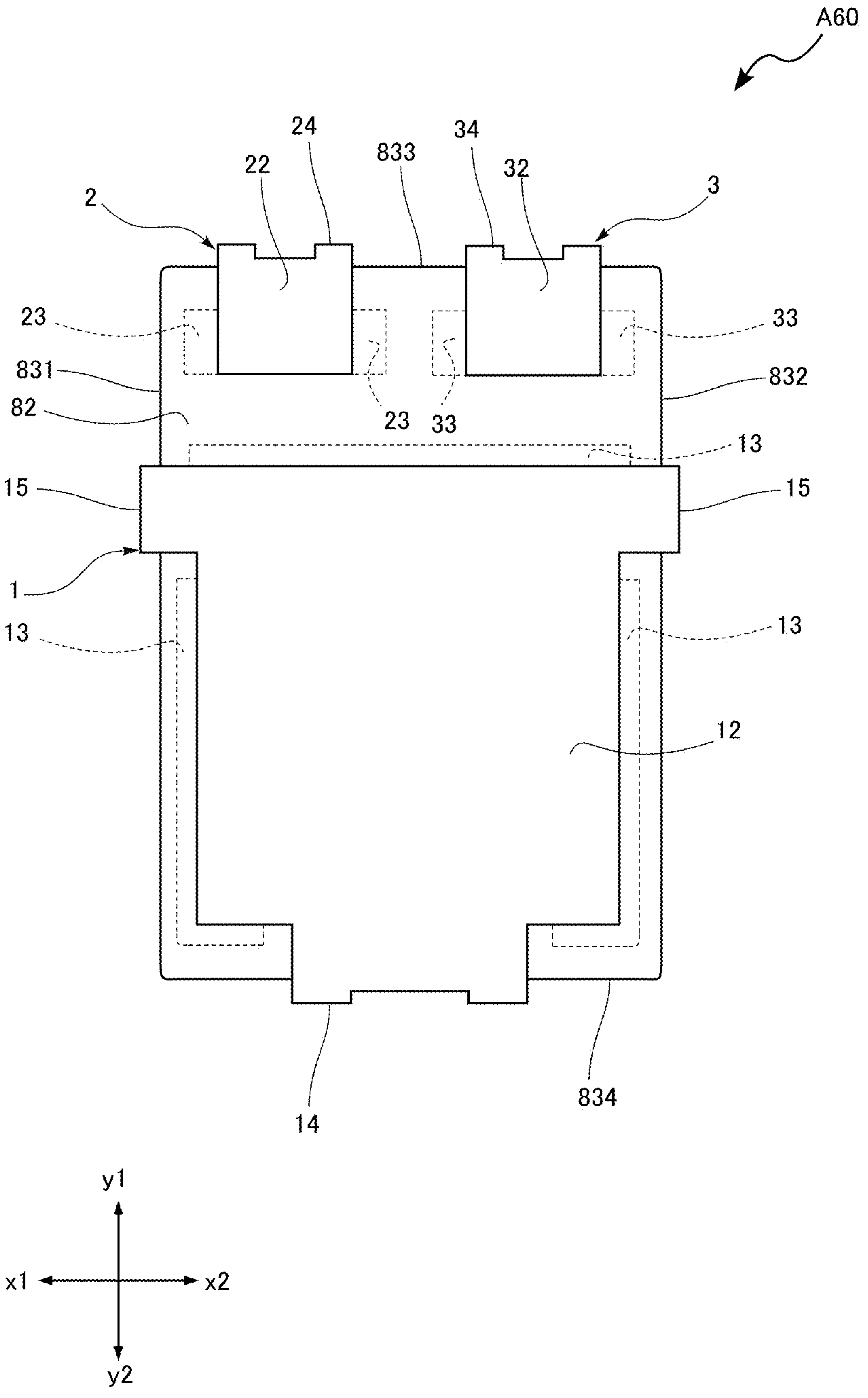
FIG. 29 is a bottom view of the semiconductor device shown in FIG. 27.
Figure 30:
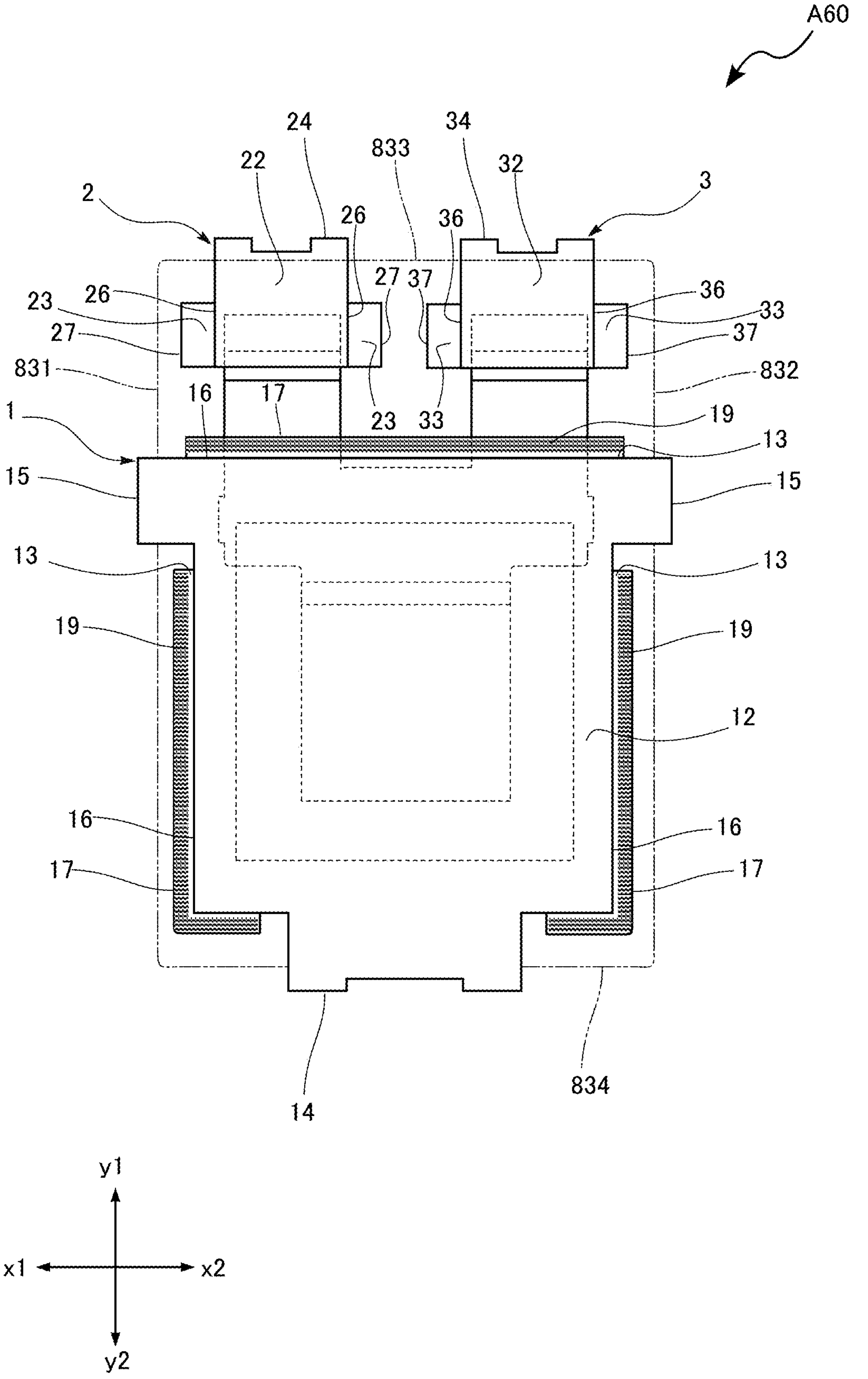
FIG. 30 is a bottom view of the semiconductor device shown in FIG. 27, as seen through the sealing resin.
Figure 31:
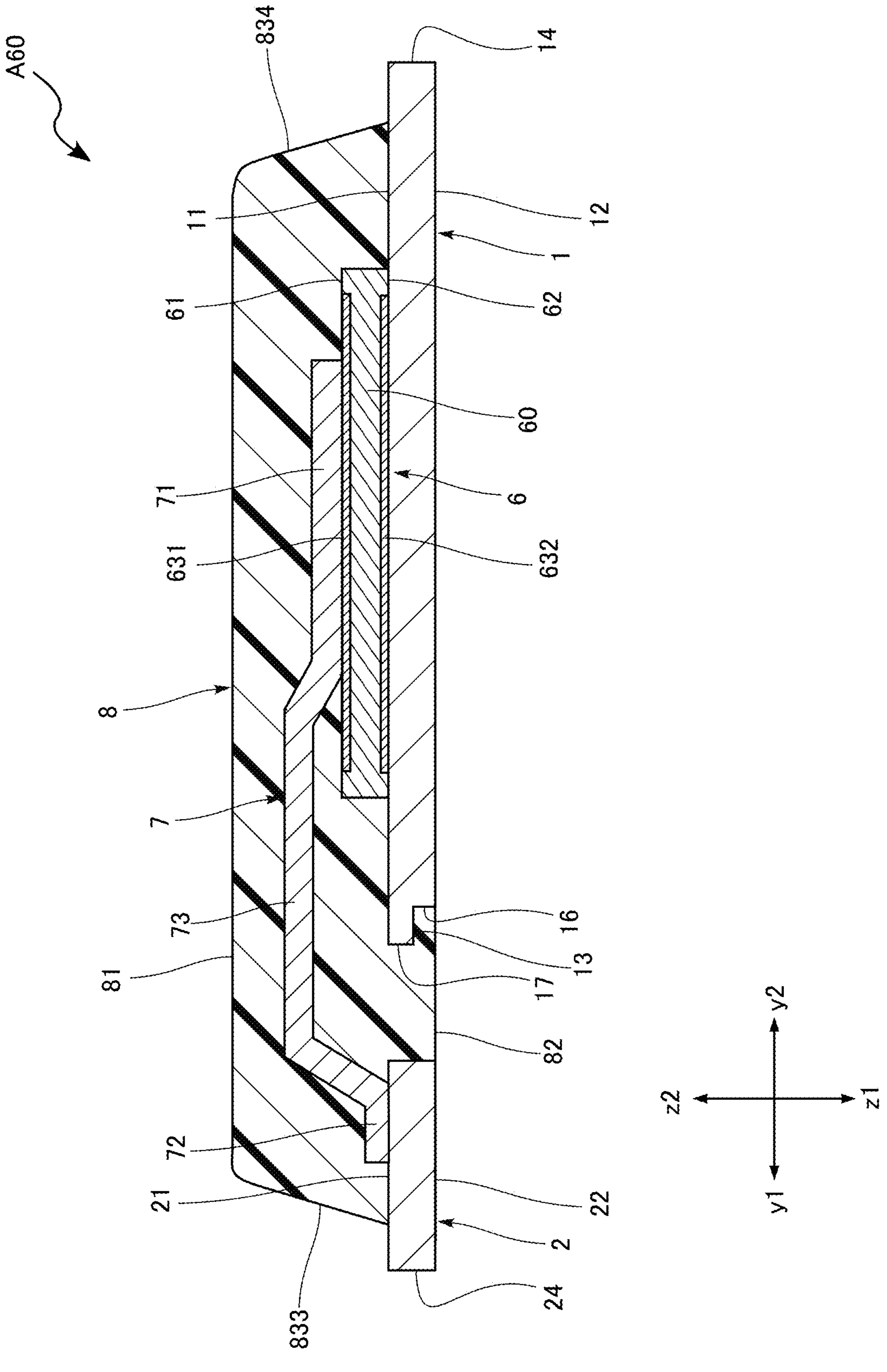
FIG. 31 is a sectional view taken along line XXXI-XXXI in FIG. 28.
Figure 32:
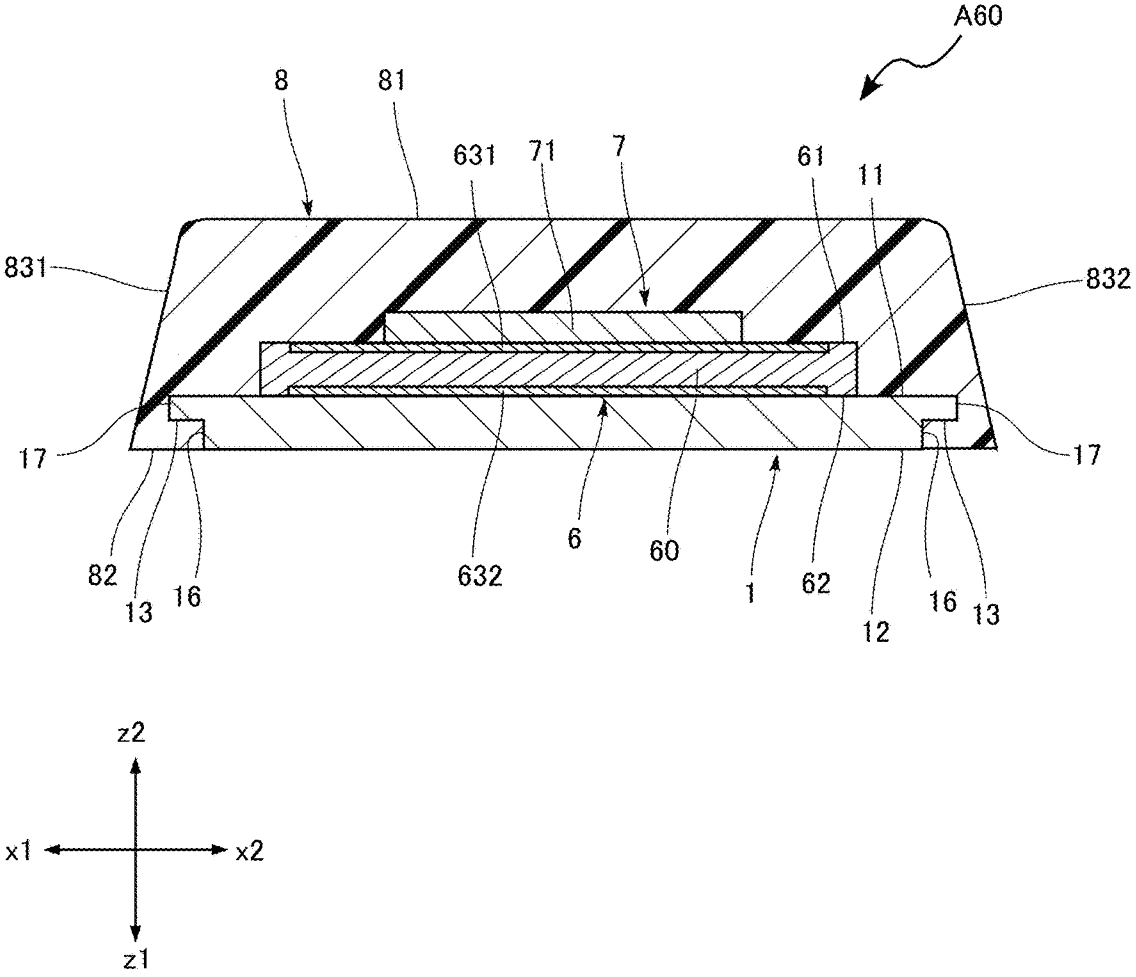
FIG. 32 is a sectional view taken along line XXXII-XXXII in FIG. 28.
Figure 33:
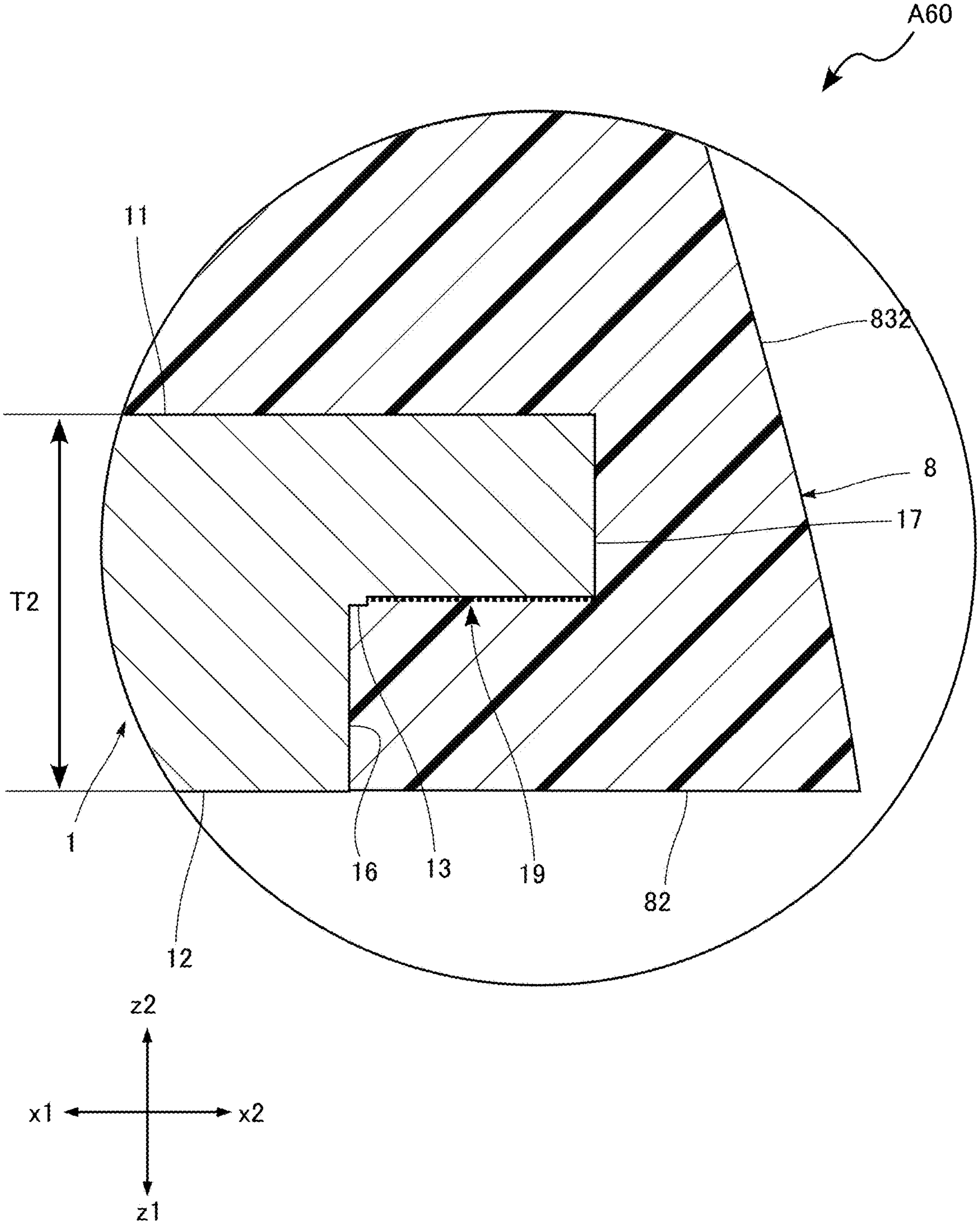
FIG. 33 is an enlarged view of a part of FIG. 32.
Figure 34:
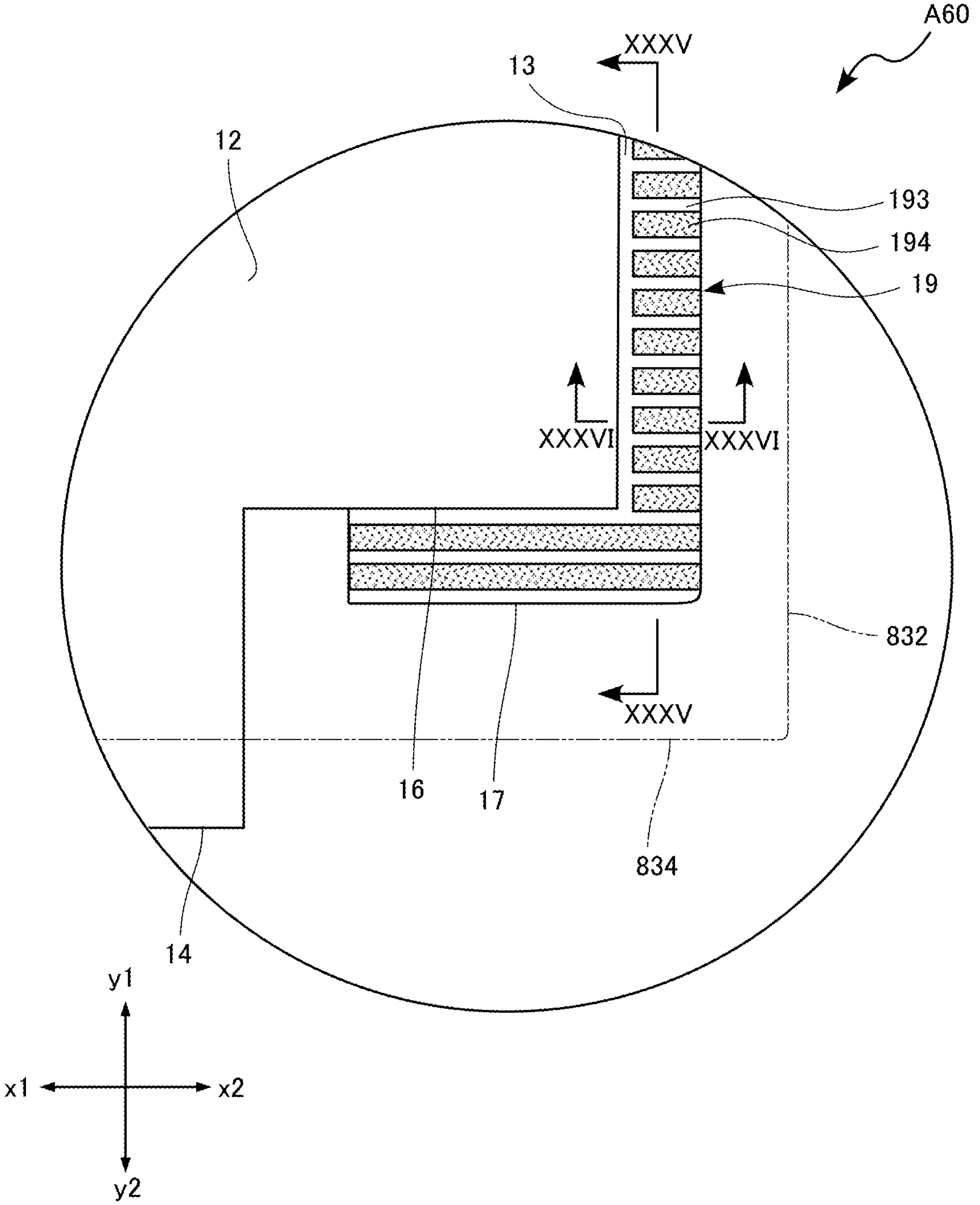
FIG. 34 is an enlarged view of a part of FIG. 30.
Figure 35:
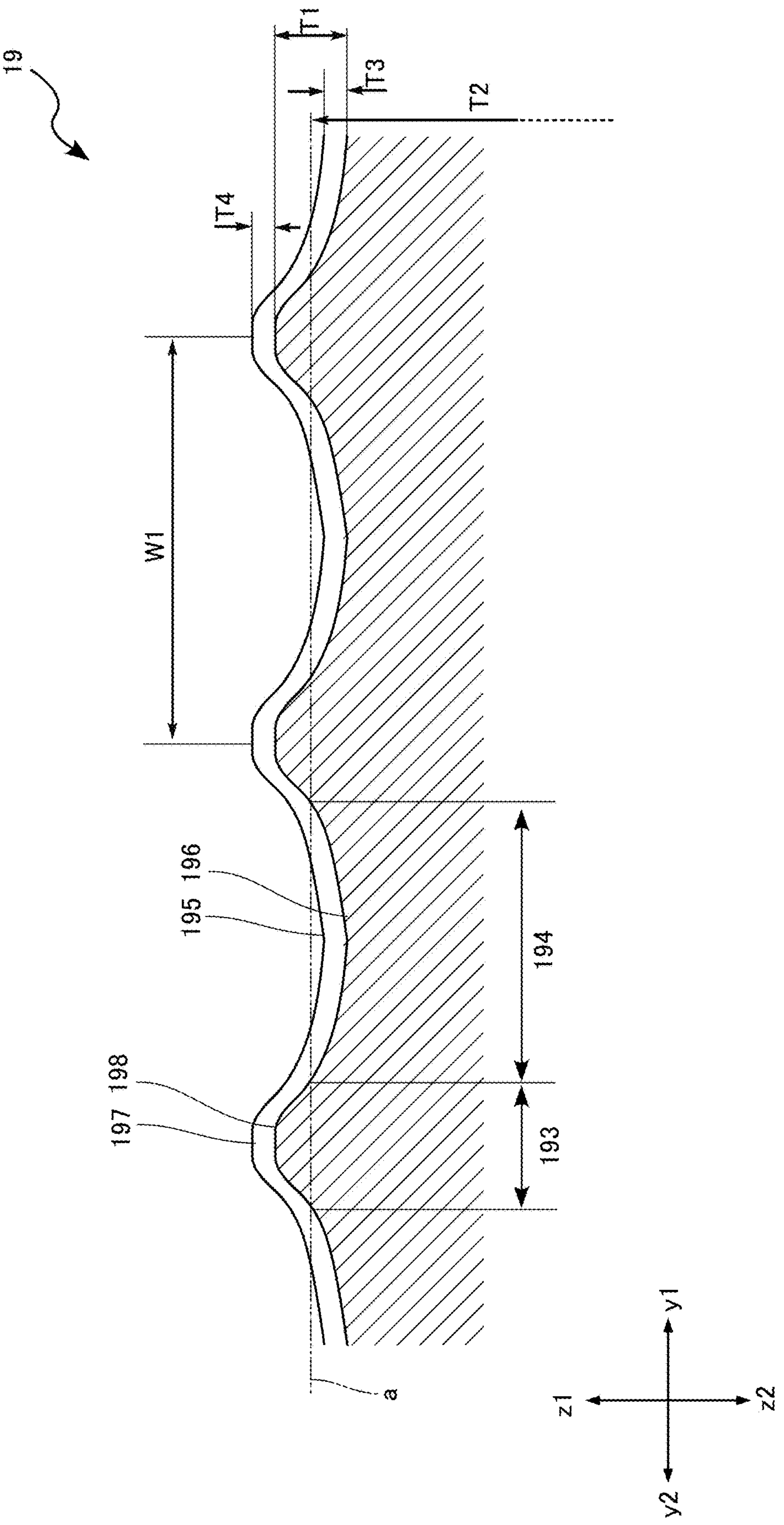
FIG. 35 is a sectional view taken along line XXXV-XXXV in FIG. 34.
Figure 36:
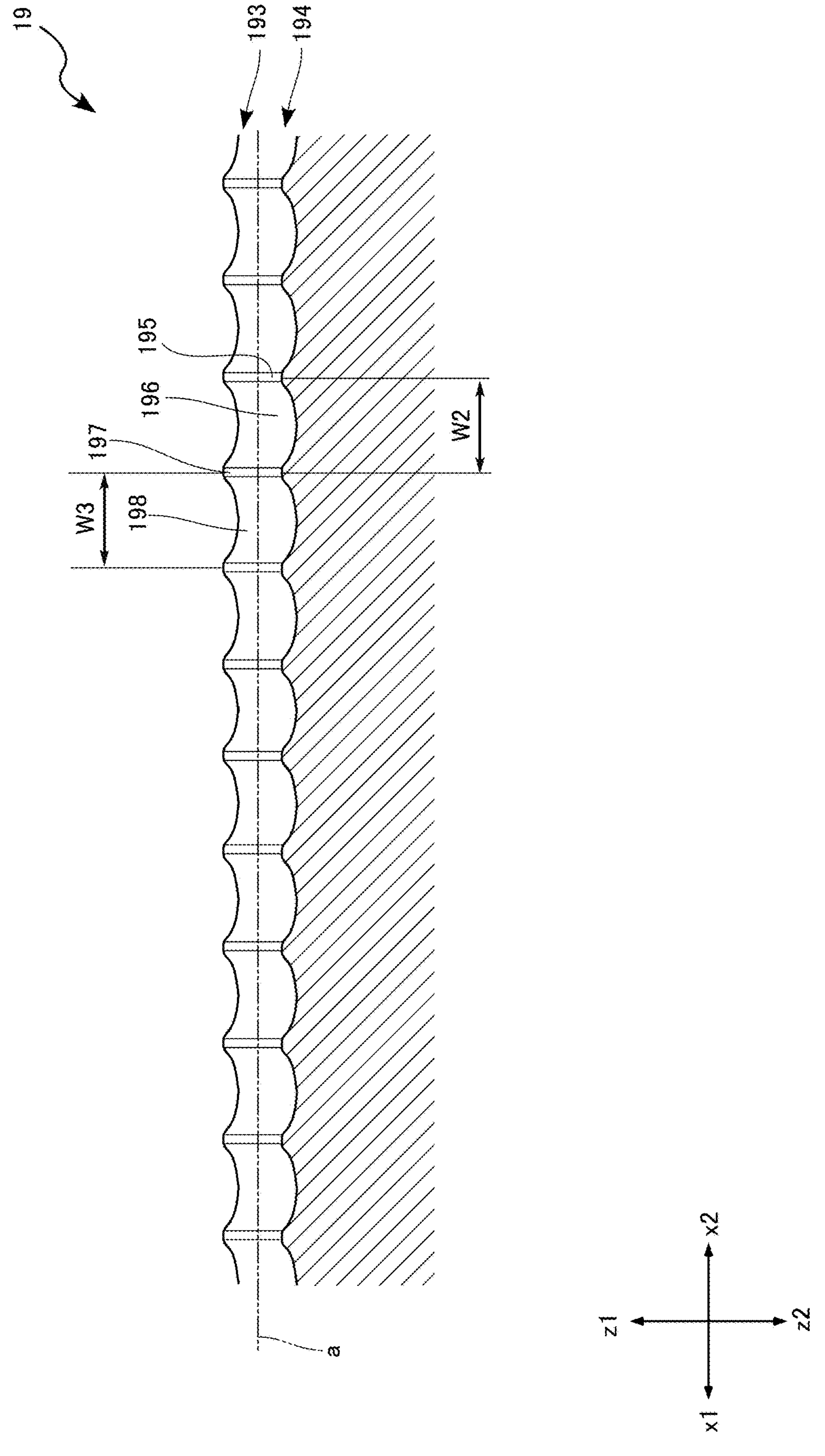
FIG. 36 is a sectional view taken along line XXXVI-XXXVI in FIG. 34.
Figure 37:
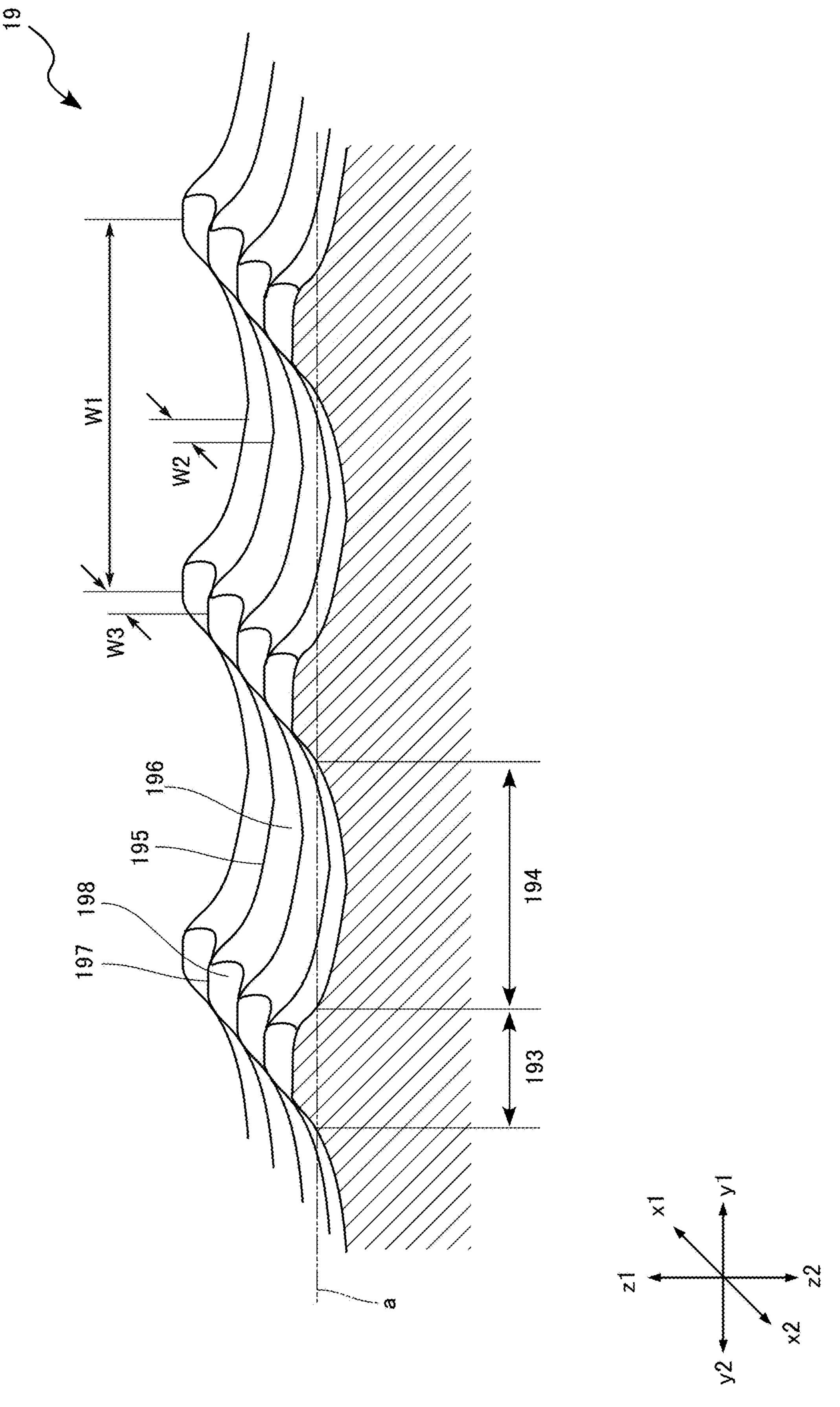
FIG. 37 is a perspective view of an irregular portion.
Figure 38:
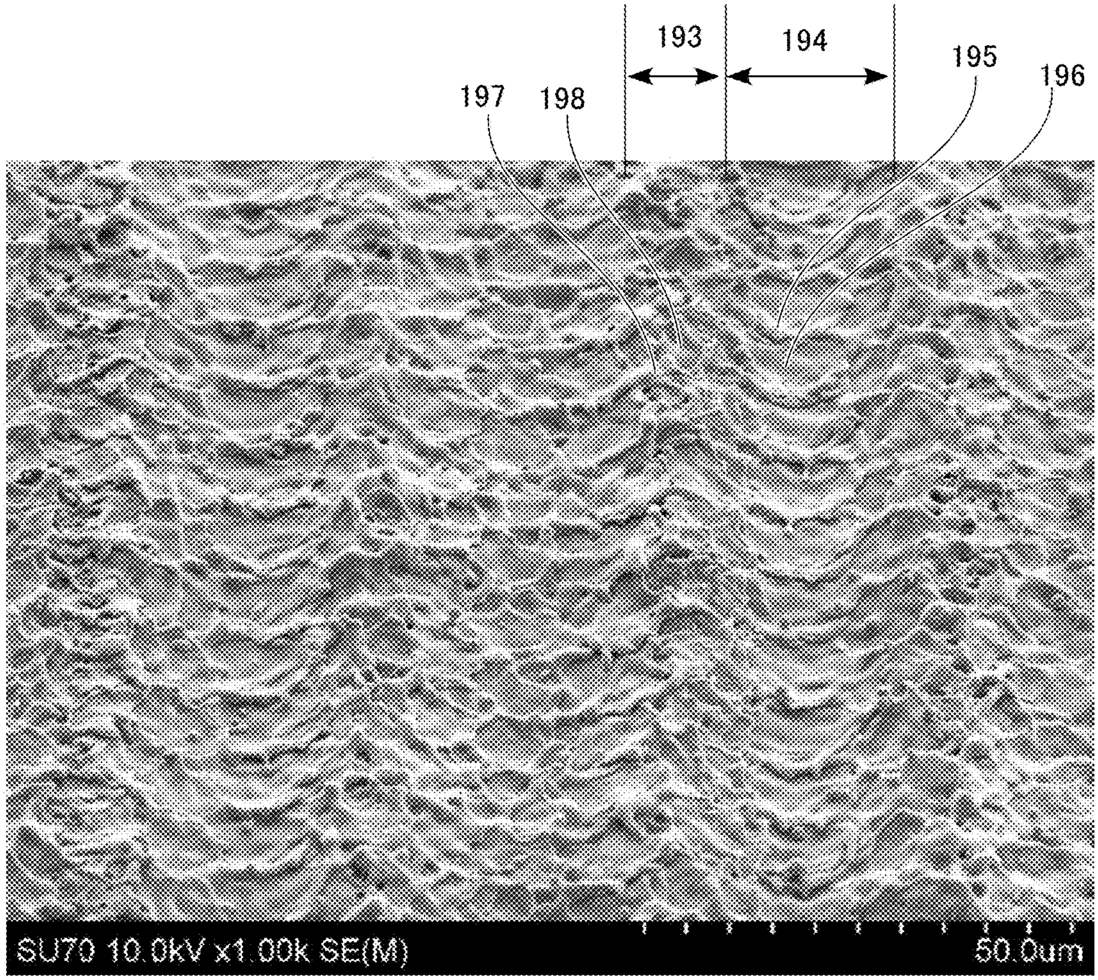
FIG. 38 is an SEM photograph of the irregular portion.
Figure 38:
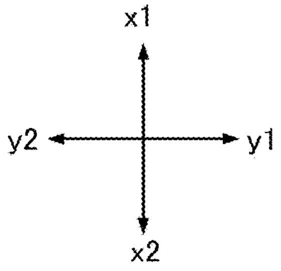

FIG. 29 is a bottom view of the semiconductor device A60. FIG. 30 is a bottom view of the semiconductor device A60. For the convenience of understanding, FIG. 30 shows the sealing resin 8 as transparent and indicates the outlines of the sealing resin 8 by imaginary lines (double dashed lines). FIG. 31 is a sectional view taken along line XXXI-XXXI in FIG. 28. FIG. 32 is a sectional view taken along line XXXII-XXXII in FIG. 28. FIG. 33 is an enlarged view of a part of FIG. 32. FIG. 34 is an enlarged view of a part of FIG. 30. FIG. 35 is a sectional view taken along line XXXV-XXXV in FIG. 34. FIG. 36 is a sectional view taken along line XXXVI-XXXVI in FIG. 34. FIG. 37 is a perspective view of the irregular portion 19. Note that FIGS. 35 to 37 schematically illustrate the shape of the irregular portion 19. FIG. 38 is an SEM photograph of the irregular portion 19 taken by using a scanning electron microscope (SEM).

The semiconductor device A60 shown in these figures is a device to be surface-mounted on a circuit board of various equipment. The use and function of the semiconductor device A60 are not limited. The package type of the semiconductor device A60 is DFN (Dual Flatpack No-leaded). Note that the package type of the semiconductor device A60 is not limited to DFN. The semiconductor device A60 is generally rectangular as viewed in the thickness direction. For the convenience of description, the thickness direction (plan-view direction) of the semiconductor device A60 is defined as a z direction, the direction (the horizontal direction in FIGS. 28 to 30) along one side of the semiconductor device A60 that is orthogonal to the z direction is defined as an x direction, and the direction (the vertical direction in FIGS. 28 to 30) orthogonal to the z direction and the x direction is defined as a y direction. One side in the z direction (the lower side in FIGS. 31 and 32) is defined as a z1 side, and the other side (the upper side in FIGS. 31 and 32) is defined as a z2 side. One side in the x direction (the left side in FIG. 28) is defined as an x1 side, and the other side (the right side in FIG. 28) is defined as an x2 side. One side in the y direction (the lower side in FIG. 28) is defined as a y1 side, and the other side (the upper side in FIG. 28) is defined as a y2 side. The z direction corresponds to the "thickness direction" in the present disclosure. The dimensions of the semiconductor device A60 are not particularly limited. In the present embodiment, the dimension in the x direction may be about 4 mm, the dimension in the y direction may be about 6 mm, and the dimension in the z direction may be about 1 mm.

The leads 1 to 3 are electrically connected to the semiconductor element 6. The leads 1 to 3 are made of a metal, and preferably made of Cu or Ni, an alloy of these, or a 42 alloy, for example. The material of the leads 1 to 3 are not limited. The leads 1 to 3 are made from a lead frame formed by subjecting a metal plate to a stamping process, for example. The thickness of the leads 1 to 3 is not particularly limited and may be 0.05 to 0.3 mm, for example. In the present embodiment, the thickness is about 0.25 mm.

As shown in FIG. 28, the lead 1 is disposed at the end of the semiconductor device A60 on the y2 side in the y direction and extends over the entirety in the x direction. The lead 2 is disposed at the corner on the y1 side in the y direction and on the x1 side in the x direction of the semiconductor device A60. The lead 3 is disposed at the corner on the y1 side in the y direction and on the x2 side in the x direction of the semiconductor device A60. The lead 2 and the lead 3 are spaced apart from the lead 1 in the y direction and spaced apart from each other in the x direction.

The lead 1 supports the semiconductor element 6 and includes an obverse surface 11, a reverse surface 12, an internal reverse surface 13, an internal connection surface 16, an internal end surface 17, and connection end surfaces 14 and 15.

The obverse surface 11 and the reverse surface 12 face away from each other in the z direction. The obverse surface 11 faces the z2 side in the z direction. The obverse surface 11 is the surface on which the semiconductor element 6 is mounted. In the present embodiment, the obverse surface 11 is generally rectangular and includes a portion protruding toward the y2 side in the y direction and portions protruding toward opposite sides in the x direction. Each of these protruding portions partially protrudes from the sealing resin 8 to be exposed. The number of such protruding portions is not limited. The reverse surface 12 is exposed from the sealing resin 8 to serve as a reverse terminal. In the present embodiment, the reverse surface 12 is generally rectangular and includes a portion protruding toward the y2 side in the y direction and portions protruding toward opposite sides in the x direction. Each of these protruding portions partially protrudes from the sealing resin 8 to be exposed. The number of such protruding portions is not limited.

The internal reverse surface 13 faces the same side as the reverse surface 12 in the z direction (the z1 side in the z direction) and is covered with the sealing resin 8. The internal reverse surface 13 is connected to the internal connection surface 16 and the internal end surface 17. In the present embodiment, as shown in FIGS. 29 and 30, the internal reverse surface 13 is formed on each of the y1 side in the y direction, the y2 side in the y direction, the x1 side in the x direction and the x2 side in the x direction of the reverse surface 12. The shape and arrangement position of the internal reverse surface 13 are not limited. Of the lead 1, the portion at which the internal reverse surface 13 is located has a thickness (the dimension in the z direction) that is smaller than and may be about a half of the thickness of the portion at which the reverse surface 12 is located, as shown in FIGS. 31 to 33. The internal reverse surface 13 is formed by a stamping process in making a lead frame from a metal plate. As shown in FIGS. 29, 31 and 32, the internal reverse surface 13 is not exposed from the sealing resin 8 and is covered with the sealing resin 8. This prevents the lead 1 from falling off from the sealing resin 8 toward the z1 side in the z direction.

As shown in FIG. 30, the internal reverse surface 13 is formed with an irregular portion 19. In the present embodiment, the irregular portion 19 is disposed over almost the entire area of the internal reverse surface 13 except the portions connected to the internal connection surface 16. The area in which the irregular portion 19 is disposed is not limited. It is preferable that the irregular portion 19 is disposed in a wide area and at least on the outer edge of the internal reverse surface 13. As will be described later, the irregular portion 19 is formed by irradiating the internal reverse surface 13 with a laser.

The irregular portion 19 includes a plurality of first protrusions 193 and a plurality of first recesses 194. As shown in FIGS. 35 to 37, each of the first protrusions 193 protrudes relative to the surrounding portions toward the side that the reverse surface 12 faces (the z1 side in the z direction). Each first protrusion 193 is the part of the irregular portion 19 that is located on the z1 side in the z direction with respect to the imaginary line a (shown by double dashed lines in FIGS. 35 to 37) indicating the average position of the irregular portion 19 in the z direction. Each of the first recesses 194 is recessed relative to the first protrusions 193 toward the side that the obverse surface 11 faces (the z2 side in the z direction). Each first recess 194 is the part of the irregular portion 19 that is located on the z2 side in the z direction with respect to the imaginary line a.

The first protrusions 193 and the first recesses 194 are formed as a result of irradiating the internal reverse surface 13 with a laser. In the present embodiment, the laser scanning direction is the x direction, and the first recesses 194 thus extend in the x direction, as shown in FIGS. 34, 37 and 38. In the present embodiment, the scanning in the x direction is repeated while moving the laser irradiation position in the y direction, whereby a plurality of first recesses 194 arranged along the y direction are formed. The first recesses 194 are dotted In FIG. 34 for the convenience of understanding. The portions of the irregular portion 19 that are located between adjacent first recesses 194 are the first protrusions 193. Therefore, the first protrusions 193 also extend in the x direction and are arranged along the y direction.

The dimension T1 of the height difference (see FIG. 35), which is the dimension from the bottom of the first recesses 194 to the top of the first protrusions 193 in the z direction, can be adjusted by adjusting the laser power. The dimension T1 is not limited, but is sufficiently small as compared with the thickness dimension T2 (the dimension from the obverse surface 11 to the reverse surface 12 in the z direction) of the lead 1 (see FIGS. 33 and 35), and is approximately equal to or greater than 1% and equal to or less than 5% of T2. In the present embodiment, the dimension T1 is about 3 μm. The dimension of the first recesses 194 in the y direction can be adjusted by adjusting the laser power and is not particularly limited. The dimension of the first protrusions 193 in the y direction can be adjusted by adjusting the laser irradiation interval and is not particularly limited.

As shown in FIGS. 35 to 38, a plurality of second protrusions 195 and a plurality of second recesses 196 are formed in each of the first recesses 194. Each of the second protrusions 195 protrudes relative to the surrounding portions toward the side that the reverse surface 12 faces (the z1 side in the z direction). Each second protrusion 195 is the part of the first recess 194 that is located on the z1 side in the z direction with respect to the average position of the first recess 194 in the z direction. Each of the second recesses 196 is recessed relative to the second protrusions 195 toward the side that the obverse surface 11 faces (the z2 side in the z direction). Each second recess 196 is the part of the first recess 194 that is located on the z2 side in the z direction with respect to the average position of the first recess 194 in the z direction. The laser for forming the irregular portion 19 is emitted as a pulsed output that periodically switches between on and off. The second recesses 196 are formed when the pulsed output is on, and the second protrusions 195 are formed when the pulsed output is off. Thus, the second protrusions 195 and the second recesses 196 are regularly arranged along the x direction. Each second recess 196 is located between adjacent second protrusions 195. The dimension T3 of the height difference (see FIG. 35), which is the dimension from the bottom of the second recesses 196 to the top of the second protrusions 195 in the z direction, can be adjusted by adjusting the laser power. The dimension T3 is not limited. In the present embodiment, the dimension T3 is smaller than the dimension T1 and is approximately equal to or less than 25% of the dimension T1. The spacing W2 (see FIGS. 36 and 37) between adjacent second protrusions 195 in the x direction can be adjusted by adjusting the pulse output frequency of the laser and the scanning speed. The spacing W2 is not limited. In the present embodiment, the spacing W2 is smaller than the spacing W1 (see FIGS. 35 and 37) between adjacent first protrusions 193 in the y direction and is approximately equal to or less than 20% of the spacing W1. In the present embodiment, the spacing W1 is about 30 μm, whereas the spacing W2 is about 5 μm.

As shown in FIGS. 35 to 38, a plurality of second protrusions 197 and a plurality of third recesses 198 are formed in each of the first protrusions 193. Each of the second protrusions 197 protrudes relative to the surrounding portions toward the side that the reverse surface 12 faces (the z1 side in the z direction). Each second protrusion 197 is the part of the first protrusion 193 that is located on the z1 side in the z direction with respect to the average position of the first protrusion 193 in the z direction. Each of the third recesses 198 is recessed relative to the second protrusions 197 toward the side that the obverse surface 11 faces (the z2 side in the z direction). Each third recess 198 is the part of the first protrusion 193 that is located on the z2 side in the z direction with respect to the average position of the first protrusion 193 in the z direction. The second protrusions 197 and the third recesses 198 are formed due to the pulsed output of the laser for forming the irregular portion 19. Thus, the second protrusions 197 and the third recesses 198 are regularly arranged along the x direction. Each third recess 198 is located between adjacent second protrusions 197. The dimension T4 of the height difference (see FIG. 35), which is the dimension from the bottom of the third recesses 198 to the top of the second protrusions 197 in the z direction, is not limited, but is smaller than the dimension T1 and approximately equal to or less than 25% of the dimension T1. The spacing W3 (see FIGS. 36 and 37) between adjacent second protrusions 197 in the x direction is approximately the same as the spacing W2. Note that the second protrusions 197 and the third recesses 198 may not be formed in each of the first protrusions 193 in such cases as where the dimension of the first protrusions 193 in the y direction is large or the laser irradiation interval is wide.

The internal connection surface 16 is generally perpendicular to the reverse surface 12 and the internal reverse surface 13 and connected to the reverse surface 12 and the internal reverse surface 13. The internal connection surface 16 is covered with the sealing resin 8. The internal end surface 17 is generally perpendicular to the obverse surface 11 and the internal reverse surface 13 and connected to the obverse surface 11 and the internal reverse surface 13. The internal end surface 17 is covered with the sealing resin 8.

The connection end surfaces 14 and 15 are perpendicular to the obverse surface 11 and the reverse surface 12 and connected to the obverse surface 11 and the reverse surface 12. The connection end surfaces 14 and 15 are exposed from the sealing resin 8. There exists one connection end surface 14, and it faces the y2 side in the y direction. The connection end surface 14 is connected to the portion of the obverse surface 11 that protrudes toward the y2 side in the y direction and the portion of the reverse surface 12 that protrudes toward the y2 side in the y direction. In the present embodiment, the connection end surface 14 is formed with a recess recessed toward the y1 side in the y direction and extending in the z direction. There exist two connection end surfaces 15, with one of the connection end surfaces 15 facing the x1 side in the x direction while the other facing the x2 side in the x direction. The connection end surface facing the x1 side in the x direction is connected to the portion of the obverse surface 11 that protrudes toward the x1 side in the x direction and the portion of the reverse surface 12 that protrudes toward the x1 side in the x direction. The connection end surface 15 facing the x2 side in the x direction is connected to the portion of the obverse surface 11 that protrudes toward the x2 side in the x direction and the portion of the reverse surface 12 that protrudes toward the x2 side in the x direction. Each of the connection end surfaces 14 and 15 is a cut surface formed by cutting a tie bar connected to a frame part of a lead frame during the cutting step of the manufacturing process.

The configuration of the lead 1 is not limited to that described above. For example, the obverse surface 11 may be formed with a groove surrounding the semiconductor element 6 for preventing the outflow of a bonding material. The connection end surface 14 may not include the recess. The connection end surfaces 14 and 15 may not protrude from the sealing resin 8 and may be flush with the relevant surfaces of the sealing resin 8. The configuration of the lead 1 is designed as appropriate depending on the use and specifications.

The lead 2 is electrically connected to the semiconductor element 6 and includes an obverse surface 21, a reverse surface 22, an internal reverse surface 23, an internal connection surface 26, an internal end surface 27, and a connection end surfaces 24.

The obverse surface 21 and the reverse surface 22 face away from each other in the z direction. The obverse surface 21 faces the same side as the obverse surface 11 of the lead 1 (the z2 side in the z direction). The obverse surface 21 is the surface to which the connection lead 7 is bonded. The obverse surface 21 is generally rectangular in the present embodiment. A portion of the obverse surface 21 on the y1 side in the y direction protrudes from the sealing resin 8 to be exposed. The reverse surface 22 faces the same side as the reverse surface 12 of the lead 1 (the z1 side in the z direction). The reverse surface 22 is exposed from the sealing resin 8 to serve as a reverse terminal. The reverse surface 22 is generally rectangular in the present embodiment. The internal reverse surface 23 faces the same side as the reverse surface 22 in the z direction (the z1 side in the z direction) and is covered with the sealing resin 8. The internal reverse surface 23 is connected to the internal connection surface 26 and the internal end surface 27. In the present embodiment, as shown in FIGS. 29 and 30, the internal reverse surface 23 is formed on each of the x1 side in the x direction and the x2 side in the x direction of the reverse surface 22. The shape and arrangement position of the internal reverse surface 23 are not limited. Of the lead 2, the portion at which the internal reverse surface 23 is located has a thickness (the dimension in the z direction) that is smaller than and may be about a half of the thickness of the portion at which the reverse surface 22 is located. The internal reverse surface 23 is formed by a stamping process in making a lead frame from a metal plate. As shown in FIG. 29, the internal reverse surface 23 is not exposed from the sealing resin 8 and is covered with the sealing resin 8. This prevents the lead 2 from falling off from the sealing resin 8 toward the z1 side in the z direction.

The internal connection surface 26 is generally perpendicular to the reverse surface 22 and the internal reverse surface 23 and connected to the reverse surface 22 and the internal reverse surface 23. The internal connection surface 26 is covered with the sealing resin 8. The internal end surface 27 is generally perpendicular to the obverse surface 21 and the internal reverse surface 23 and connected to the obverse surface 21 and the internal reverse surface 23. The internal end surface 27 is covered with the sealing resin 8.

The connection end surface 24 is perpendicular to the obverse surface 21 and the reverse surface 22 and connected to the obverse surface 21 and the reverse surface 22. The connection end surface 24 is exposed from the sealing resin 8. There exits one connection end surface 24, and it faces the y1 side in the y direction. In the present embodiment, the connection end surface 24 is formed with a recess recessed toward the y2 side in the y direction and extending in the z direction. The connection end surface 24 is a cut surface formed by cutting a tie bar connected to a frame part of a lead frame during the cutting step of the manufacturing process.

The configuration of the lead 2 is not limited to that described above. For example, the connection end surface 24 may not include the recess. The connection end surface 24 may not protrude from the sealing resin 8 and may be flush with a resin side surface 833, described later, of the sealing resin 8. The configuration of the lead 2 is designed as appropriate depending on the use and specifications.

The lead 3 is electrically connected to the semiconductor element 6 and includes an obverse surface 31, a reverse surface 32, an internal reverse surface 33, an internal connection surface 36, an internal end surface 37, and a connection end surfaces 34.

The obverse surface 31 and the reverse surface 32 face away from each other in the z direction. The obverse surface 31 faces the same side as the obverse surface 11 of the lead 1 (the z2 side in the z direction). The obverse surface 31 is the surface to which the connection lead 7 is bonded. The obverse surface 31 is generally rectangular in the present embodiment. A portion of the obverse surface 31 on the y1 side in the y direction protrudes from the sealing resin 8 to be exposed. The reverse surface 32 faces the same side as the reverse surface 12 of the lead 1 (the z1 side in the z direction). The reverse surface 32 is exposed from the sealing resin 8 to serve as a reverse terminal. The reverse surface 32 is generally rectangular in the present embodiment.

Figure 40:
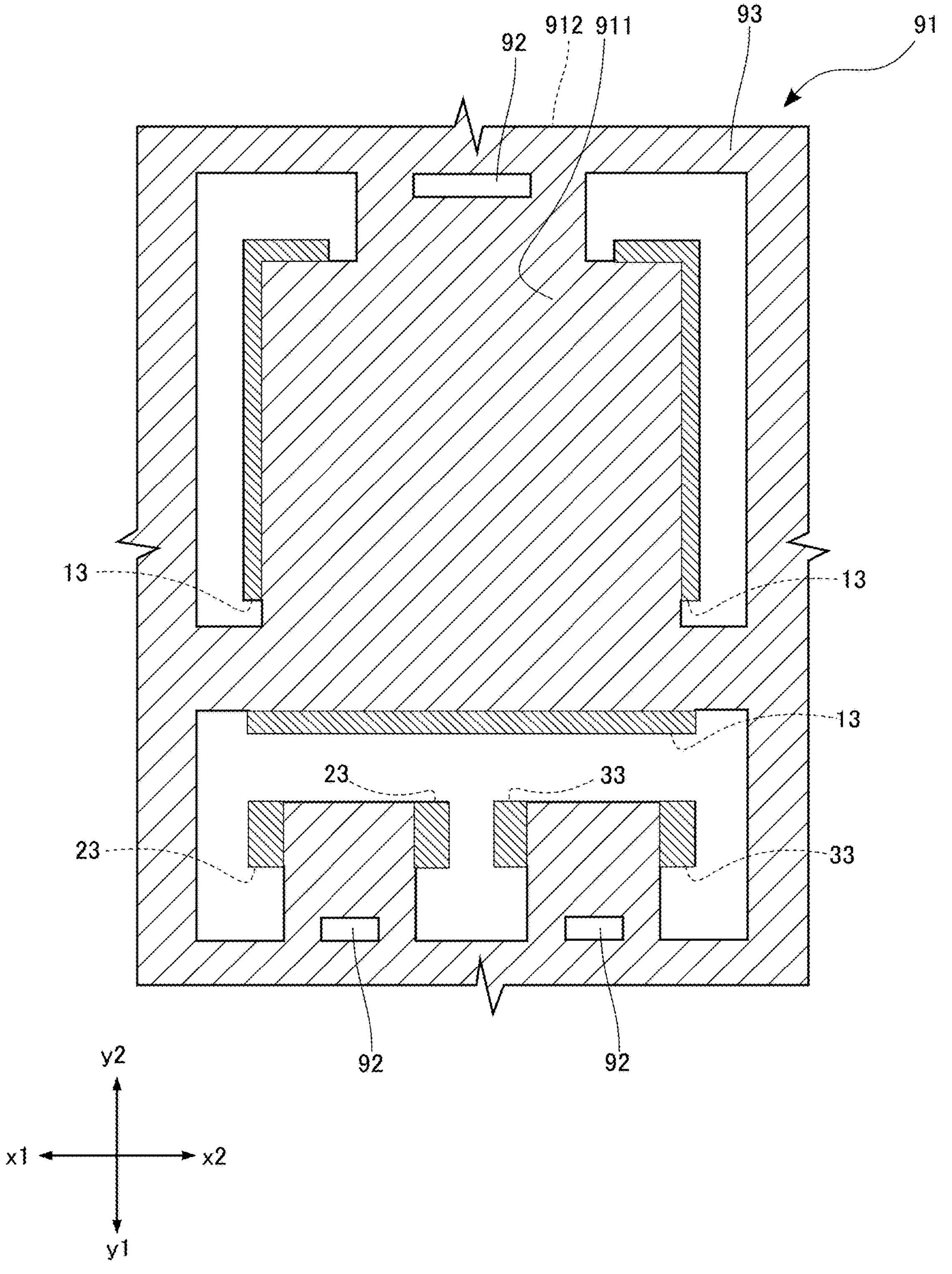
FIG. 40 is a plan view showing a step of an example of a method for manufacturing the semiconductor device shown in FIG. 27.

The internal reverse surface 33 faces the same side as the reverse surface 32 in the z direction (the z1 side in the z direction) and is covered with the sealing resin 8. The internal reverse surface 33 is connected to the internal connection surface 36 and the internal end surface 37. In the present embodiment, as shown in FIGS. 29 and 40, the internal reverse surface 33 is formed on each of the x1 side in the x direction and the x2 side in the x direction of the reverse surface 32. The shape and arrangement position of the internal reverse surface 33 are not limited. Of the lead 3, the portion at which the internal reverse surface 33 is located has a thickness (the dimension in the z direction) that is smaller than and may be about a half of the thickness of the portion at which the reverse surface 32 is located.

The internal reverse surface 33 is formed by a stamping process in making a lead frame from a metal plate. As shown in FIG. 29, the internal reverse surface 33 is not exposed from the sealing resin 8 and is covered with the sealing resin 8. This prevents the lead 3 from falling off from the sealing resin 8 toward the z1 side in the z direction.

The internal connection surface 36 is generally perpendicular to the reverse surface 32 and the internal reverse surface 33 and connected to the reverse surface 32 and the internal reverse surface 33. The internal connection surface 36 is covered with the sealing resin 8. The internal end surface 37 is generally perpendicular to the obverse surface 31 and the internal reverse surface 33 and connected to the obverse surface 31 and the internal reverse surface 33. The internal end surface 37 is covered with the sealing resin 8.

The connection end surface 34 is perpendicular to the obverse surface 31 and the reverse surface 32 and connected to the obverse surface 31 and the reverse surface 32. The connection end surface 34 is exposed from the sealing resin 8. There exits one connection end surface 34, and it faces the y1 side in the y direction. In the present embodiment, the connection end surface 34 is formed with a recess recessed toward the y2 side in the y direction and extending in the z direction. The connection end surface 34 is a cut surface formed by cutting a tie bar connected to a frame part of a lead frame during the cutting step of the manufacturing process.

The configuration of the lead 3 is not limited to that described above. For example, the connection end surface 34 may not include the recess. The connection end surface 34 may not protrude from the sealing resin 8 and may be flush with a resin side surface 833, described later, of the sealing resin 8. The configuration of the lead 3 is designed as appropriate depending on the use and specifications.

The semiconductor element 6 is an element that performs the electrical function of the semiconductor device A60. The type of the semiconductor element 6 is not particularly limited. In the present embodiment, the semiconductor element 6 is a diode. The semiconductor element 6 includes an element body 60, a first electrode 631, and a second electrode 632.

The element body 60 has the shape of a rectangular plate as viewed in the z direction. The element body 60 is made of a semiconductor material and is made of Si (silicon) in the present embodiment. The material of the element body 60 is not limited and may be other materials such as SiC (silicon carbide) or GaN (gallium nitride). The element body 60 has an element obverse surface 61 and an element reverse surface 62. The element obverse surface 61 and the element reverse surface 62 face away from each other in the z direction. The element obverse surface 61 faces the z2 side in the z direction. The element reverse surface 62 faces the z1 side in the z direction. The first electrode 631 is disposed on the element obverse surface 61. The second electrode 632 is disposed on the element reverse surface 62. In the present embodiment, the first electrode 631 is an anode electrode, and the second electrode 632 is a cathode electrode.

As shown in FIGS. 28, 31 and 32, the semiconductor element 6 is bonded substantially at the center of the obverse surface 11 of the lead 1 via a bonding material, not shown. In the present embodiment, the bonding material is a conductive bonding material and is solder, for example. The bonding material may be other conductive bonding materials such as silver paste or sintered silver. In the semiconductor element 6, the element reverse surface 62 is bonded to the obverse surface 11 of the lead 1 with a bonding material. The second electrode 632 of the semiconductor element 6 is electrically connected to the lead 1 via the bonding material. Thus, the lead 1 is electrically connected to the second electrode 632 (the anode electrode) of the semiconductor element 6 to function as an anode terminal. As shown in FIGS. 28 and 31, the first electrode 631 of the semiconductor element 6 is electrically connected to the lead 2 and the lead 3 via the connection lead 7. Thus, the lead 2 and the lead 3 are electrically connected to the first electrode 631 (the cathode electrode) of the semiconductor element 6 to function as a cathode terminal.

In the present embodiment, the dimensions in the x direction and the y direction of the semiconductor element 6 are about 3 mm and relatively large for the lead 1. The area S1 of the semiconductor element 6 as viewed in the z direction is about 75% of the area S2 of the lead 1 (the area of the obverse surface 11 of the lead 1) as viewed in the z direction. When the area S1 is equal to or greater than 70% of the area S2, the area of the lead 1 that is in contact with the sealing resin 8 is small. In such a case, the separation of the sealing resin 8 progresses to the end of the lead 1 in a relatively short period of time, and a crack can easily occur in the sealing resin 8. Moreover, the temperature of the lead 1 tends to rise due to the heat generated by the semiconductor element 6, so that separation due to thermal stress can easily occur. In the present embodiment, however, the internal reverse surface 13 includes the irregular portion 19, so that the semiconductor device A60 suppresses the separation of the sealing resin 8 at the internal reverse surface 13.

The connection lead 7 is a plate-like conductor that connects the semiconductor element 6 and the leads 2 and 3 to each other for electrical conduction. The connection lead 7 is formed by subjecting a metal plate to a stamping process or an etching process, for example. The connection lead 7 is made of a metal, and preferably made of Cu or Al, or an alloy of these, for example. The material of the connection lead 7 is not limited. The thickness of the connection lead 7 is not particularly limited and may be 0.08 to 0.3 mm, for example. In the present embodiment, the thickness is about 0.15 mm. The connection lead 7 is formed by bending a metal plate and includes an element connection portion 71, two lead connection portions 72, and a connecting portion 73.

The element connection portion 71, which is a portion connected to the semiconductor element 6, is generally parallel to the x-y plane and generally rectangular as viewed in the z direction. The element connection portion 71 is bonded, via a bonding material not shown, to the first electrode 631 disposed on the element obverse surface 61 of the semiconductor element 6. In the present embodiment, the bonding material is a conductive bonding material and is solder, for example. The bonding material is not limited.

The two lead connection portions 72, which are the portions connected to the lead 2 and the lead 3, are generally parallel to the x-y plane and have a rectangular shape elongated in the x direction as viewed in the z direction. Each of the lead connection portion 72 is bonded to the obverse surface 21 of the lead 2 or the obverse surface 31 of the lead 3 via a bonding material, not shown. In the present embodiment, the bonding material is a conductive bonding material and is solder, for example. The bonding material is not limited.

The connecting portion 73 connects the element connection portion 71 and the two lead connection portions 72 to each other. The connecting portion 73 is connected to the element connection portion 71 at its end on the y2 side in the y direction. The end on the y1 side in the y direction of the connecting portion 73 is separated into two sections, which are connected to different lead connection portions 72. The configuration of the connection lead 7 is not limited.

Instead of the connection lead 7, other connecting members, such as bonding wires, may be used to connect the first electrode 631 of the semiconductor element 6 and the leads 2 and 3.

The sealing resin 8 covers a part of each of the leads 1, 2 and 3 and the entirety of the semiconductor element 6 and the connection lead 7. The sealing resin 8 is made of black epoxy resin, for example. The material of the sealing resin 8 is not limited. The sealing resin 8 is formed by transfer molding using a mold, for example. The method for forming the sealing resin 8 is not limited.

The sealing resin 8 includes a resin obverse surface 81, a resin reverse surface 82, and four resin side surfaces 83. The resin obverse surface 81 and the resin reverse surface 82 face away from each other in the z direction. The resin obverse surface 81 faces the z2 side in the z direction, and the resin reverse surface 82 faces the z1 side in the z direction.

Each of the four resin side surfaces 83 is connected to the resin obverse surface 81 and the resin reverse surface 82. Each resin side surface 83 faces outward in the x direction or the y direction. The four resin side surfaces 83 include a resin side surface 831, a resin side surface 832, a resin side surface 833, and a resin side surface 834. The resin side surface 831 and the resin side surface 832 face away from each other in the x direction. The resin side surface 831 is located on the x1 side in the x direction and faces the x1 side in the x direction. The resin side surface 832 is located on the x2 side in the x direction and faces the x2 side in the x direction. The resin side surface 833 and the resin side surface 834 face away from each other in the y direction. The resin side surface 833 is located on the y1 side in the y direction and faces the y1 side in the y direction. The resin side surface 834 is located on the y2 side in the y direction and faces the y2 side in the y direction. The four resin side surfaces 83 are inclined such that they come closer to each other as proceeding toward the resin obverse surface 81. That is, the sealing resin 8 is tapered such that its cross sectional area in the x-y plane decreases toward the resin obverse surface 81. Note that the shape of the sealing resin 8 shown in FIGS. 27 to 32 is an example. The shape of the sealing resin is not limited to the illustrated one.

As shown in FIGS. 29, 31 and 32, the reverse surface 12 of the lead 1, the reverse surface 22 of the lead 2, and the reverse surface 32 of the lead 3 are exposed from the resin reverse surface 82 of the sealing resin 8 and flush with the resin reverse surface 82. The connection end surface 15 of the lead 1 that faces the x1 side in the x direction is exposed from the resin side surface 831. The connection end surface of the lead 2 that faces the x2 side in the x direction is exposed from the resin side surface 832. The connection end surface 14 of the lead 1 is exposed from the resin side surface 834. The connection end surface 24 of the lead 2 and the connection end surface 34 of the lead 3 are exposed from the resin side surface 833.

An example of a method for manufacturing the semiconductor device A60 is described below with reference to FIGS. 39 to 44.

Figure 39:
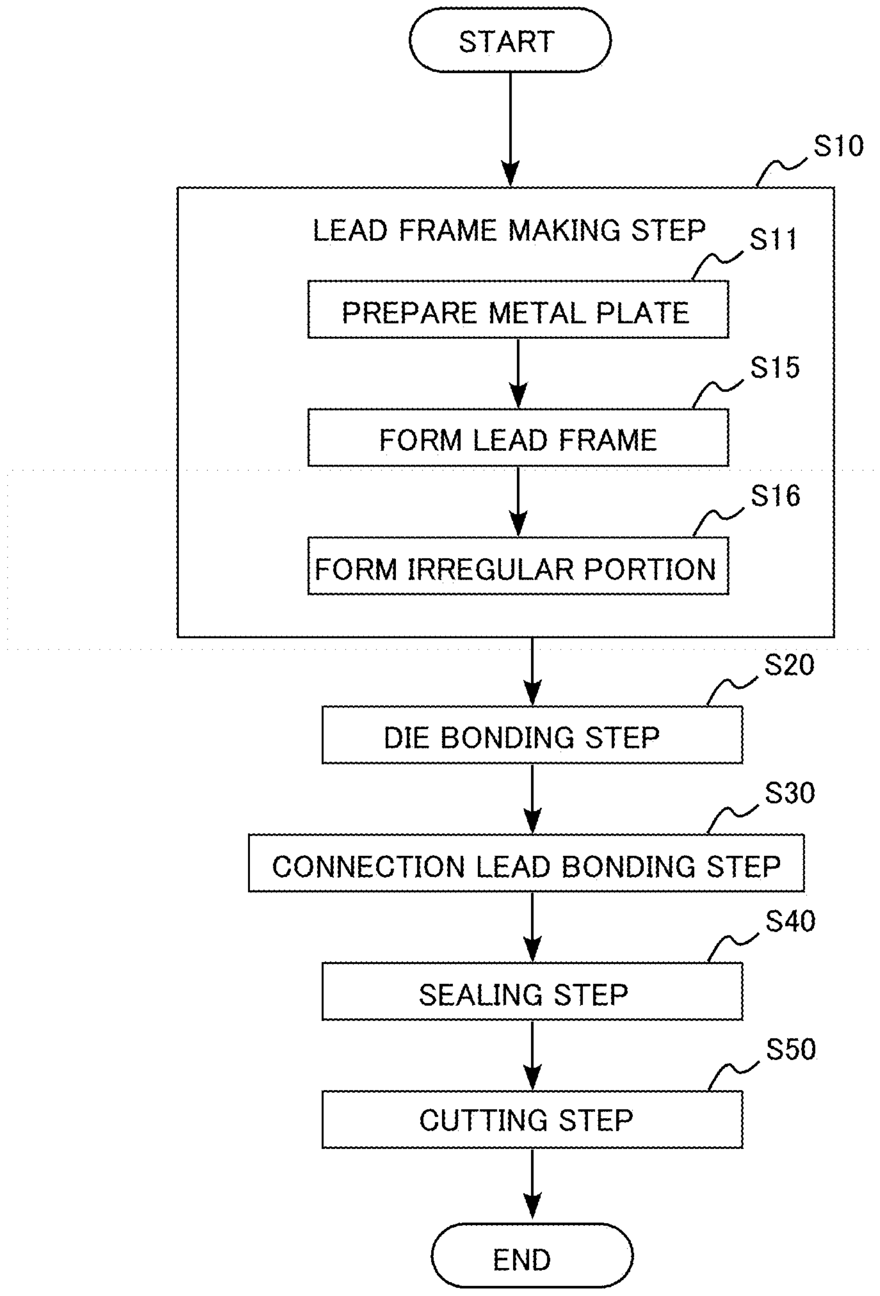
FIG. 39 is a flow chart of an example of a method for manufacturing the semiconductor device shown in FIG. 27.
Figure 41:
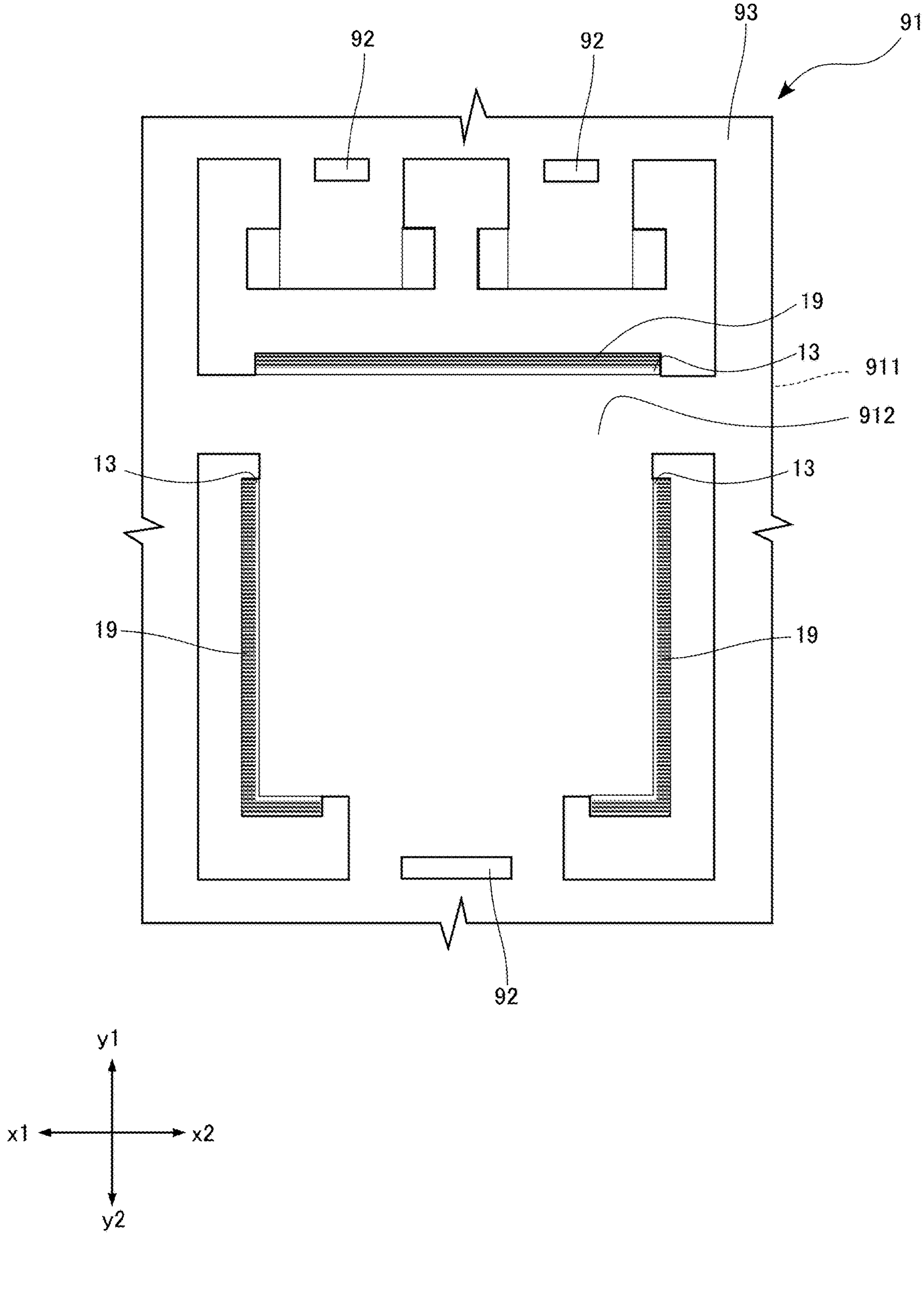
FIG. 41 is a bottom view showing a step of an example of a method for manufacturing the semiconductor device shown in FIG. 27.

FIG. 39 is a flow chart of an example of a method for manufacturing the semiconductor device A60. FIGS. 40 to 44 show steps of an example of a method for manufacturing the semiconductor device A60. FIGS. 40 and 42 to 44 are plan views corresponding to FIG. 28. FIG. 41 is a bottom view corresponding to FIG. 30. Note that the x direction, the y direction, and the z direction in FIGS. 40 to 44 are the same directions as those in FIGS. 27 to 37.

As shown in FIG. 39, the method for manufacturing the semiconductor device A60 includes a lead frame making step S10, a die bonding step S20, a connection lead bonding step S30, a sealing step S40, and a cutting step S50.

The lead frame making step S10 is a step for making a lead frame from a metal plate. In this step, a metal plate, which is a material of the lead frame, is first prepared (S11). The metal plate has an obverse surface and a reverse surface that face away from each other in the z direction.

Next, the metal plate is subjected to a stamping process to form the lead frame 91 as shown in FIG. 40 (S15). Note that the lead frame 91 is hatched in FIG. 40. The lead frame 91 has an obverse surface 911 and a reverse surface 912 that face away from each other in the z direction. The obverse surface 911 of the lead frame 91 will become the obverse surface 11 of the lead 1, the obverse surface 21 of the lead 2, and the obverse surface 31 of the lead 3. The reverse surface 912 of the lead frame 91 will become the reverse surface 12 of the lead 1, the reverse surface 22 of the lead 2, and the reverse surface 32 of the lead 3. Of the obverse surface 911, the region to which relatively dense hatching is applied is the region having a smaller thickness (the dimension in the z direction). The surface of this thin region that faces the reverse surface 912 side (the z1 side in the z direction) is located closer to the obverse surface 911 than is the reverse surface 912 in the z direction and will become the internal reverse surface 13 of the lead 1, the internal reverse surface 23 of the lead 2, and the internal reverse surface 33 of the lead 3. Through-holes 92 are formed at the locations at which the connection end surface 14 of the lead 1, the connection end surface 24 of the lead 2, and the connection end surface 34 of the lead 3 are will be formed. In the lead frame 91, a plurality of sections each of which will become a semiconductor device A60 are connected to a frame part 93. Only one of such sections that will become a single semiconductor device A60 is shown in FIG. 40 (and in FIGS. 41 and 44 as well).

Next, as shown in FIG. 41, an irregular portion 19 is formed by irradiating the region of the lead frame 91 that will become the internal reverse surface 13 with a laser (S16). The wavelength of the laser is not limited, but is about 200 to 2000 nm, for example, and is 355 nm in the present embodiment. The laser power is adjustable and is not limited, but is about 1 to 50 W, for example, and is 2 W in the present embodiment. In the present embodiment, the laser is scanned in the x direction to form a first recess 194 extending in the x direction. Also, by forming a plurality of first recesses 194 while moving the laser irradiation position in the y direction, first protrusions 193 each extending in the x direction are formed between adjacent first recesses 194.

The laser to form the irregular portion 19 is emitted as a pulsed output. The pulse output frequency is adjustable and is not limited, but is about 10 to 100 kHz, for example, and is 40 kHz in the present embodiment. The scanning speed of the laser is adjustable and is not limited, but is about 100 to 500 mm/s, for example, and is 200 mm/s in the present embodiment. In each of the first recess 194 are formed a plurality of second protrusions 195 arranged along the x-direction at intervals corresponding to the pulse output frequency and the scanning speed of the laser, and the portions between adjacent second protrusions 195 are the second recesses 196. Also, in each of the first protrusions 193 are formed a plurality of second protrusions 197 arranged along the x direction at intervals corresponding to the pulse output frequency and the scanning speed of the laser, and the portions between adjacent second protrusions 197 are the third recesses 198.

Figure 42:
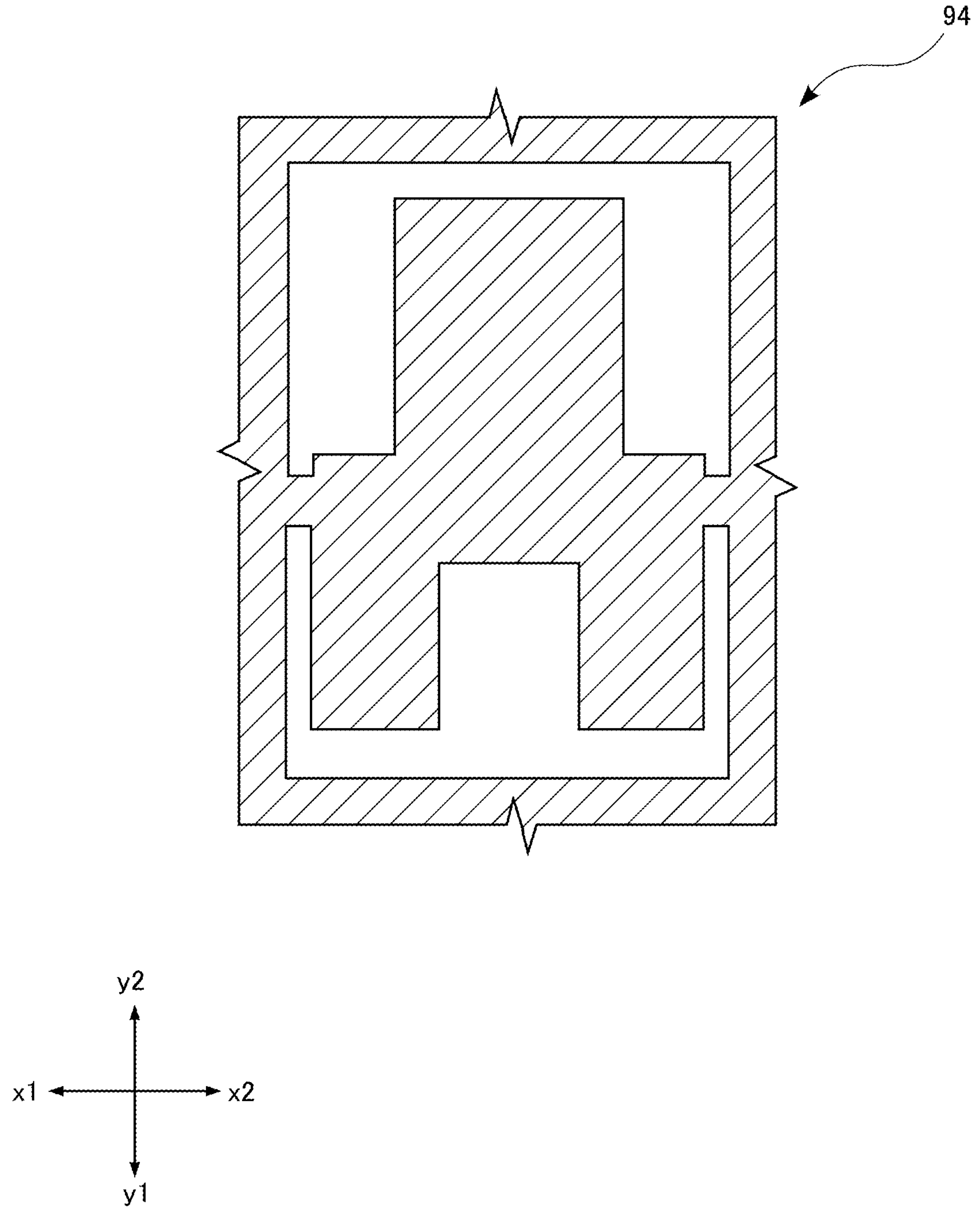
FIG. 42 is a plan view showing a step of an example of a method for manufacturing the semiconductor device shown in FIG. 27.
Figure 43:
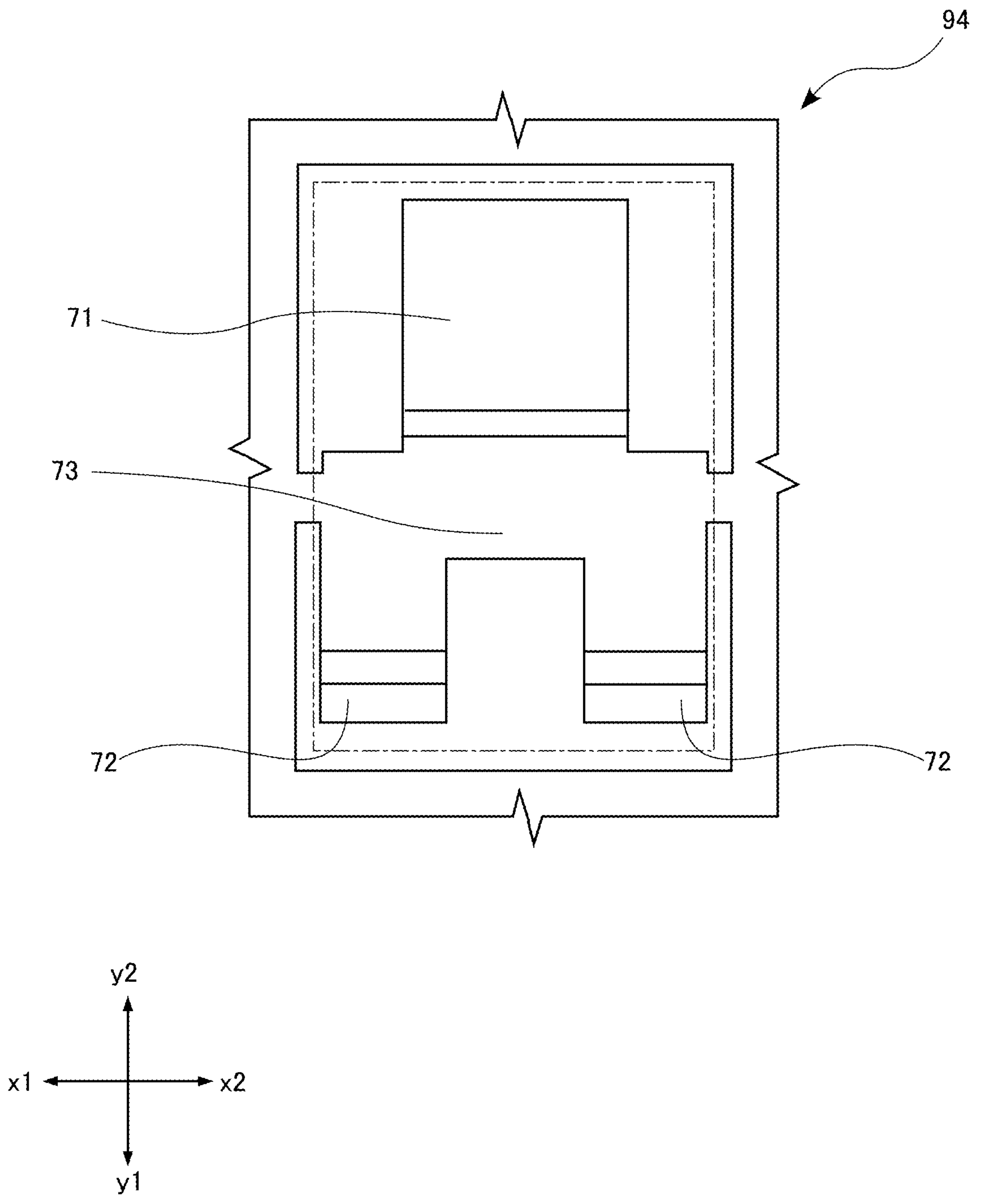
FIG. 43 is a plan view showing a step of an example of a method for manufacturing the semiconductor device shown in FIG. 27.

Meanwhile, another lead frame 94 is prepared separately from the lead frame 91, as shown in FIG. 42. The lead frame 94 is hatched in FIG. 42. The lead frame 94 is a plate-like material that will become the connection lead 7. Only a section that will become a single connection lead 7 is shown in FIG. 42 (and in FIG. 43 as well). The lead frame 94 is formed by subjecting a metal plate to a stamping process or an etching process, for example. Next, as shown in FIG. 43, the lead frame 94 is subjected to a bending process, whereby the element connection portion 71, two lead connection portions 72 and the connecting portion 73 are formed. The lead frame 94 is then cut along cutting lines (indicated by single dashed lines in FIG. 43), whereby the connection lead 7 is provided.

The die bonding step S20 is a step for bonding the semiconductor element 6 to the lead frame 91. In this step, solder paste is applied to the center of a region of the obverse surface 911 of the lead frame 91 that will become the obverse surface 11 of the lead 1. Next, the semiconductor element 6 is placed on the solder paste applied. Next, reflowing is performed to melt and then solidify the solder paste. Through the above process, the semiconductor element 6 is bonded to the lead frame 91. The method for bonding the semiconductor elements 6 in the die bonding step S20 is not limited.

Figure 44:
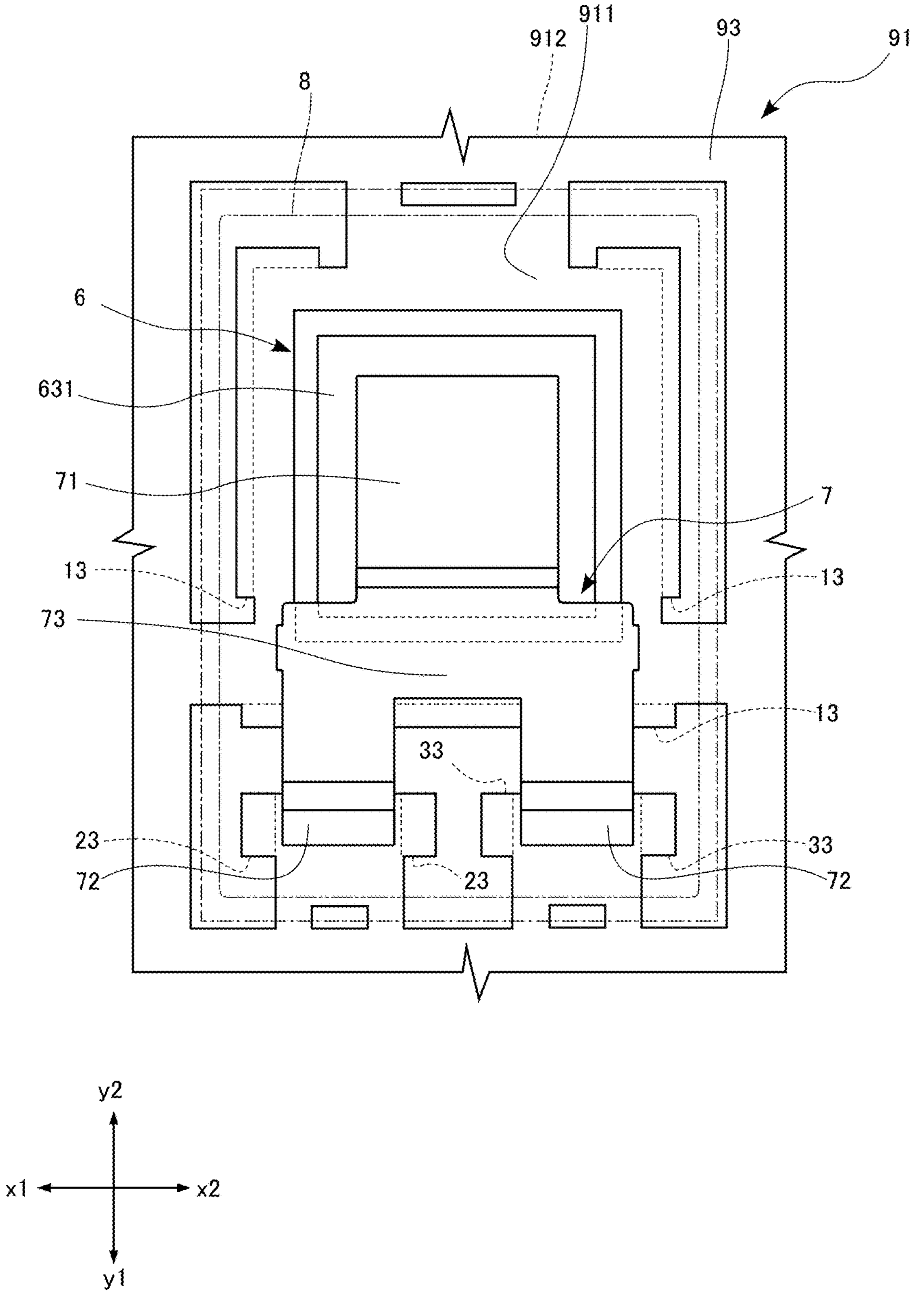
FIG. 44 is a plan view showing a step of an example of a method for manufacturing the semiconductor device shown in FIG. 27.

The connection lead bonding step S30 is a step for bonding the connection lead 7 as shown in FIG. 44. In this step, solder paste is applied to the first electrode 631 of the element obverse surface 61 of the semiconductor element 6. Solder paste is also applied to the obverse surface 911 of the lead frame 91 at a region that will become the obverse surface 21 of the lead 2 and a region that will become the obverse surface 31 of the lead 3. Next, the connection lead 7 is placed on the semiconductor element 6 and the lead frame 91. The element connection portion 71 of the connection lead 7 is placed on the solder paste applied to the first electrode 631 of the semiconductor element 6. One of the lead connection portions 72 of the connection lead 7 is placed on the solder paste applied to the region that will become the obverse surface 21 of the lead 2, and the other lead connection portion 72 is placed on the solder paste applied to the region that will become the obverse surface 31 of the lead 3. Next, reflowing is performed to melt and then solidify the solder paste. In this way, with solder, the element connection portion 71 and the first electrode 631 are bonded together, one of the lead connection portions 72 and the region that will become the obverse surface 21 of the lead 2 are bonded together, and the other lead connection portion 72 and the region that will become the obverse surface 31 of the lead 3 are bonded together. The method for bonding the connection lead 7 in the connection lead bonding step S30 is not limited.

The sealing step S40 is a step for forming the sealing resin 8. In this step, a resin material is hardened to form the sealing resin 8 (indicated by double dashed lines in FIG. 44) that covers the semiconductor element 6, the connection lead 7 and a portion of the lead frame 91. This step is performed by a known transfer molding technique using a mold, for example. Specifically, the lead frame 91, to which the semiconductor element 6 and the connection lead 7 are bonded, are set in a molding machine. Next, a fluidized resin material is loaded into a cavity in the mold and is then molded. Next, the resin material is hardened. Through the above process, the sealing resin 8 is provided. By setting the lead frame 91 with the reverse surface 912 in contact with the mold, the reverse surface 912 of the lead frame 91 is exposed from the sealing resin 8. Also, such setting makes the reverse surface 912 of the lead frame 91 and the resin reverse surface 82 of the sealing resin 8 be flush with each other. Since the resin material flows into the space between the mold and the internal reverse surfaces 13, 23 and 33, the internal reverse surfaces 13, 23 and 33 are covered with the sealing resin 8. The method for forming the sealing resin 8 in the sealing step S40 is not limited.

The cutting step S50 is a step for cutting the lead frame 91. In this step, the lead frame 91 is cut along cutting lines (indicated by single dashed lines in FIG. 44) into individual pieces. Thus, an individual piece corresponding to the semiconductor device A60 is obtained. When cut, the lead frame 91 becomes the lead 1, the lead 2 and the lead 3. The cut surfaces formed in this process are the connection end surfaces 14 and 15 of the lead 1, the connection end surface 24 of the lead 2, and the connection end surface 34 of the lead 3. The through-holes 92 become the recesses of the connection end surface 14, the connection end surface 24 and the connection end surface 34. The cutting method in the cutting step S50 is not limited. Through the above process, the semiconductor device A60 described above is obtained.

The effects of the semiconductor device A60 are described below.

According to the present embodiment, the internal reverse surface 13 of the lead 1 is formed with the irregular portion 19. The irregular portion 19 includes a plurality of first protrusions 193 and a plurality of first recesses 194. The contact area between the internal reverse surface 13 and the sealing resin 8 is increased as compared with the case where the irregular portion 19 is not formed, whereby adhesion of the sealing resin 8 to the internal reverse surface 13 is enhanced. Thus, the semiconductor device A60 is capable of suppressing the separation of the sealing resin 8 at the internal reverse surface 13.

In the present embodiment, each of the first recesses 194 is formed with a plurality of second protrusions 195 and a plurality of second recesses 196. The contact area between the internal reverse surface 13 and the sealing resin 8 is increased as compared with the case where each first recess 194 is not formed with the second protrusions 195 and the second recesses 196, whereby adhesion of the sealing resin 8 to the internal reverse surface 13 is enhanced. Thus, the semiconductor device A60 is capable of suppressing the separation of the sealing resin 8 at the internal reverse surface 13. Because irregularities arranged along the y direction and irregularities arranged along the x direction are both formed, separation of the sealing resin 8 at the internal reverse surface 13 is suppressed for both the thermal stress generated in the x direction and the thermal stress generated in the y direction.

In the present embodiment, each of the first protrusions 193 is formed with a plurality of second protrusions 197 and a plurality of third recesses 198. The contact area between the internal reverse surface 13 and the sealing resin 8 is increased as compared with the case where each first protrusion 193 is not formed with the second protrusions 197 and the third recesses 198, whereby adhesion of the sealing resin 8 to the internal reverse surface 13 is enhanced. Thus, the semiconductor device A60 is capable of suppressing the separation of the sealing resin 8 at the internal reverse surface 13. Because irregularities arranged along the y direction and irregularities arranged along the x direction are both formed, separation of the sealing resin 8 at the internal reverse surface 13 is suppressed for both the thermal stress generated in the x direction and the thermal stress generated in the y direction.

In the present embodiment, all laser scanning directions are the x direction. Thus, the laser irradiation process can be simplified as compared with the case where the laser scanning direction changes.

In the present embodiment, the irregular portion 19 is formed by irradiating the internal reverse surface 13 with a pulsed laser. This makes it possible to form the second protrusions 195 and the second recesses 196 in the first recesses 194 and form the second protrusions 197 and the third recesses 198 in the first protrusions 193 while forming the first recesses 194 and the first protrusions 193.

Because the irregular portion 19 is formed by laser irradiation in the present embodiment, it is possible to form more minute irregularities in a regularly arranged manner as compared with the case where irregularities are formed in the internal reverse surface 13 by other techniques. The dimensions of the irregularities (the dimensions T1, T3, T4 and the spacings W1, W2, etc.) can be adjusted by adjusting the laser power, the pulse output frequency, the scanning speed, etc.

FIGS. 45 to 51 show variations of the irregular portion 19 according to the sixth embodiment. In these figures, the elements that are identical or similar to those of the above-described embodiments are denoted by the same reference signs as those used for the above-described embodiments, and the description thereof is omitted.

[First Variation]

Figure 45:
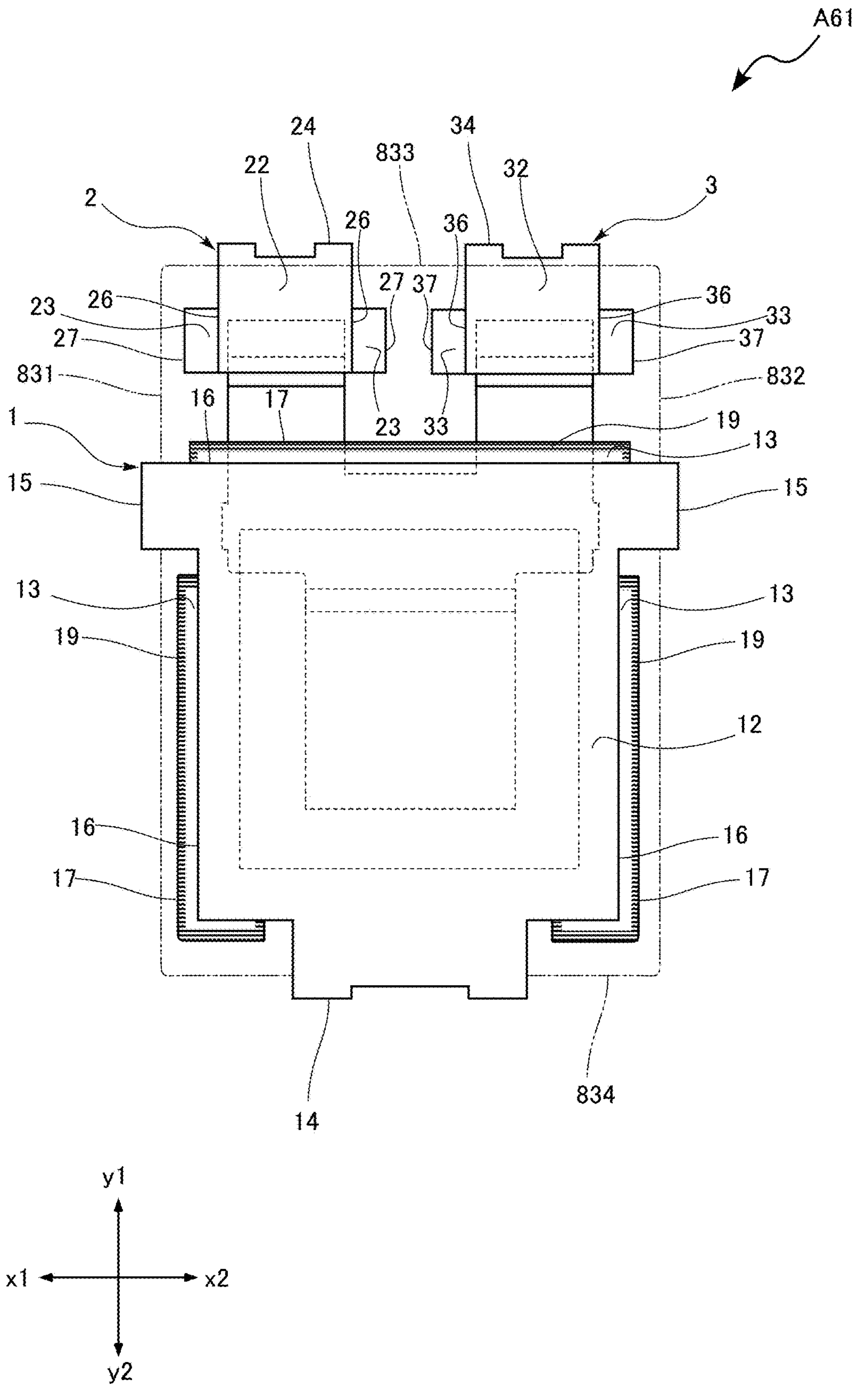
FIG. 45 is a bottom view of a semiconductor device according to a first variation of the sixth embodiment.

FIG. 45 is a bottom view of a semiconductor device A61 according to a first variation of the sixth embodiment and corresponds to FIG. 30. For the convenience of understanding, FIG. 45 shows the sealing resin 8 as transparent and indicates the outlines of the sealing resin 8 by imaginary lines (double dashed lines). In the semiconductor device A61, the area in which the irregular portion 19 is formed on the internal reverse surface 13 is narrower as compared with that in the semiconductor device A60. In the present variation, the irregular portion 19 is formed only at the outer edge of the internal reverse surface 13. As illustrated in this variation, the area of the internal reverse surface 13 at which the irregular portion 19 is formed is not limited. However, it is preferable that the irregular portion 19 is formed at least on the outer edge of the internal reverse surface 13.

[Second Variation]

Figure 46:
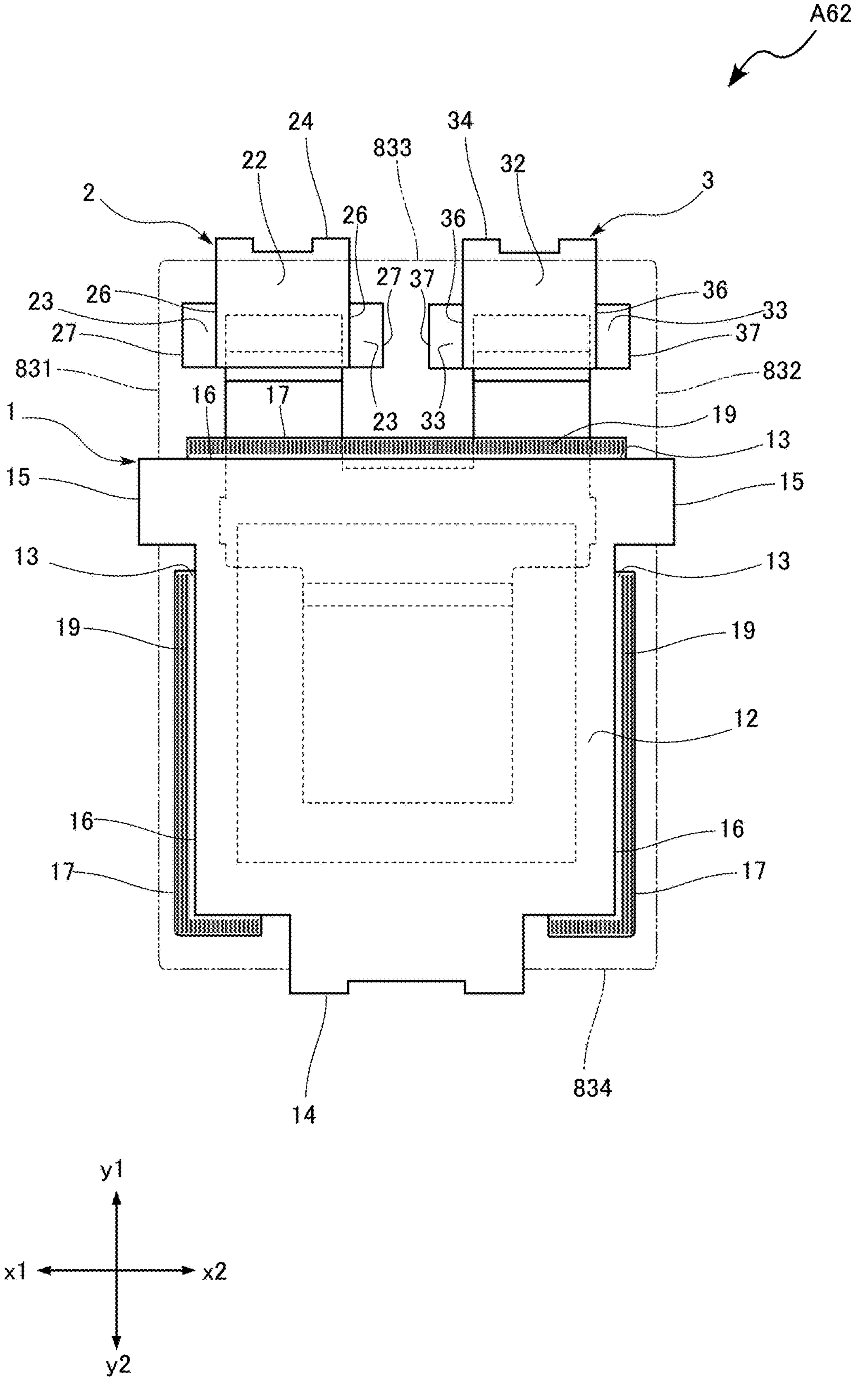
FIG. 46 is a bottom view of a semiconductor device according to a second variation of the sixth embodiment.
Figure 47:
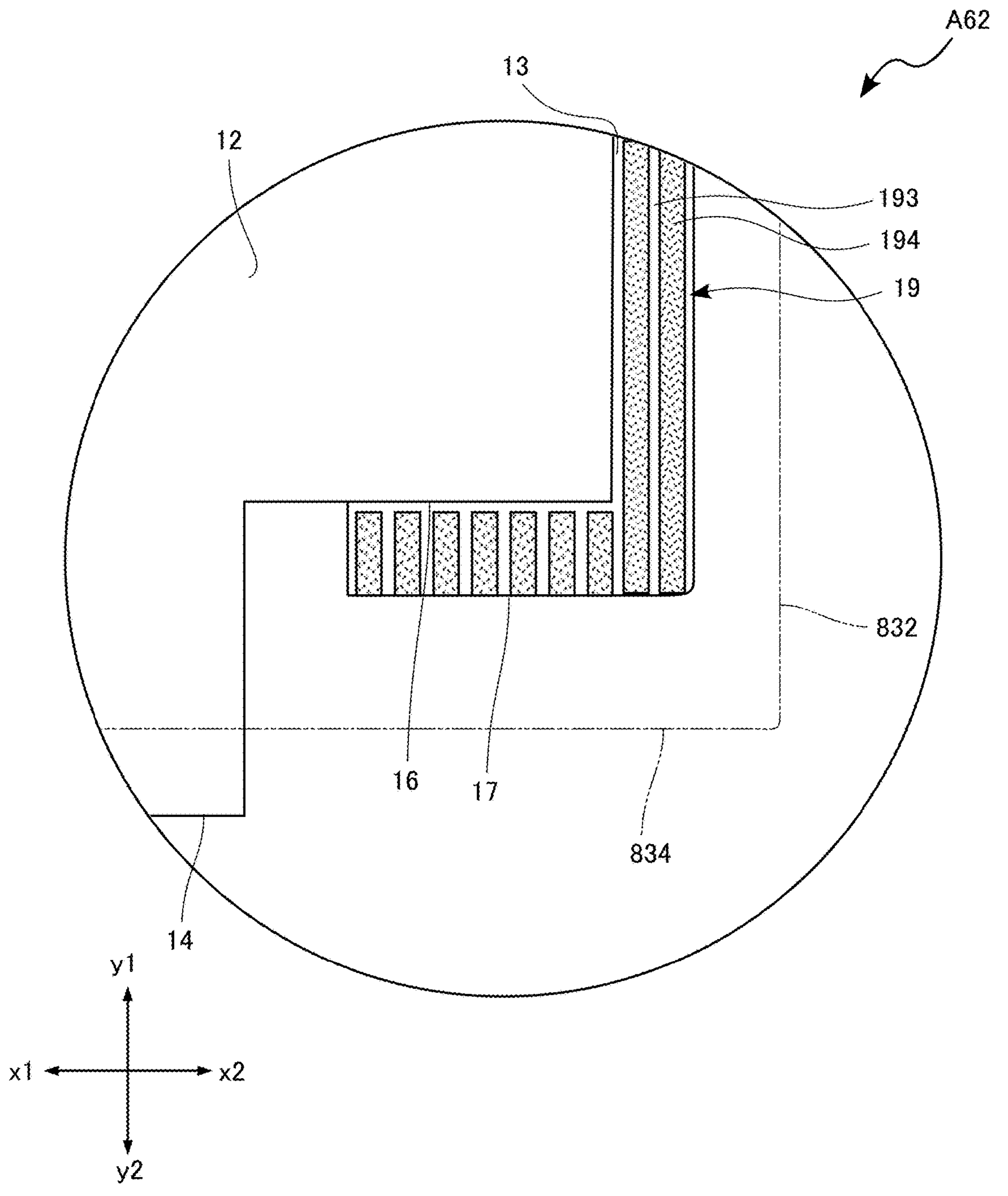
FIG. 47 is an enlarged view of a part of FIG. 46.

FIGS. 46 and 47 are views for describing a semiconductor device A62 according to a second variation of the sixth embodiment. FIG. 46 is a bottom view of the semiconductor device A62 and corresponds to FIG. 30. For the convenience of understanding, FIG. 46 shows the sealing resin 8 as transparent and indicates the outlines of the sealing resin 8 by imaginary lines (double dashed lines). FIG. 47 is an enlarged view of a part of FIG. 46. The semiconductor device A62 differs from the semiconductor device A60 in the formation direction of the first protrusions 193 and the first recesses 194 of the irregular portion 19. In the present variation, all of the first protrusions 193 and the first recesses 194 extend in the y direction and arranged along the x direction. The irregular portion 19 of the present variation is formed by maintaining the scanning direction of the laser, directed to the internal reverse surface 13, in the y direction.

[Third Variation]

Figure 48:
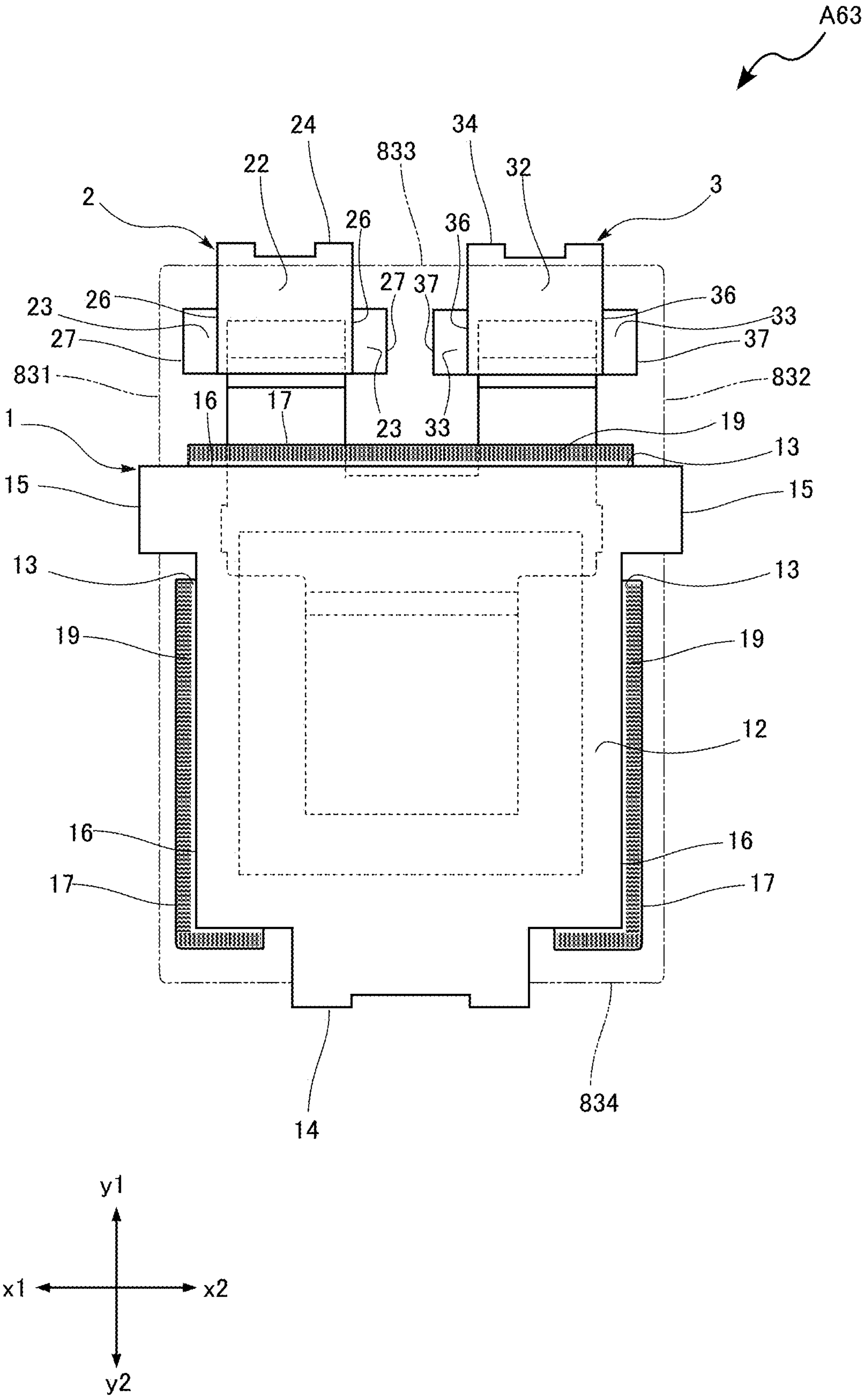
FIG. 48 is a bottom view of a semiconductor device according to a third variation of the sixth embodiment.
Figure 49:
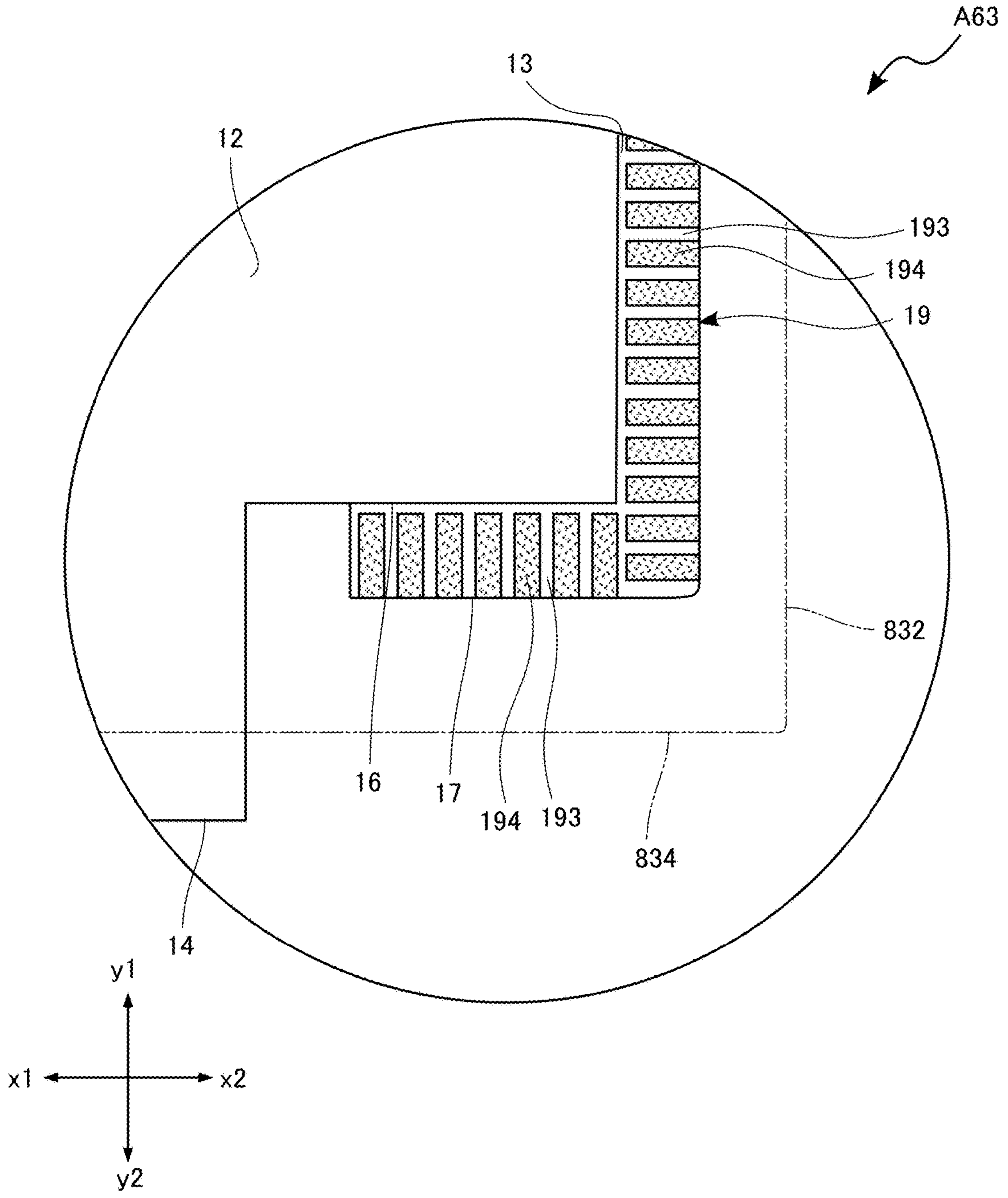
FIG. 49 is an enlarged view of a part of FIG. 48.

FIGS. 48 and 49 are views for describing a semiconductor device A63 according to a third variation of the sixth embodiment. FIG. 48 is a bottom view of the semiconductor device A63 and corresponds to FIG. 30. For the convenience of understanding, FIG. 48 shows the sealing resin 8 as transparent and indicates the outlines of the sealing resin 8 by imaginary lines (double dashed lines). FIG. 49 is an enlarged view of a part of FIG. 48. The semiconductor device A63 differs from the semiconductor device A60 in the formation direction of the first protrusions 193 and the first recesses 194 of the irregular portion 19. In the present variation, the first protrusions 193 and the first recesses 194 extend in a direction orthogonal to the outer edge of the internal reverse surface 13 and are arranged along a direction parallel to the outer edge of the internal reverse surface 13. Specifically, in the portions of the internal reverse surface 13 that are located at opposite ends in the x direction of the reverse surface 12, the first protrusion 193 and the first recess 194 extend in the x direction and are arranged along the y direction. In the portions of the internal reverse surface 13 that are located at opposite ends in the Y direction of the reverse surface 12, the first protrusion 193 and the first recess 194 extend in the y direction and are arranged along the x direction. The irregular portion 19 of the present variation is formed by appropriately changing the scanning direction of the laser, directed to the internal reverse surface 13, between the x direction and the y direction. In the semiconductor device A63 according to the present variation, a larger number of first protrusions 193 and first recesses 194 can be formed than in the semiconductor device A60.

[Fourth Variation]

Figure 50:
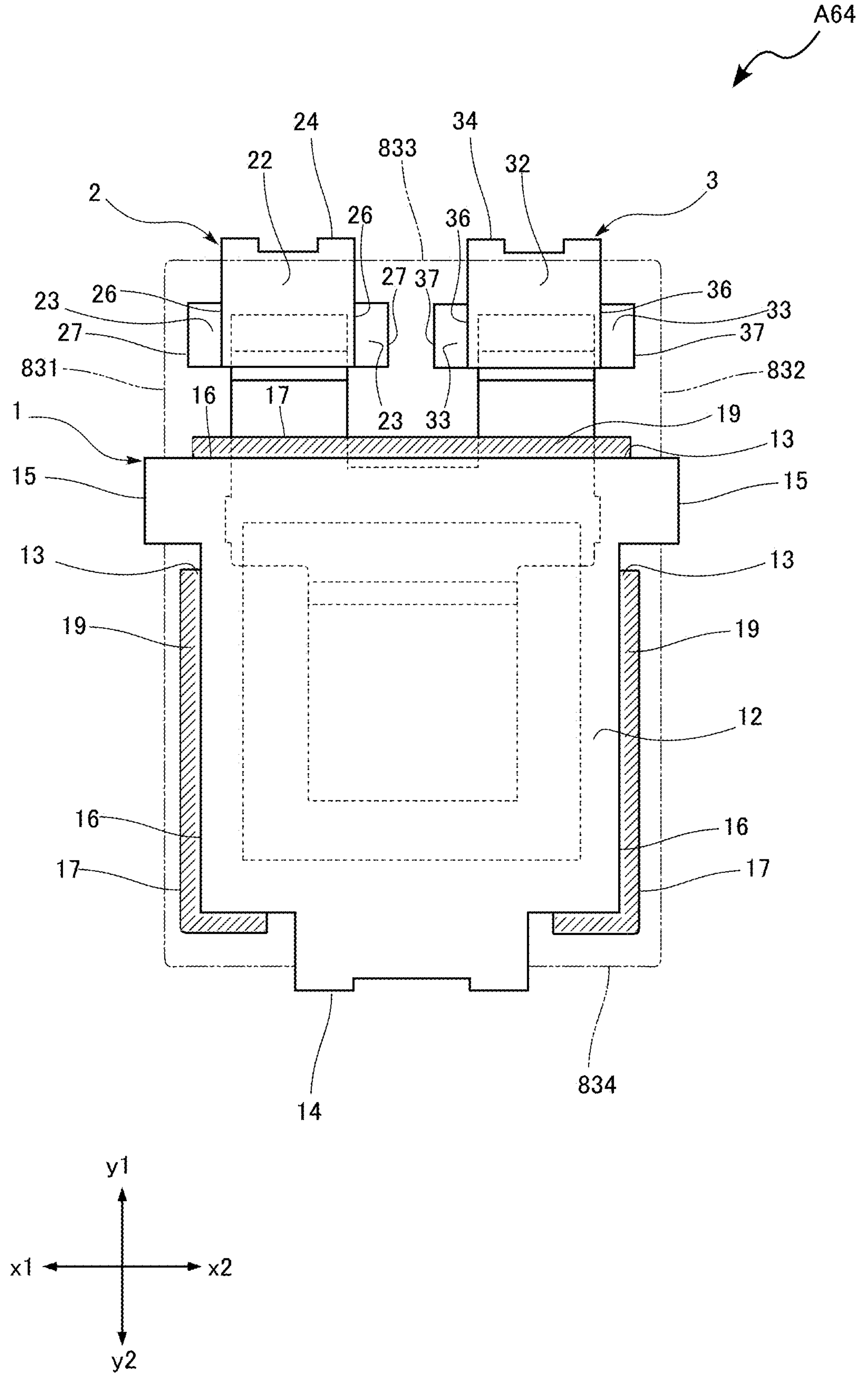
FIG. 50 is a bottom view of a semiconductor device according to a fourth variation of the sixth embodiment.
Figure 51:
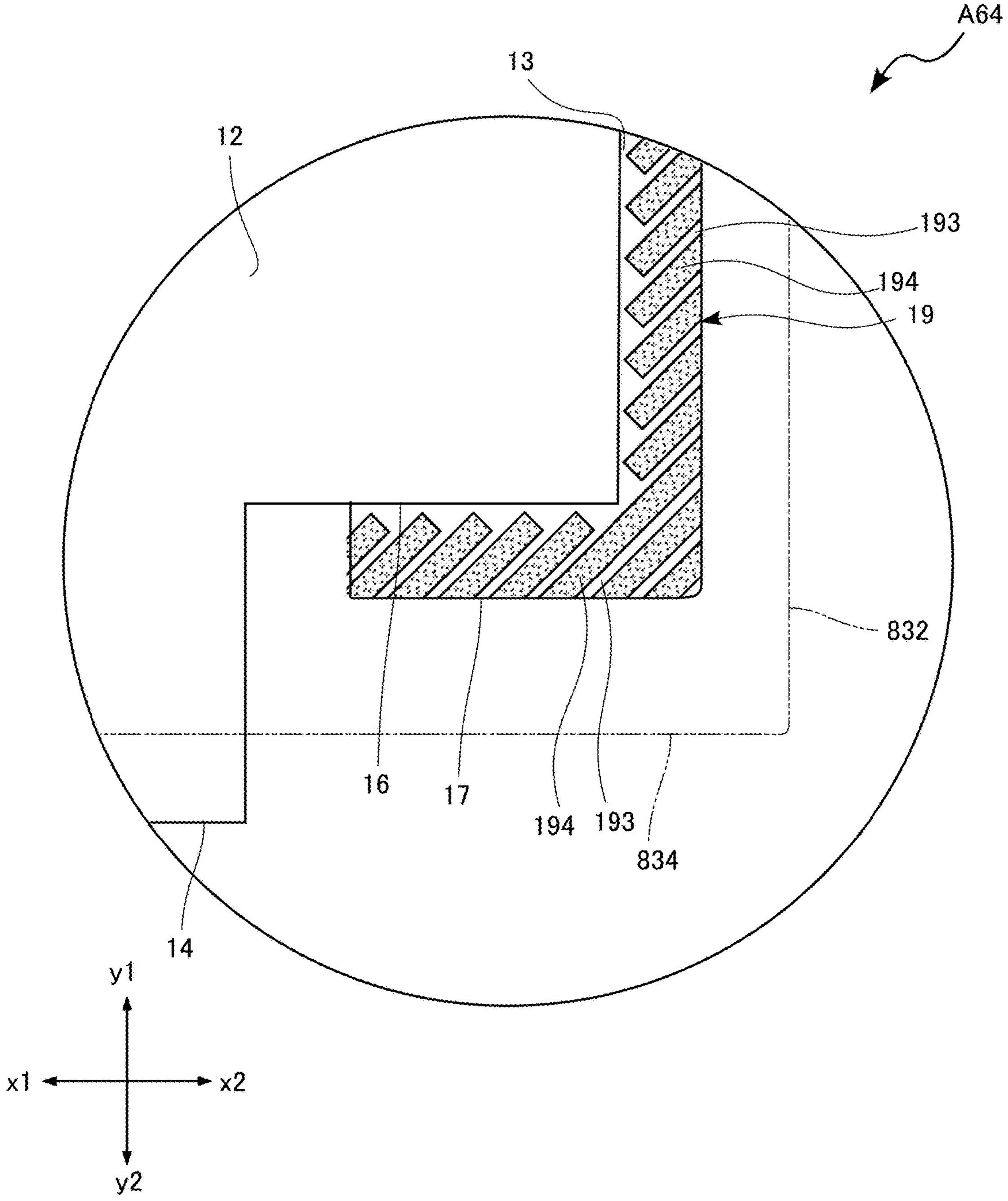
FIG. 51 is an enlarged view of a part of FIG. 50.

FIGS. 50 and 51 are views for describing a semiconductor device A64 according to a fourth variation of the sixth embodiment. FIG. 50 is a bottom view of the semiconductor device A64 and corresponds to FIG. 30. For the convenience of understanding, FIG. 50 shows the sealing resin 8 as transparent and indicates the outlines of the sealing resin 8 by imaginary lines (double dashed lines). FIG. 51 is an enlarged view of a part of FIG. 50. The semiconductor device A64 differs from the semiconductor device A60 in the formation direction of the first protrusions 193 and the first recesses 194 of the irregular portion 19. In the present variation, the first protrusions 193 and the first recesses 194 extend in a first direction inclined with respect to the x direction and the y direction and are arranged along a second direction orthogonal to the first direction and the z direction. In the present variation, the first direction is inclined 45° with respect to the x direction and the y direction, and is the direction from upper right to lower left in FIG. 51. The first direction is not limited. The irregular portion 19 of the present variation is formed by maintaining the scanning direction of the laser, directed to the internal reverse surface 13, in the first direction.

[Fifth Variation]

Figure 52:
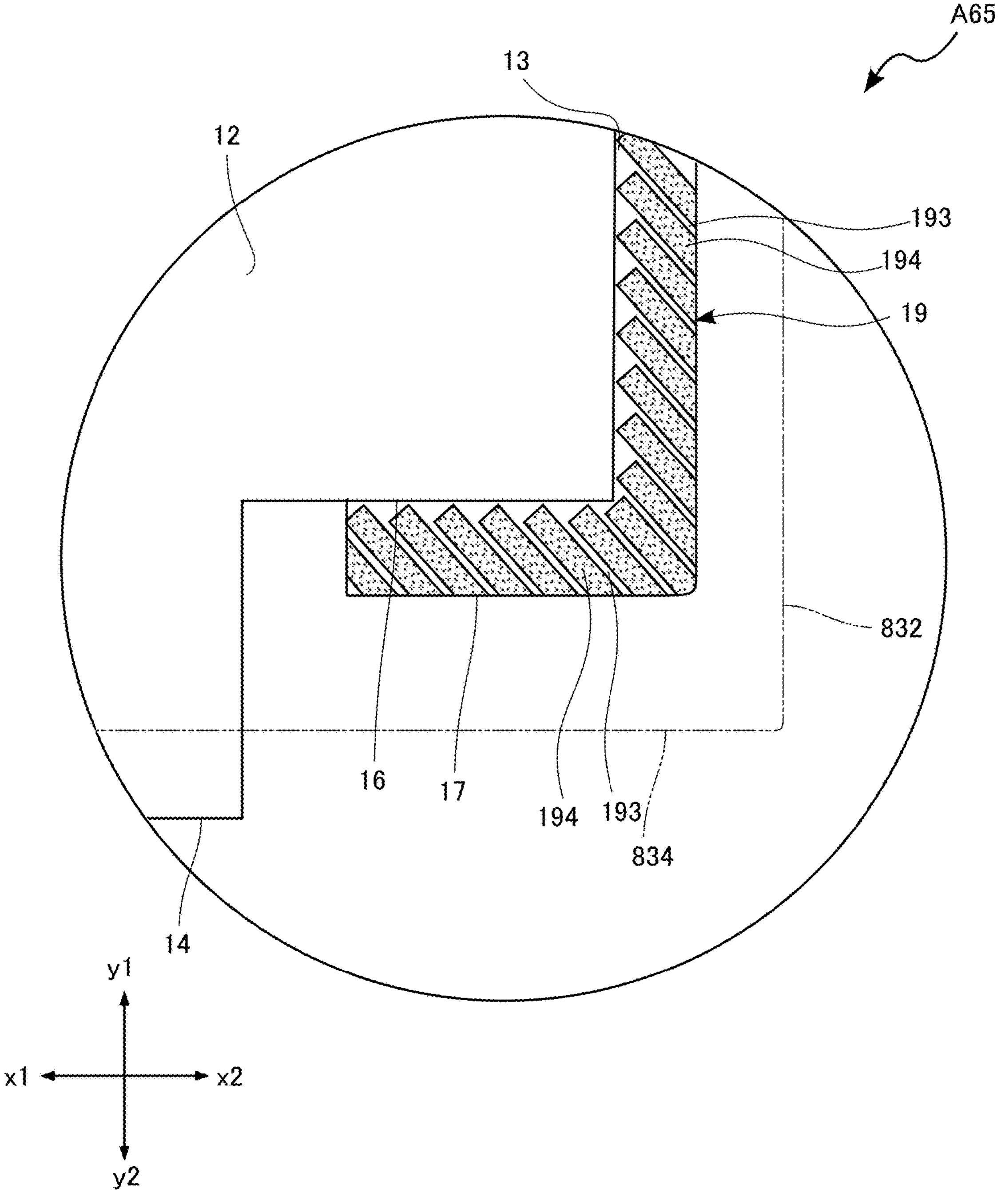
FIG. 52 is a partial enlarged bottom view of a semiconductor device according to a fifth variation of the sixth embodiment.

FIG. 52 is a view for describing a semiconductor device A65 according to a fifth variation of the sixth embodiment. FIG. 52 is a partial enlarged bottom view of the semiconductor device A65 and corresponds to FIG. 34. For the convenience of understanding, FIG. 52 shows the sealing resin 8 as transparent and indicates the outlines of the sealing resin 8 by imaginary lines (double dashed lines). The semiconductor device A65 differs from the semiconductor device A60 in the formation direction of the first protrusions 193 and the first recesses 194 of the irregular portion 19. In the present variation, the first protrusions 193 and the first recesses 194 extend in a first direction inclined with respect to the x direction and the y direction and are arranged along a second direction orthogonal to the first direction and the z direction. In the present variation, the first direction and the second direction are opposite to those of the semiconductor device A64 of the fourth variation. That is, the first direction in the present variation is the direction from upper left to lower right in FIG. 52. The first direction is not limited. The irregular portion 19 of the present variation is formed by maintaining the scanning direction of the laser, directed to the internal reverse surface 13, in the first direction.

[Sixth Variation]

Figure 53:
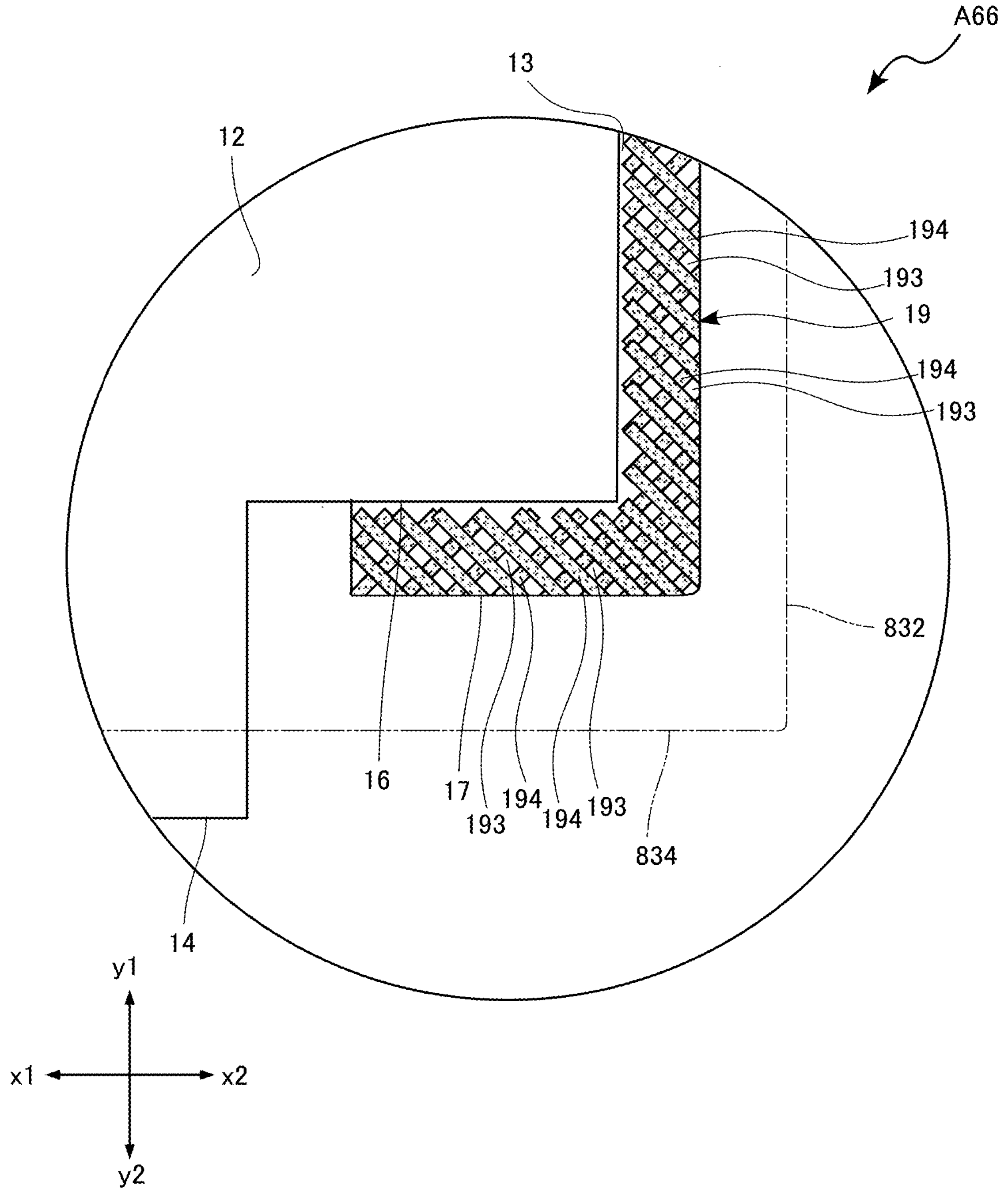
FIG. 53 is a partial enlarged bottom view of a semiconductor device according to a sixth variation of the sixth embodiment.

FIG. 53 is a view for describing a semiconductor device A66 according to a sixth variation of the sixth embodiment. FIG. 53 is a partial enlarged bottom view of the semiconductor device A66 and corresponds to FIG. 34. For the convenience of understanding, FIG. 53 shows the sealing resin 8 as transparent and indicates the outlines of the sealing resin 8 by imaginary lines (double dashed lines). The semiconductor device A66 differs from the semiconductor device A60 in the formation direction of the first protrusions 193 and the first recesses 194 of the irregular portion 19. In the present variation, the first protrusions 193 and the first recesses 194 include those extending in a first direction inclined with respect to the x direction and the y direction and arranged along a second direction orthogonal to the first direction and the z direction, and those extending in the second direction and arranged along the first direction. In the present variation, the first direction is inclined 45° with respect to the x direction and the y direction. The first direction is not limited. The irregular portion 19 of the present variation is formed by irradiating the internal reverse surface 13 with a laser while scanning in the first direction, and then irradiating the internal reverse surface 13 with a laser again while scanning in the second direction.

[Seventh Variation]

Figure 54:
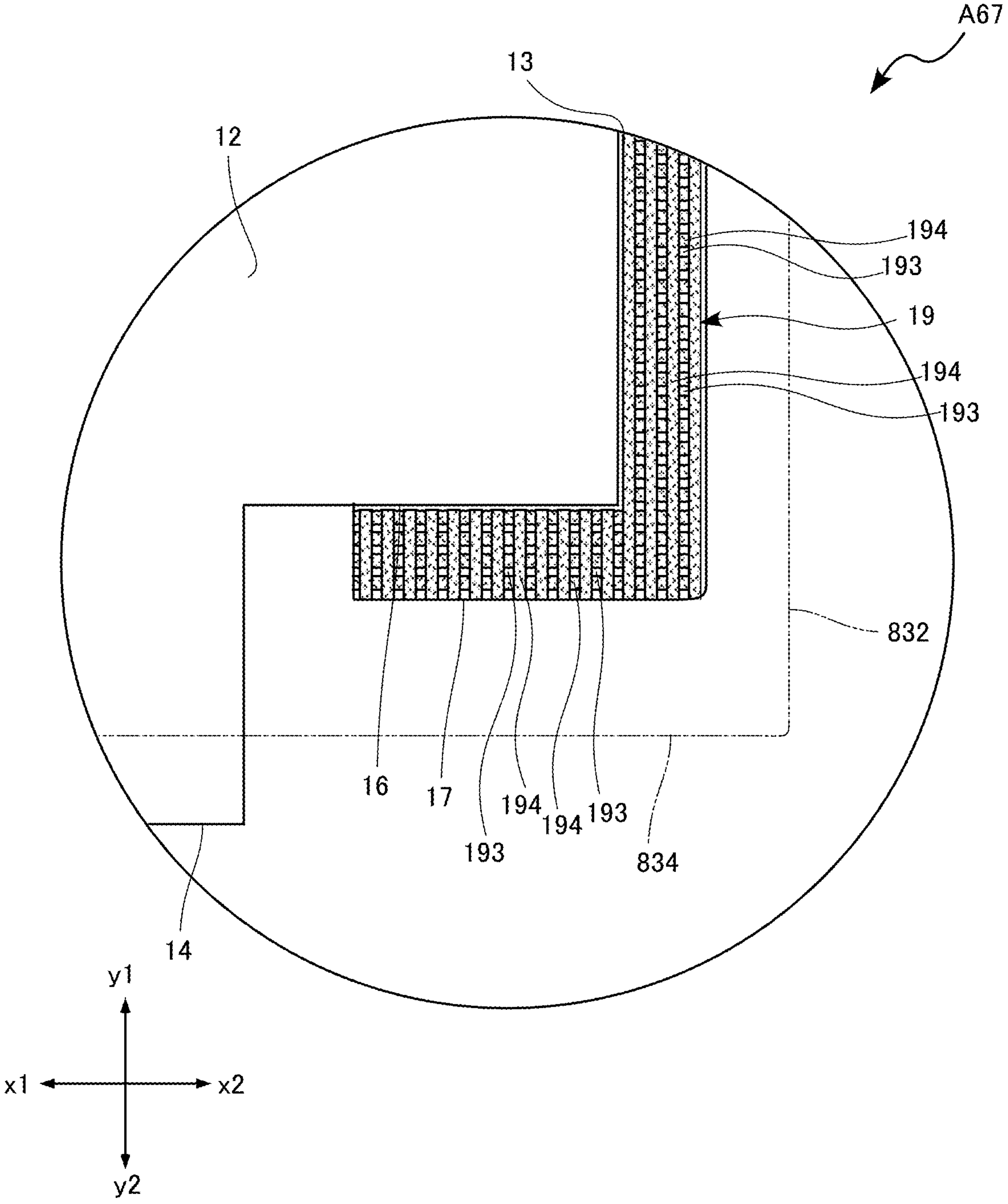
FIG. 54 is a partial enlarged bottom view of a semiconductor device according to a seventh variation of the sixth embodiment.

FIG. 54 is a view for describing a semiconductor device A67 according to a seventh variation of the sixth embodiment. FIG. 54 is a partial enlarged bottom view of the semiconductor device A67 and corresponds to FIG. 34. For the convenience of understanding, FIG. 54 shows the sealing resin 8 as transparent and indicates the outlines of the sealing resin 8 by imaginary lines (double dashed lines). The semiconductor device A67 differs from the semiconductor device A60 in the formation direction of the first protrusions 193 and the first recesses 194 of the irregular portion 19. In the present variation, the first protrusions 193 and the first recesses 194 include those extending in the y direction and arranged along the x direction and those extending in the x direction and arranged along the y direction. The irregular portion 19 of the present variation is formed by irradiating the internal reverse surface 13 with a laser while scanning in the x direction, and then irradiating the internal reverse surface 13 with a laser again while scanning in the y direction. Alternatively, the irregular portion 19 may be formed by irradiating the internal reverse surface 13 with a laser while scanning in the y direction, and then irradiating the internal reverse surface 13 with a laser again while scanning direction in the x direction.

As shown in the second through the seventh variations, the extension direction of the first protrusions 193 and the first recesses 194 can be set freely. The respective extension directions of the first protrusions 193 and the first recesses 194 may differ depending on their locations within the irregular portion 19. The first protrusions 193 and the first recesses 194 extending in different directions may be arranged in an overlapping manner. For example, the first protrusions 193 and first recesses 194 extending in the y direction and the first protrusions 193 and first recesses 194 extending in a first direction inclined with respect to the x direction and the y direction may be arranged in an overlapping manner. Three or more types of first protrusions 193 and first recesses 194 extending in different directions may be arranged in an overlapping manner.

In the present embodiment, the irregular portion 19 is formed at all of the portions of the internal reverse surface 13 that are located on opposite sides in the x direction of the reverse surface 12 and the portions of the internal reverse surface 13 that are located on opposite sides in the y direction of the reverse surface 12. However, the present disclosure is not limited to this. The internal reverse surface 13 may include a portion at which the irregular portion 19 is not formed. For example, the portion of the internal reverse surface 13 that is sufficiently far from the semiconductor element 6 may not be formed with the irregular portion 19. However, it is preferable that the irregular portion 19 is formed over the entirety of the internal reverse surface 13.

FIGS. 55 to 58 show other embodiments of the present disclosure. In these figures, the elements that are identical or similar to those of the above-described embodiments are denoted by the same reference signs as those used for the above-described embodiments, and the description thereof is omitted.

Seventh Embodiment

Figure 55:
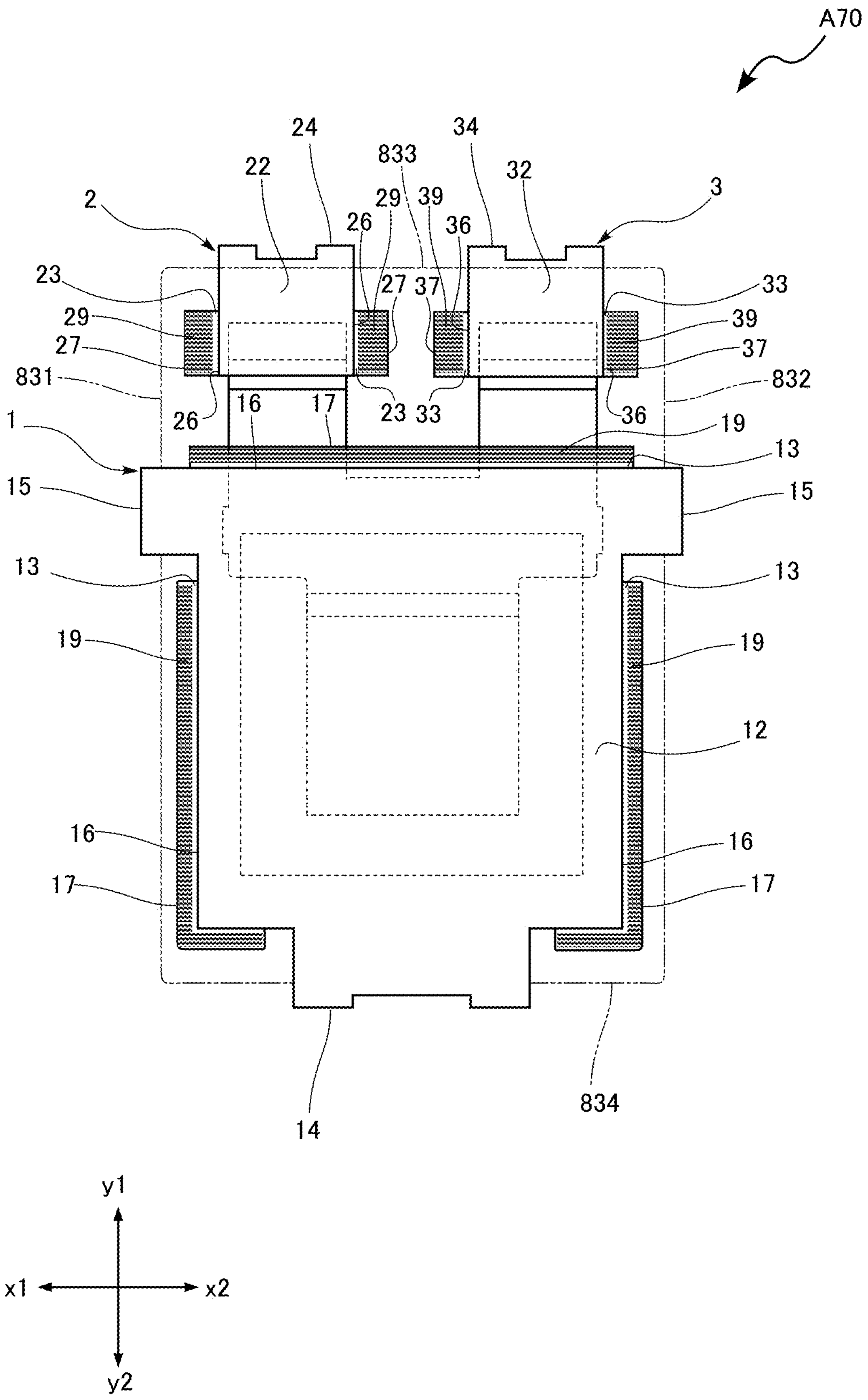
FIG. 55 is a bottom view of a semiconductor device according to a seventh embodiment of the present disclosure.

FIG. 55 is a view for describing a semiconductor device A70 according to a seventh embodiment of the present disclosure. FIG. 55 is a bottom view of the semiconductor device A70 and corresponds to FIG. 30. The semiconductor device A70 of the present embodiment differs from the semiconductor device A60 of the sixth embodiment in that the internal reverse surface 23 of the lead 2 is formed with an irregular portion 29 and the internal reverse surface 33 of the lead 3 is formed with an irregular portion 39. The configuration and operation of other parts of the present embodiment are the same as those of the sixth embodiment.

Note that various parts of the sixth embodiment and the variations may be selectively used in an any appropriate combination.

The internal reverse surface 23 of the lead 2 of the present embodiment is formed with the irregular portion 29. The internal reverse surface 33 of the lead 3 of the present embodiment is formed with the irregular portion 39. The configurations of the irregular portion 29 and the irregular portion 39 of the present embodiment are the same as that of the irregular portion 19 of the semiconductor device A60 according to the sixth embodiment. Note that the configurations of the irregular portion 29 and the irregular portion 39 are not limited and may be the same as those of the variations of the irregular portion 19 according to the sixth embodiment. The irregular portion 29 and the irregular portion 39 are formed by laser irradiation as with the irregular portion 19.

In the present embodiment again, the internal reverse surface 13 of the lead 1 is formed with the irregular portion 19. The irregular portion 19 includes a plurality of first protrusions 193 and a plurality of first recesses 194. Thus, adhesion of the sealing resin 8 to the internal reverse surface 13 is enhanced. Thus, the semiconductor device A70 is capable of suppressing the separation of the sealing resin 8 at the internal reverse surface 13. Also, in the present embodiment again, each of the first recesses 194 is formed with a plurality of second protrusions 195 and a plurality of second recesses 196, and each of the first protrusions 193 is formed with a plurality of second protrusions 197 and a plurality of third recesses 198. This further enhances adhesion of the sealing resin 8 to the internal reverse surface 13. Thus, the semiconductor device A70 is capable of more reliably suppressing the separation of the sealing resin 8 at the internal reverse surface 13. Because irregularities arranged along the y direction and irregularities arranged along the x direction are both formed, separation of the sealing resin 8 at the internal reverse surface 13 is suppressed for both the thermal stress generated in the x direction and the thermal stress generated in the y direction. The semiconductor device A70 has a configuration in common with the semiconductor device A60, thereby achieving the same effect as the semiconductor device A60. Also, according to the present embodiment, the internal reverse surface 23 is formed with the irregular portion 29, and the internal reverse surface 33 is formed with the irregular portion 39. Thus, the semiconductor device A70 is also capable of suppressing the separation of the sealing resin 8 at the internal reverse surface 23 and the internal reverse surface 33.

Eighth Embodiment

Figure 56:
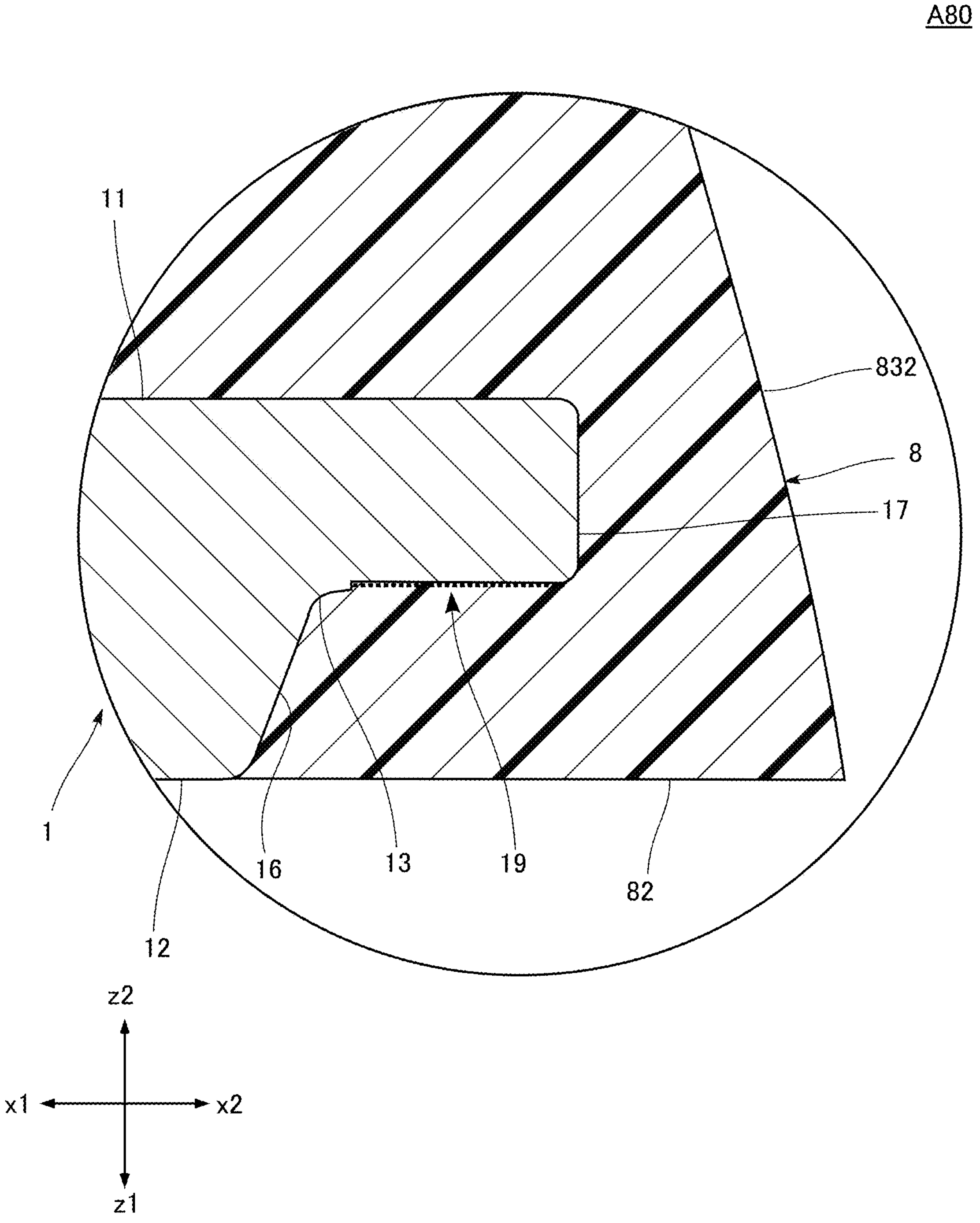
FIG. 56 is a partial enlarged sectional view of a semiconductor device according to an eighth embodiment of the present disclosure.

FIG. 56 is a view for describing a semiconductor device A80 according to an eighth embodiment of the present disclosure. FIG. 56 is a partial enlarged sectional view of the semiconductor device A80 and corresponds to FIG. 33. The semiconductor device A80 according to the present embodiment differs from the semiconductor device A60 according to the sixth embodiment in that the lead frame 91 is formed by subjecting a metal plate to an etching process. The configuration and operation of other parts of the present embodiment are the same as those of the sixth embodiment. Note that various parts of the sixth and the seventh embodiments and the variations may be selectively used in an any appropriate combination.

In the present embodiment, in the step (S15) of forming the lead frame 91 during the lead frame making step, the lead frame 91 is formed by etching a metal plate. The irregular portion 19, the irregular portion 29 and the irregular portion 39 are formed by half-etching the metal plate only from the z1 side in the z direction. The boundaries between the surfaces of the lead 1 are rounded. The internal connection surface 16 is not orthogonal to the reverse surface 12 and the internal reverse surface 13 but is inclined, and the boundary with the internal reverse surface 13 is indistinct. This holds for the lead 2 and the lead 3.

In the present embodiment again, the internal reverse surface 13 of the lead 1 is formed with the irregular portion 19. The irregular portion 19 includes a plurality of first protrusions 193 and a plurality of first recesses 194. Thus, adhesion of the sealing resin 8 to the internal reverse surface 13 is enhanced. Thus, the semiconductor device A80 is capable of suppressing the separation of the sealing resin 8 at the internal reverse surface 13. Also, in the present embodiment again, each of the first recesses 194 is formed with a plurality of second protrusions 195 and a plurality of second recesses 196, and each of the first protrusions 193 is formed with a plurality of second protrusions 197 and a plurality of third recesses 198. This further enhances adhesion of the sealing resin 8 to the internal reverse surface 13. Thus, the semiconductor device A80 is capable of more reliably suppressing the separation of the sealing resin 8 at the internal reverse surface 13. Because irregularities arranged along the y direction and irregularities arranged along the x direction are both formed, separation of the sealing resin 8 at the internal reverse surface 13 is suppressed for both the thermal stress generated in the x direction and the thermal stress generated in the y direction. The semiconductor device A80 has a configuration in common with the semiconductor device A60, thereby achieving the same effect as the semiconductor device A60.

Ninth Embodiment

Figure 57:
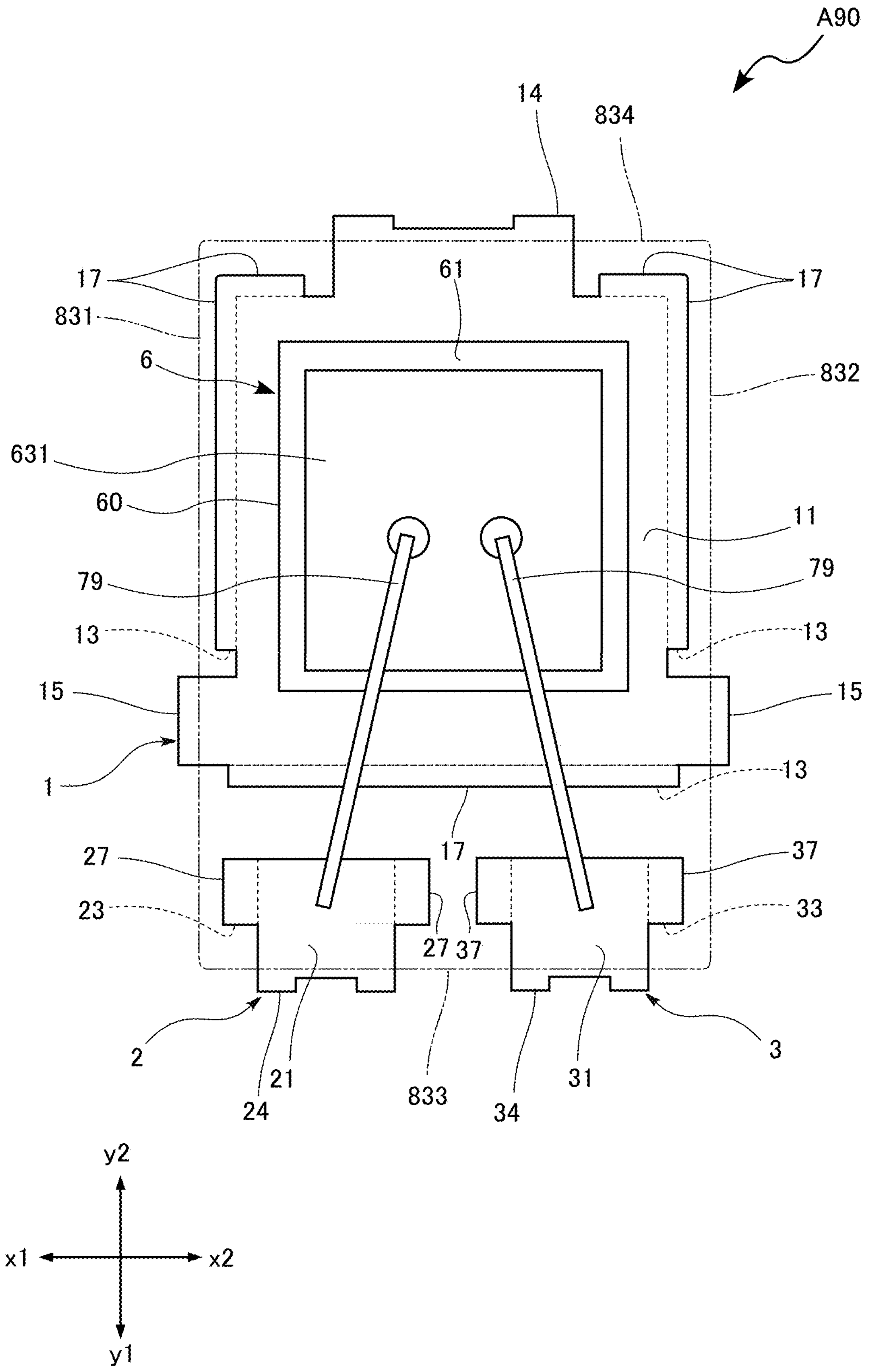
FIG. 57 is a plan view of a semiconductor device according to a ninth embodiment of the present disclosure.

FIG. 57 is a view for describing a semiconductor device A90 according to a ninth embodiment of the present disclosure. FIG. 57 is a plan view of the semiconductor device A90 and corresponds to FIG. 28. The semiconductor device A90 according to the present embodiment differs from the semiconductor device A60 according to the sixth embodiment in that it includes wires 79 instead of the connection lead 7. The configuration and operation of other parts of the present embodiment are the same as those of the sixth embodiment. Note that various parts of the sixth through the eighth embodiments and the variations may be selectively used in an any appropriate combination.

The semiconductor device A90 according to the present embodiment does not include the connection lead 7 and includes two wires 79 instead. One of the wires 79 is bonded to the first electrode 631 of the semiconductor element 6 and the obverse surface 21 of the lead 2. The other wire 79 is bonded to the first electrode 631 of the semiconductor element 6 and the obverse surface 31 of the lead 3. The number of wires 79 that connect the first electrode 631 and the obverse surface 21 and the number of wires 79 that connect the first electrode 631 and the obverse surface 31 are not limited to one. Each of these connections may use a plurality of wires 79. Also, the material, diameter, etc. of each wire 79 are not limited.

In the present embodiment again, the internal reverse surface 13 of the lead 1 is formed with the irregular portion 19. The irregular portion 19 includes a plurality of first protrusions 193 and a plurality of first recesses 194. Thus, adhesion of the sealing resin 8 to the internal reverse surface 13 is enhanced. Thus, the semiconductor device A90 is capable of suppressing the separation of the sealing resin 8 at the internal reverse surface 13. Also, in the present embodiment again, each of the first recesses 194 is formed with a plurality of second protrusions 195 and a plurality of second recesses 196, and each of the first protrusions 193 is formed with a plurality of second protrusions 197 and a plurality of third recesses 198. This further enhances adhesion of the sealing resin 8 to the internal reverse surface 13. Thus, the semiconductor device A90 is capable of more reliably suppressing the separation of the sealing resin 8 at the internal reverse surface 13. Because irregularities arranged along the y direction and irregularities arranged along the x direction are both formed, separation of the sealing resin 8 at the internal reverse surface 13 is suppressed for both the thermal stress generated in the x direction and the thermal stress generated in the y direction. The semiconductor device A90 has a configuration in common with the semiconductor device A60, thereby achieving the same effect as the semiconductor device A60. Moreover, according to the present embodiment, preparation of the connection lead 7 is not necessary. Thus, the semiconductor device A90 is capable of simplifying the manufacturing process and reducing the manufacturing cost.

Tenth Embodiment

Figure 58:
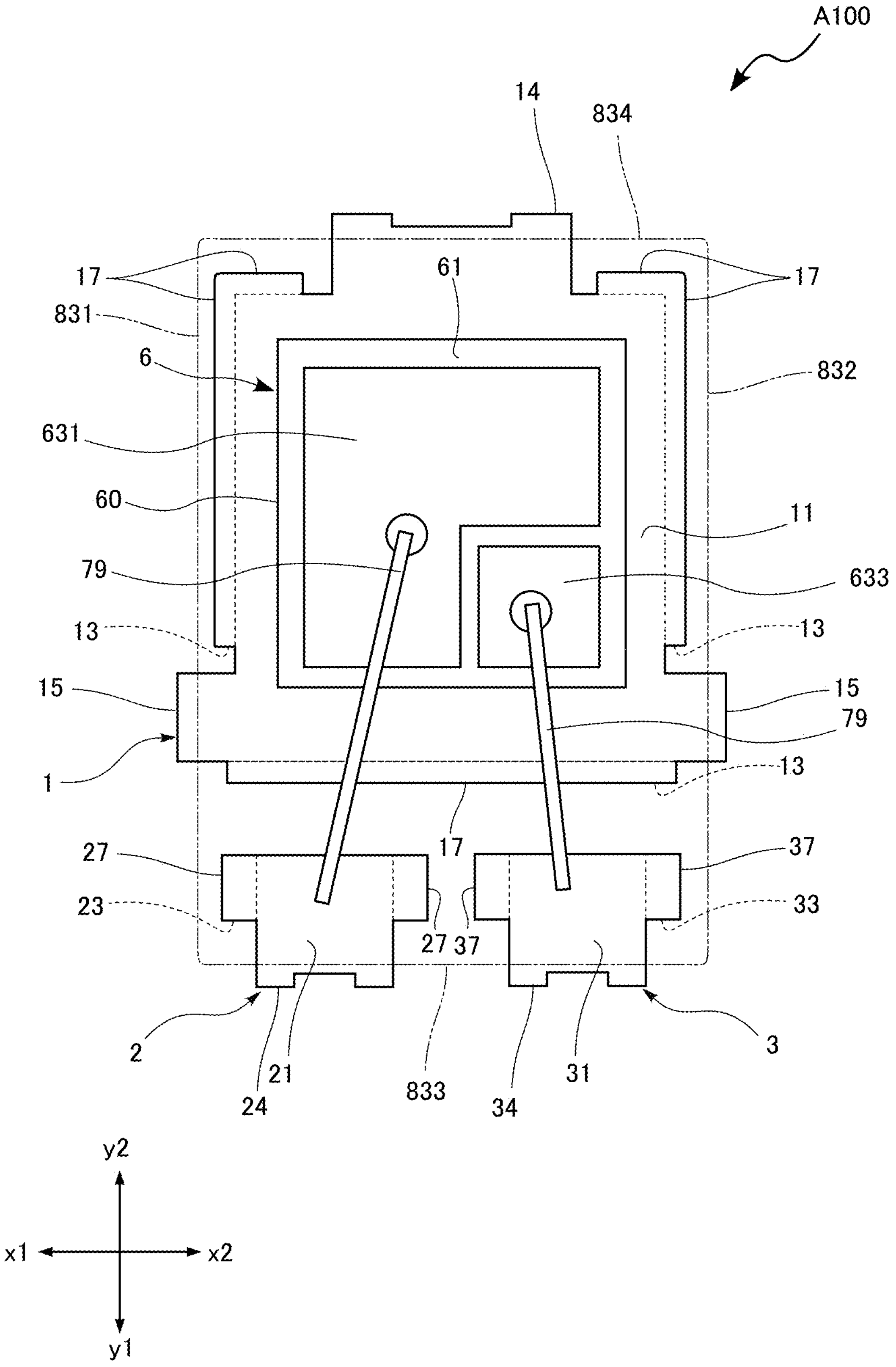
FIG. 58 is a plan view of a semiconductor device according to a tenth embodiment of the present disclosure.

FIG. 58 is a view for describing a semiconductor device A100 according to a tenth embodiment of the present disclosure. FIG. 58 is a plan view of the semiconductor device A100 and corresponds to FIG. 28. The semiconductor device A100 according to the present embodiment differs from the semiconductor device A60 according to the sixth embodiment in the type of the semiconductor element 6 and in that it includes wires 79 instead of the connection lead 7. The configuration and operation of other parts of the present embodiment are the same as those of the sixth embodiment. Note that various parts of the sixth through the ninth embodiments and the variations may be selectively used in an any appropriate combination.

In the present embodiment, the semiconductor element 6 is a MOSFET (metal-oxide-semiconductor field-effect transistor), for example. The semiconductor element 6 may be other transistors such as an IGBT (Insulated Gate Bipolar Transistor). The semiconductor element 6 further includes a third electrode 633 disposed on the element obverse surface 61. In the present embodiment, the first electrode 631 is a source electrode, the second electrode 632 is a drain electrode, and the third electrode 633 is a gate electrode. The second electrode 632 of the semiconductor element 6 is electrically connected to the lead 1 via a bonding material. Thus, the lead 1 is electrically connected to the second electrode 632 (the drain electrode) of the semiconductor element 6 to function as a drain terminal. The first electrode 631 of the semiconductor element 6 is electrically connected to the lead 2 via a wire 79. Thus, the lead 2 is electrically connected to the first electrode 631 (the source electrode) of the semiconductor element 6 to function as a source terminal. The third electrode 633 of the semiconductor element 6 is electrically connected to the lead 3 via a wire 79. Thus, the lead 3 is electrically connected to the third electrode 633 (the gate electrode) of the semiconductor element 6 to function as a gate terminal.

In the present embodiment again, the internal reverse surface 13 of the lead 1 is formed with the irregular portion 19. The irregular portion 19 includes a plurality of first protrusions 193 and a plurality of first recesses 194. Thus, adhesion of the sealing resin 8 to the internal reverse surface 13 is enhanced. Thus, the semiconductor device A100 is capable of suppressing the separation of the sealing resin 8 at the internal reverse surface 13. Also, in the present embodiment again, each of the first recesses 194 is formed with a plurality of second protrusions 195 and a plurality of second recesses 196, and each of the first protrusions 193 is formed with a plurality of second protrusions 197 and a plurality of third recesses 198. This further enhances adhesion of the sealing resin 8 to the internal reverse surface 13. Thus, the semiconductor device A100 is capable of more reliably suppressing the separation of the sealing resin 8 at the internal reverse surface 13. Because irregularities arranged in the y direction and irregularities arranged in the x direction are formed, separation of the sealing resin 8 at the internal reverse surface 13 is suppressed for both the thermal stress generated in the x direction and the thermal stress generated in the y direction. The semiconductor device A100 has a configuration in common with the semiconductor device A60, thereby achieving the same effect as the semiconductor device A60.

In the present embodiment, the first electrode 631 and the lead 2 are electrically connected to each other via a wire 79, and the third electrode 633 and the lead 3 are electrically connected to each other via a wire 79, but the present disclosure is not limited to this. The first electrode 631 and the lead 2, as well as the third electrode 633 and the lead 3 may be electrically connected to each other via other connection members such as a connection lead.

The semiconductor element 6 is a diode in the sixth through the ninth embodiments, and the semiconductor element 6 is a transistor in the tenth embodiment. However, the present disclosure is not limited to these. The type of the semiconductor element 6 is not limited and may be other semiconductor elements such as an integrated circuit. Also, three leads are disposed in the sixth through the tenth embodiments, the present disclosure is not limited to this. The number and arrangement position of leads are not limited and may be set as appropriate depending on the number and arrangement position of electrodes disposed on the element obverse surface 61 of the semiconductor element 6.

The semiconductor device according to the present disclosure is not limited to the above-described embodiments. Various modifications in design may be made freely in the specific structure of each part of the semiconductor device according to the present disclosure.

Clause 1.

A semiconductor device comprising:

a semiconductor element (6);

a first lead (1) on which the semiconductor element is mounted; and a sealing resin (8) covering the semiconductor element and a part of the first lead, wherein the first lead includes:

a first obverse surface (11) to which the semiconductor element is bonded;

a first reverse surface (12) facing away from the first obverse surface in a thickness direction of the first lead and exposed from the sealing resin; and an internal reverse surface (13) facing a same side as a side that the first reverse surface faces in the thickness direction and covered with the sealing resin, the internal reverse surface including an irregular portion (19).

Clause 2.

The semiconductor device according to clause 1, wherein the irregular portion includes a plurality of recesses (191) recessed toward a side that the first obverse surface faces.

Clause 3. (FIG. 8)

The semiconductor device according to clause 2, wherein, in an extension direction orthogonal to the thickness direction and going from the first reverse surface toward an outer edge, the plurality of recesses have a larger dimension in the extension direction at a location closer to the outer edge.

Clause 4. (FIG. 8)

The semiconductor device according to clause 3, wherein the plurality of recesses are substantially the same in a first dimension (L3) in a direction orthogonal to the thickness direction and the extension direction.

Clause 5.

The semiconductor device according to clause 4, wherein the first dimension is equal to or greater than 10% and equal to or less than 30% of a dimension (L4) in the extension direction of the internal reverse surface.

Clause 6.

The semiconductor device according to any one of clauses 2 to 5, wherein the plurality of recesses are arranged in a matrix.

Clause 7. (FIG. 7)

The semiconductor device according to any one of clauses 2 to 6, wherein the plurality of recesses are substantially the same in a second dimension (D) in the thickness direction.

Clause 8.

The semiconductor device according to clause 7, wherein the second dimension is equal to or greater than 1% and equal to or less than 5% of a dimension (T) from the first obverse surface to the first reverse surface in the thickness direction.

Clause 9 (Second embodiment, FIG. 22)

The semiconductor device according to clause 1, wherein the irregular portion includes a plurality of protrusions (192) protruding toward the side that the first reverse surface faces.

Clause 10.

The semiconductor device according to any one of clauses 1 to 9, wherein the irregular portion is disposed over almost an entire area of the internal reverse surface.

Clause 11.

The semiconductor device according to any one of clauses 1 to 10, wherein the first lead further includes an internal connection surface (16) connected to the first reverse surface and the internal reverse surface, and the internal connection surface is flat and generally orthogonal to the first reverse surface and the internal reverse surface.

Clause 12.

The semiconductor device according to any one of clauses 1 to 11, wherein an area of the semiconductor element as viewed in the thickness direction is equal to or greater than 50% of an area of the first lead as viewed in the thickness direction.

Clause 13.

The semiconductor device according to clause 1, wherein the irregular portion includes:

a plurality of first recesses (194) extending in a first direction orthogonal to the thickness direction and arranged along a second direction orthogonal to the thickness direction and the first direction;

a plurality of first protrusions (193) located between the first recesses and extending in the first direction; and a plurality of second protrusions (195) formed in each of the first recesses and arranged along the first direction.

Clause 14. (FIG. 37)

The semiconductor device according to clause 13, wherein a spacing (W2) between the plurality of second protrusions in the first direction is smaller than a spacing (W1) between the plurality of first protrusions in the second direction.

Clause 15.

The semiconductor device according to clause 13 or 14, wherein the irregular portion includes a plurality of third protrusions (197) formed in each of the first protrusions and arranged along the first direction.

Clause 16. (FIG. 37)

The semiconductor device according to clause 15, wherein a spacing (W3) between the plurality of third protrusions in the first direction is smaller than the spacing between the plurality of first protrusions in the second direction.

Clause 17. (FIG. 35)

The semiconductor device according to any one of clauses 13 to 16, wherein the irregular portion further includes a plurality of second recesses (196) located between the second protrusions and arranged along the first direction, and a second height difference (T3) between the second protrusions and the second recesses in the thickness direction is smaller than a first height difference (T1) between the first protrusions and the first recesses in the thickness Clause 18.

The semiconductor device according to clause 17, wherein the second height difference is equal to or less than 25% of the first height difference.

Clause 19.

The semiconductor device according to clause 17 or 18, wherein the first height difference is equal to or greater than 1% and equal to or less than 5% of a dimension (T2) from the first obverse surface to the internal reverse surface in the thickness direction.

Clause 20.

The semiconductor device according to any one of clauses 13 to 19, wherein the irregular portion is disposed at least on an outer edge of the first internal reverse surface.

Clause 21.

The semiconductor device according to any one of clauses 13 to 20, wherein the first direction is a direction away from the first reverse surface.

Clause 22.

The semiconductor device according to any one of clauses 13 to 21, further comprising an internal connection surface (16) generally orthogonal to the first reverse surface and the internal reverse surface and connected to the first reverse surface and the internal reverse surface.

Clause 23.

The semiconductor device according to any one of clauses 13 to 22, wherein an area of the semiconductor element as viewed in the thickness direction is equal to or greater than 70% of an area of the first lead as viewed in the thickness direction.

Clause 24. (FIG. 10, FIG. 12)

A method for manufacturing a semiconductor device, comprising the steps of:

preparing (S11) a metal plate including an obverse surface and a reverse surface that face away from each other in a thickness direction;

forming (S12, S13) a first lead (1) by subjecting the metal plate to a stamping process, the first lead including an internal reverse surface (13) facing a same side as a side that the reverse surface faces and located closer to the obverse surface than is the reverse surface in the thickness direction (S12, S13);

bonding (S20) a semiconductor element (6) to the first lead; and forming (S40) a sealing resin (8) that covers the semiconductor element, wherein the step of forming the first lead includes using a die (95) including an irregularity-forming part (951) and pressing the irregularity-forming part against the metal plate from the reverse surface side to form the internal reverse surface including an irregular portion (19).

Clause 25. (First embodiment, FIG. 12)

The method for manufacturing a semiconductor device according to clause 24, wherein the irregularity-forming part includes a plurality of protrusions (952).

Clause 26, Second embodiment, FIG. 23]

The method for manufacturing a semiconductor device according to clause 24, wherein the irregularity-forming part includes a plurality of recesses (953).

Clause 27. (FIG. 39)

A method for manufacturing a semiconductor device, comprising the steps of:

preparing (S11) a metal plate including an obverse surface and a reverse surface that face away from each other in a thickness direction;

forming (S15) a lead frame (91) by working the metal plate, the lead frame including an internal reverse surface (13) facing a same side as a side that the reverse surface faces and located closer to the obverse surface than is the reverse surface in the thickness direction;

forming (S16) an irregular portion (19) on the internal reverse surface by laser irradiation;

bonding (S20) a semiconductor element (6) to the lead frame, forming (S40) a sealing resin (8) that covers the semiconductor element; and cutting (S50) the lead frame.

Clause 28.

The method for manufacturing a semiconductor device according to clause 27, wherein the step of forming the irregular portion includes:

emitting the laser as a pulsed output;

scanning the laser in the first direction to form a first recess (194) extending in the first direction; and forming a plurality of the first recesses while moving a laser irradiation position in a second direction orthogonal to the thickness direction and the first direction to form first protrusions (193) between the first recesses, wherein, in each of the first recesses, a plurality of second protrusions (195) are formed that are arranged along the first direction at intervals corresponding to a frequency of the pulsed output.

Clause 29.

The method for manufacturing a semiconductor device according to clause 27 or 28, wherein the irregular portion is formed at least on an outer edge of the internal reverse surface.

Clause 30.

The method for manufacturing a semiconductor device according to any one of clauses 27 to 29, wherein the step of forming the lead frame includes forming the lead frame by subjecting the metal plate to a stamping process.

REFERENCE NUMERALS

A10 to A13, A20, A30, A40, A50, A60 to A64, A70, A80, A90,
A100: Semiconductor device 1: Lead
11: Obverse surface 12: Reverse surface
13: Internal reverse surface 14, 15: Connection end surface
16: Internal connection surface 17: Internal end surface
19: Irregular portion 191, 191*a*, 191*b*, 191*c*, 191*d*: Recess
192: Protrusion 193: First protrusion
194: First recess 195: Second protrusion
196: Second recess 197: Third protrusion
198: Third recess 2: Lead
21: Obverse surface 22: Reverse surface
23: Internal reverse surface 24: Connection end surface
26: Internal connection surface 27: Internal end surface
29: Irregular portion 3: Lead
31: Obverse surface 32: Reverse surface
33: Internal reverse surface 34: Connection end surface
36: Internal connection surface 37: Internal end surface
39: Irregular portion 6: Semiconductor element
60: Element body 61: Element obverse surface
62: Element reverse surface 631: First electrode
632: Second electrode 633: Third electrode
7: Connection lead 71: Element connection portion
72: Lead connection portion 73: Connecting portion
79: Wire 8: Sealing resin
81: Resin obverse surface 82: Resin reverse surface
83, 831 to 834: Resin side surface 91, 94: Lead frame
911: Obverse surface 912: Reverse surface
92: Through-hole 93: Frame
95: Die 951: Irregularity-forming part
952: Protrusion 953: Recess 96: Die

The invention claimed is:

1. A semiconductor device comprising:

a semiconductor element;

a first lead on which the semiconductor element is mounted; and a sealing resin covering the semiconductor element and a part of the first lead, wherein the first lead includes:

a first obverse surface to which the semiconductor element is bonded;

a first reverse surface facing away from the first obverse surface in a thickness direction of the first lead and exposed from the sealing resin; and an internal reverse surface facing a same side as a side that the first reverse surface faces in the thickness direction and covered with the sealing resin, the internal reverse surface is offset toward the first obverse surface with respect to the first reverse surface in the thickness direction, and an irregular portion is provided in the internal reverse surface.

2. The semiconductor device according to claim 1, wherein the irregular portion includes a plurality of recesses recessed toward a side that the first obverse surface faces.

3. The semiconductor device according to claim 2, wherein, in an extension direction orthogonal to the thickness direction and going from the first reverse surface toward an outer edge, the plurality of recesses have a larger dimension in the extension direction at a location closer to the outer edge.

4. The semiconductor device according to claim 3, wherein the plurality of recesses are substantially the same in a first dimension in a direction orthogonal to the thickness direction and the extension direction.

5. The semiconductor device according to claim 4, wherein the first dimension is equal to or greater than 10% and equal to or less than 30% of a dimension in the extension direction of the internal reverse surface.

6. The semiconductor device according to claim 2, wherein the plurality of recesses are arranged in a matrix.

7. The semiconductor device according to claim 2, wherein the plurality of recesses are substantially the same in a second dimension in the thickness direction.

8. The semiconductor device according to claim 7, wherein the second dimension is equal to or greater than 1% and equal to or less than 5% of a dimension from the first obverse surface to the first reverse surface in the thickness direction.

9. The semiconductor device according to claim 1, wherein the irregular portion includes a plurality of protrusions protruding toward the side that the first reverse surface faces.

10. The semiconductor device according to claim 1, wherein the irregular portion is disposed over almost an entire area of the internal reverse surface.

11. The semiconductor device according to claim 1, wherein the first lead further includes an internal connection surface connected to the first reverse surface and the internal reverse surface, and the internal connection surface is flat and generally orthogonal to the first reverse surface and the internal reverse surface.

12. The semiconductor device according to claim 1, wherein an area of the semiconductor element as viewed in the thickness direction is equal to or greater than 50% of an area of the first lead as viewed in the thickness direction.

13. The semiconductor device according to claim 1, wherein the irregular portion includes:

a plurality of first recesses extending in a first direction orthogonal to the thickness direction and arranged along a second direction orthogonal to the thickness direction and the first direction;

a plurality of first protrusions located between the first recesses and extending in the first direction; and a plurality of second protrusions formed in each of the first recesses and arranged along the first direction.

14. The semiconductor device according to claim 13, wherein a spacing between the plurality of second protrusions in the first direction is smaller than a spacing between the plurality of first protrusions in the second direction.

15. The semiconductor device according to claim 13, wherein the irregular portion includes a plurality of third protrusions formed in each of the first protrusions and arranged along the first direction.

16. The semiconductor device according to claim 15, wherein a spacing between the plurality of third protrusions in the first direction is smaller than the spacing between the plurality of first protrusions in the second direction.

17. The semiconductor device according to claim 13, wherein the irregular portion further includes a plurality of second recesses located between the second protrusions and arranged along the first direction, and a second height difference between the second protrusions and the second recesses in the thickness direction is smaller than a first height difference between the first protrusions and the first recesses in the thickness direction.

18. The semiconductor device according to claim 17, wherein the second height difference is equal to or less than 25% of the first height difference.

19. The semiconductor device according to claim 17, wherein the first height difference is equal to or greater than 1% and equal to or less than 5% of a dimension from the first obverse surface to the internal reverse surface in the thickness direction.

20. The semiconductor device according to claim 13, wherein the irregular portion is disposed at least on an outer edge of the internal reverse surface.

* * * * *